(12) United States Patent
Yabe et al.

(10) Patent No.: US 6,256,604 B1
(45) Date of Patent: Jul. 3, 2001

(54) MEMORY INTEGRATED WITH LOGIC ON A SEMICONDUCTOR CHIP AND METHOD OF DESIGNING THE SAME

(75) Inventors: Tomoaki Yabe, Fujisawa; Shinji Miyano, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/120,999

(22) Filed: Jul. 23, 1998

(30) Foreign Application Priority Data

Jul. 25, 1997 (JP) .................................................. 9-200132
Jun. 30, 1998 (JP) ................................................ 10-185299

(51) Int. Cl.[7] .......................... G06F 17/50; H03K 19/00; H01L 27/10
(52) U.S. Cl. ................................ 703/14; 703/15; 716/17; 257/909
(58) Field of Search .......................... 703/14, 15; 716/17; 257/909

(56) References Cited

U.S. PATENT DOCUMENTS

| | | | |
|---|---|---|---|
| 4,701,860 | * 10/1987 | Mader ................................... | 364/490 |
| 4,849,904 | * 7/1989 | Aipperspach et al. ............... | 364/489 |
| 4,852,015 | * 7/1989 | Doyle, Jr. ............................. | 364/491 |
| 5,105,388 | * 4/1992 | Itano et al. ...................... | 365/185.22 |
| 5,166,900 | * 11/1992 | Kondo ............................. | 365/185.11 |
| 5,291,445 | * 3/1994 | Miyaoka et al. ................ | 365/189.08 |
| 5,378,904 | * 1/1995 | Suzuki et al. ......................... | 257/208 |
| 5,493,508 | * 2/1996 | Dangelo et al. ...................... | 364/489 |
| 5,541,849 | * 7/1996 | Rostoker et al. ..................... | 364/489 |
| 5,598,344 | * 1/1997 | Dangelo et al. ...................... | 364/489 |
| 5,698,876 | 12/1997 | Yabe et al. . | |
| 5,784,593 | * 7/1998 | Tseng et al. ........................... | 395/500 |
| 5,809,039 | * 9/1998 | Takahashi et al. .................... | 714/726 |
| 5,809,283 | * 9/1998 | Vaidyanathan et al. ............. | 395/500 |
| 5,854,763 | * 12/1998 | Gillingham et al. ............ | 365/189.04 |
| 5,883,814 | * 3/1999 | Luk et al. ........................ | 395/500.09 |
| 5,898,636 | * 4/1999 | Isomura et al. ................. | 365/230.03 |
| 6,069,834 | * 5/2000 | Watanabe et al. .............. | 365/230.03 |

* cited by examiner

*Primary Examiner*—Kevin J. Teska
*Assistant Examiner*—William Thomson
(74) *Attorney, Agent, or Firm*—Hogan & Hartson, LLP

(57) ABSTRACT

In a structure and a designing method of a memory integrated with a logic, a memory macro comprises L memory array blocks 1-1, 1-2, . . . 1-L each including memory cell arrays each with a storage capacity of K bits and sense amplifiers. Memory array power source driver blocks 4-1, 4-2, . . . 4-L each including a circuit for generating a driver power source which drives a sense amplifier are arranged in a corresponding manner to memory array blocks 1-1, 1-2, . . . 1-L. The memory array blocks 1-1, 1-2, . . . 1-L are arranged along a column direction in an adjacent manner to one another and DQ line pairs extending along a column direction are arranged on the memory array blocks 1-1, 1-2, . . . 1-L. Source line blocks 6a-L, 6b-L, 7a, 7b, 8a, 8b are arranged at an end of the memory array blocks in a row direction. According to such a design, short design turn-around for design and shrinkage of occupying area of a memory macro can be realized.

32 Claims, 35 Drawing Sheets

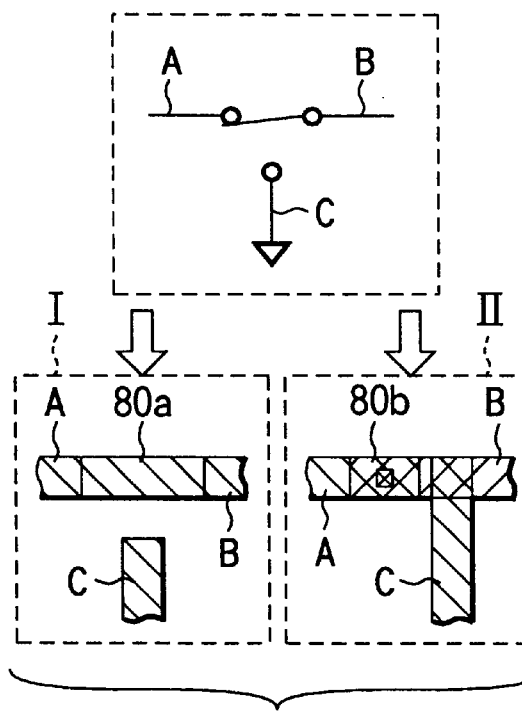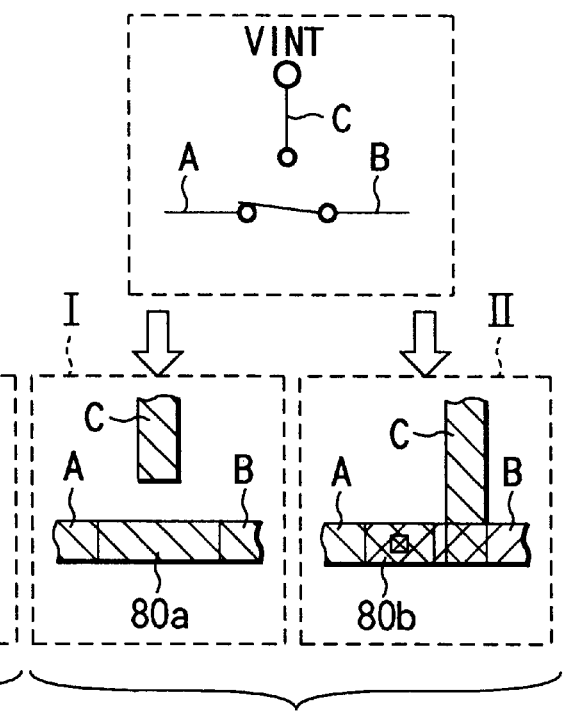
FIG. 13A  FIG. 13B
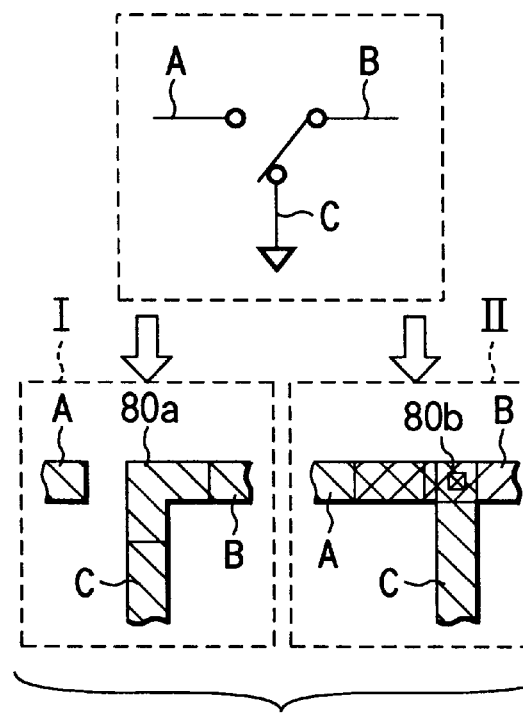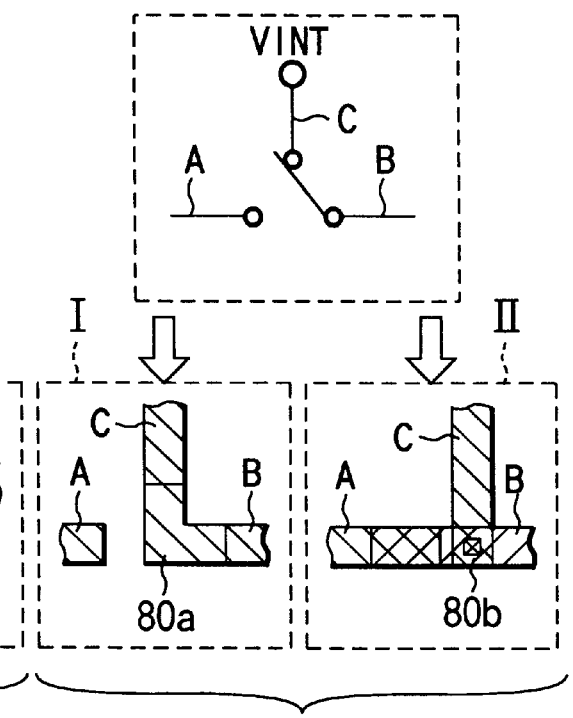
FIG. 13C  FIG. 13D

[MEMORY MACRO DESIGN FLOW CHART]
BLOCK DESIGN (STORAGE CAPACITY MINIMAL UNIT, MAXIMAL CAPACITY)
                        (K BITS)                (N BITS)

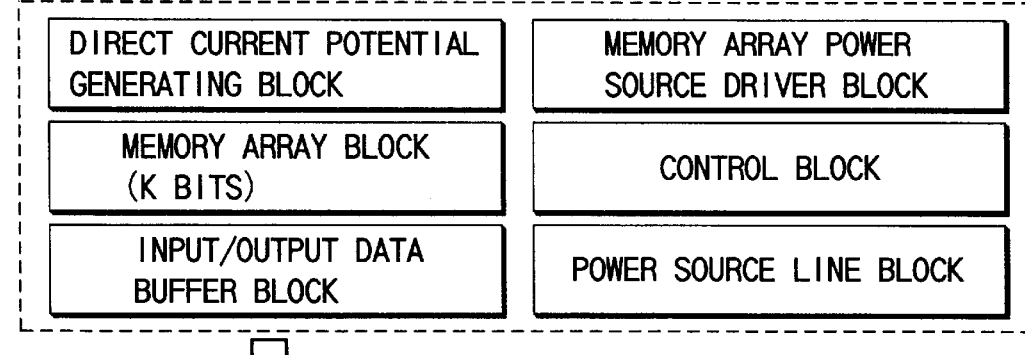

SPECIFICATION CONFIRMATION AND INPUT
(MEMORY MACRO STORAGE CAPACITY N BITS, THE NUMBER OF ROWS, THE NUMBER OF COLUMNS, THE NUMBER OF I/Os ETC.)

CALCULATION OF THE NUMBER OF MEMORY ARRAY BLOCKS L(=N/K)
CHANGE-OVER OF BLOCK ADDRESS SWITCHES
(AUTOMATION BY CAD PROCESSING)

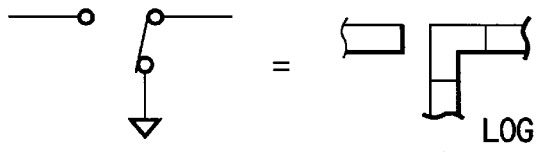

LOGIC DESIGN
(GATE ARRAY, STANDARD CELL ETC.)

DESIGN COMPLETION OF MEMORY MACRO DESIGN

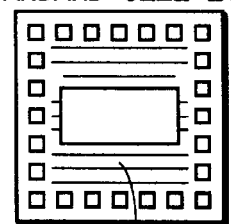

LOGIC SECTION

DESIGN COMPLETION OF MEMORY INTEGRATED WITH LOGIC

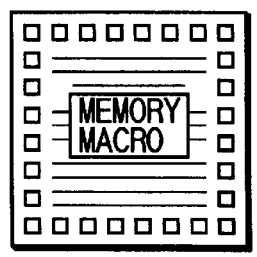

FIG. 18

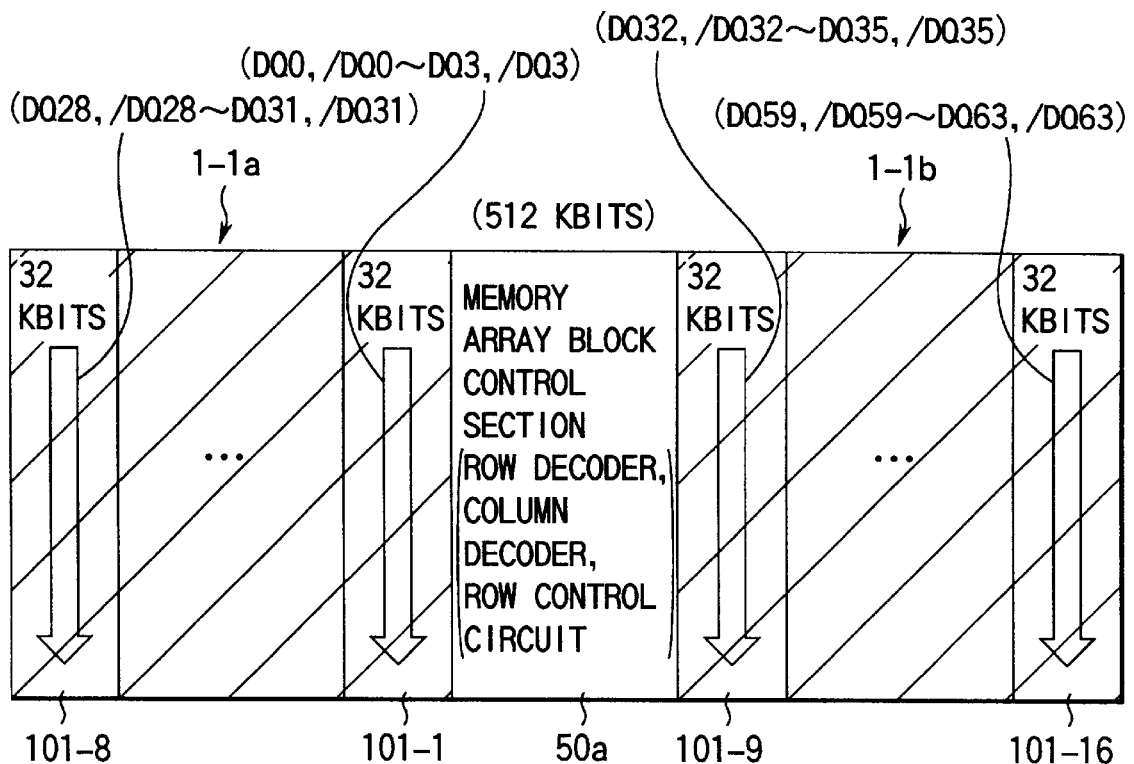
FIG. 24
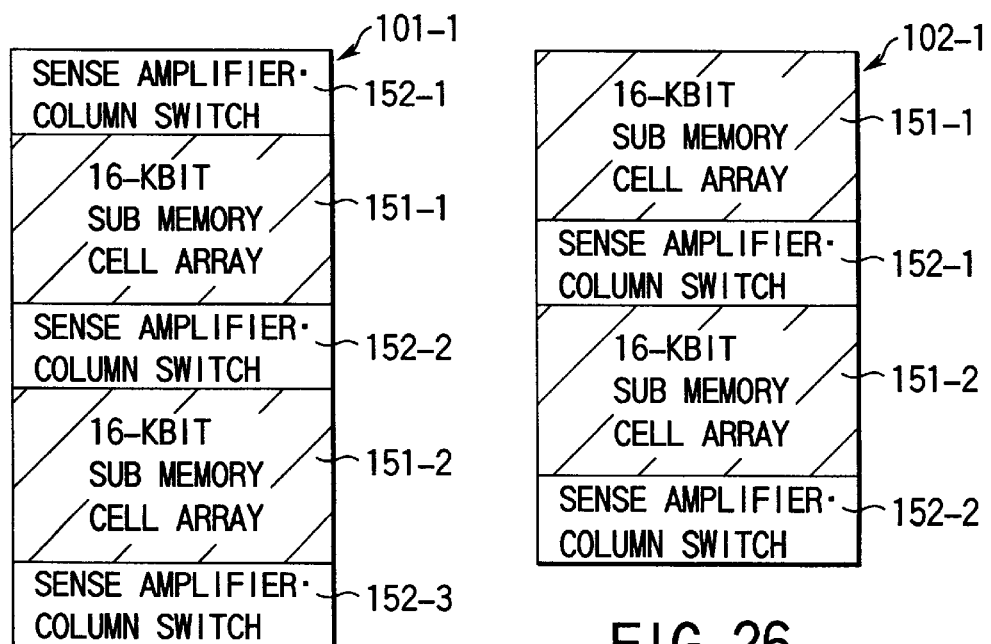
FIG. 25
FIG. 26

[MEMORY MACRO DESIGN FLOW CHART]
BLOCK DESIGN (STORAGE CAPACITY MINIMAL UNIT, MAXIMAL CAPACITY)
(K BITS)  (N BITS)

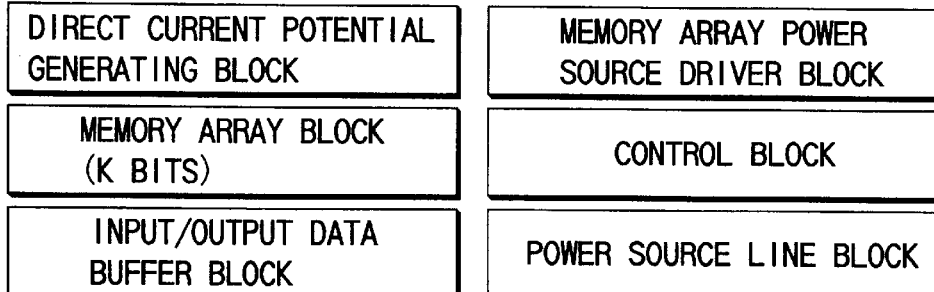

SPECIFICATION CONFIRMATION AND INPUT
(MEMORY MACRO STORAGE CAPACITY N BITS, THE NUMBER OF ROWS, THE NUMBER OF COLUMNS, THE NUMBER OF I/Os ETC.)

CALCULATION OF THE NUMBER OF SUB MEMORY ARRAY BLOCKS P($=R/Q$)
CALCULATION OF THE NUMBER OF MEMORY ARRAY BLOCKS L($=N/(M \times P)$)
CHANGE-OVER OF BLOCK ADDRESS SWITCHES (AUTOMATION BY CAD PROCESSING)

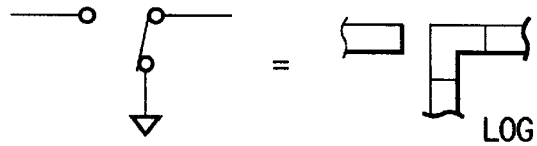

LOGIC DESIGN
(GATE ARRAY, STANDARD CELL ETC.)

DESIGN COMPLETION OF MEMORY MACRO DESIGN

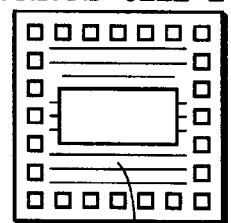
LOGIC SECTION

DESIGN COMPLETION OF MEMORY INTEGRATED WITH LOGIC

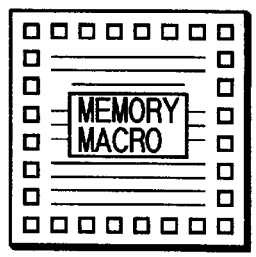

FIG. 39

MEMORY INTEGRATED WITH LOGIC ON A SEMICONDUCTOR CHIP AND METHOD OF DESIGNING THE SAME

BACKGROUND OF THE INVENTION

The present invention relates to a structure of a memory macro of a semiconductor chip on a one chip in which a memory storing data and a logic performing a specific operation on the data are integrated and a designing method for the memory macro.

FIG. 40 shows a layout of a memory integrated with a logic on a chip.

The chip 10 is occupied by a logic section 11, a memory section (hereinafter referred to as memory macro) 12 and an input/output section (hereinafter referred to as I/O section) 13. The memory macro 12 is formed in such a manner that after a functional block (IP: Intellectual Property) or megacell having a function as a memory is designed, the functional block or the megacell is arranged on the chip as it is.

In the chip 10, at least one memory macro 12 is arranged. As shown in FIG. 41, the chip 10 may be provided with functional blocks (or megacells) 14a, 14b each having a specified function such as PPL circuit or the like in addition to the memory macro 12. A logic section 11 in which a circuit for executing a specific operation is formed occupies the region other than regions which the memory macro 12 and the functional blocks 14a, 14b occupy respectively.

The logic section 11 is designed by use of a designing method for a gate array or a standard cell.

In the case where the memory macro 12 is constructed from SRAMs (static random access memory), the memory macro 12 is designed by an automatically designing method which automatically determines a layout of a memory cell array in a matrix forming a predetermined number of rows and a predetermined number of columns by use of CAD processing.

When the memory macro 12 is constituted of a DRAM (dynamic random access memory) having a storage capacity of 1 Mbits or more, the automatically designing method cannot be applied in a design of the memory macro 12 since an operational margin of a DRAM is strongly dependent on parasitic capacitance of a bit line and a bit line Therefore, when the memory macro 12 is constituted of a DRAM having a storage capacity of 1 Mbits or more, a designing method has conventionally been accepted as a general way that a memory macro as the minimal unit of storage capacity, that is a so-called a sub memory macro, is manually designed by a designer in advance and a necessary number of sub memory macros are combined according to a specification of a logic in memory integrated circuit: that is the number of rows, the number of columns, the number of inputs and outputs (the number of I/Os), a storage capacity etc. According to this designing method, since only a combination of sub memory macros makes it possible to form a memory macro, the memory macro can be designed in a short period (TAT: a turnaround time). Each sub memory macro can independently be operated, for example, one sub memory macro can be sold on the market as a usual DRAM.

FIG. 42 shows an example of a floor plan for a conventional memory macro.

The memory macro 12 comprises, for example, four sub memory macro 15a to 15d each functioning as one DRAM having a storage capacity of 2 Mbits. Since each sub memory macro functions as a DRAM having a storage capacity of 2 Mbits, the memory macro 12 is a DRAM having a storage capacity of 8 (2×L) Mbits (L indicates the number of sub memory macros and herein the case of L=4 is taken up as an example).

FIG. 43 shows a block diagram of the sub memory macro 15a shown in FIG. 42.

The sub memory macro 15a includes all the circuits necessary for a DRAM to operate in a perfect manner as an independent one. That is, the sub memory macro 15a comprises: a memory cell array 20, a sense amplifier 21, a row decoder 22, a column decoder 23, an input/output data buffer 24, a row address buffer 25; a column address buffer 26, a row control circuit 27, a column control circuit 28, a substrate potential generating circuit 29, a word line potential generating circuit 30, a bit line potential generating circuit 31, a sense amplifier power source driver reference potential generating circuit 32, a peripheral circuit power source potential generating circuit 33 and a sense amplifier power source driver transistor 34.

As an example, an external power source VEXT is about 3.3V, a substrate potential VBB is about −1V, a word line potential VPP is about 4.3V, a bit line potential VBL is about 1.3V, a sense amplifier power source potential VAA is about 2.5V and a peripheral circuit power source potential VINT is about 2.8V. Sub memory macros 15b to 15d are constructed in the same structure as this.

When a plurality of sub memory macros 15a shown in FIG. 43 are combined into one memory macro, since each of the sub memory macros 15a to 15d comprises: a row address buffer 25, a column address buffer 26, a row control circuit 27, a column control circuit 28, a substrate potential generating circuit 29, a word line potential generating circuit 30, a bit line potential generating circuit 31, a sense amplifier power source driver reference potential generating circuit 32, a peripheral circuit power source potential generating circuit 33 and a sense amplifier power source driver transistor 34, the memory macro has to be provided with the above mentioned circuits included in the plurality of sub memory macros 15a.

That is, since the more the number of sub memory macros 15a, the more the number of each of the above mentioned circuits, increase in area of a memory macro is resulted. However, there is no need for providing all the circuits included the sub memory macros 15a to 15d, wherein each sub memory macro 15a comprises a row address buffer 25, a column address buffer 26, a row control circuit 27, a column control circuit 28, a substrate potential generating circuit 29, a word line potential generating circuit 30, a bit line potential generating circuit 31, a sense amplifier power source driver reference potential generating circuit 32, a peripheral circuit power source potential generating circuit 33 and a sense amplifier power source driver transistor 34, but only one circuit system is sufficiently provided in one memory macro 12.

As a designing method to solve this fault, the following method has been proposed.

A designing method of FIG. 44 is disclosed in Jpn. Pat. Appln. SHUTSUGAN Publication No. 7-13738 (filed on Jan. 31, 1995).

This method provides a memory macro 12 comprising a plurality of, for example 4 sub memory macros 16a to 16d, one control section (control macro) 17 and a interconnection section 18 in order to realize a desired storage capacity. According to the method, unnecessary increase in chip area of the memory macro can be prevented from occurring since there is a control macro 17 shared by a plurality of sub memory macro 16a to 16d.

Another designing method is a method disclosed in T. Watanabe et al., "A Modular Architecture for a 6.4 Gbytes, 8 Mb DRAM-Integrated Media Chip," IEEE J. Solid-State Circuits, vol. 32, pp. 635–641, May 1997.

This designing method provides a memory macro 41 comprising a plurality of a memory block (bank) 42, a predetermined potential generating circuit 43, a sense amplifier 44 and a data input/output section 45. On the chip 40, a control section (control logic) 46 for the memory macro 41 and a logic section (operational circuit) 47 are arranged in addition to the memory macro 41. According to the method, sets each consisting of a predetermined potential generating circuit 43, a sense amplifier 44, a data input/output section 45 and a control section 46 are not respectively provided to a plurality of memory blocks (bank) 42 but one set is provided for common use, therefore unnecessary increase in chip area of the memory macro to be caused by increase in the number of memory blocks 42 is prevented form occurring.

According to designing methods of FIGS. 44 and 45, since a memory macro having a desired storage capacity can be achieved only if the number of sub memory macros or memory blocks is adjusted, whereby designing period for a memory integrated with a logic can be shortened. Since neither sub memory macros nor memory blocks respectively contain circuits each of which can commonly be used, the memory macro is prevented from being enlarged in area more than necessary when the number of sub memory macros or memory blocks is increased.

However, if the number of sub memory macros or memory blocks is changed according to a different specification (the number of rows, the number of columns, the number of I/O, storage capacity etc.) of a memory integrated with a logic, for example, whereby the number of address signals which are required for memory operation is also changed and predetermined circuits such as an address buffer, a address decoder etc. have to be redesigned accordingly.

A specification of a memory macro with a storage capacity less than one Mbit memory array, which is essentially an enlargement unit, for example 64 Kb and 32 Kb has conventionally been obtained by design change of one Mb memory array. However, a design change of an memory array itself is accompanied with a basic change thereof and this change can not be automatically performed in CAD processing and thereby it is time-consuming. The number of I/Os of an input/output data buffer is also required to be changed according to the number of DQ line pairs of a memory array which is changed in design.

BRIEF SUMMARY OF THE INVENTION

An object of the present invention is not only to provide a configuration of circuits in a memory macro in which, even if a storage capacity of a memory macro is changed according to a different specification of a memory integrated with a logic, a design change accompanying with the change in the storage capacity can be automatically performed with simplicity, but also to provide a designing method actually contributing to shortening of a design time and shrinkage of an area overhead.

In order to achieve the object, the present invention is directed to a semiconductor chip in which a memory macro and a logic section are integrated, wherein the memory macro comprises a control block including an address buffer circuit for generating an internal address signal in response to an external address signal inputted from the logic section and a switch circuit for fixing a portion of the internal address signal at a predetermined value, at least one memory array block having a plurality of data lines, and an input/output data buffer block for outputting data of a memory cell of the at least one memory array block through the data lines to the logic section. In the semiconductor chip, the at least one memory array block may further comprise first, second and third sense amplifiers arranged in a column direction, a first memory cell array provided between the first and second sense amplifiers, and a second memory cell array provided between the second and third sense amplifiers. In the semiconductor chip, the at least one memory array block may further comprise a first memory cell array, a first sense amplifier, a second memory cell array, a second sense amplifier arranged in a column direction. In the semiconductor chip, the address buffer circuit of the control block may comprise a plurality of address buffers, and the switch circuit of the control block may comprise a plurality of switches arranged between a plurality of external address signal lines of the external address signal and the plurality of address buffers. In the semiconductor chip, the memory macro may further comprise at least one memory array power source driver block corresponding to the at least one memory array block, and the at least one memory array power source driver block may comprise an internal power source generating circuit for receiving an external power source voltage and generating an internal power source voltage which drives a memory cell array of the memory array block. In the semiconductor chip, the internal power source generating circuit internal power source generating circuit may comprise a voltage-down-converting transistor for receiving an external power source voltage and generating an internal power source voltage which drives the memory cell array of the memory array block. In the semiconductor chip, the memory macro may comprise a power source potential generating block for receiving an external power source voltage, generating a direct current power source voltage to be supplied to the at least one memory array block, the input/output data buffer block and the control block. In the semiconductor chip, the memory macro may further comprise a power source line block arranged adjacent to the at least one of memory array block. In the semiconductor chip memory, the plurality of switches may be made of a plurality of metal layers. In the semiconductor chip, the plurality of switches may be made of a plurality of contact layers. In the semiconductor chip, a memory cell array of the memory array block may be constituted of DRAMs configured in a matrix. In the semiconductor chip, wherein the at least one memory array block may comprise a memory array block control section including a driver for driving a row decoder, a column decoder and a sense amplifier, and at least one memory cell array arranged adjacent to the memory array block control section.

The present invention is also directed to a semiconductor chip in which a memory macro and a logic section are integrated, wherein the memory macro comprises a control block including an address buffer circuit for generating an internal address signal in response to an external address signal inputted from the logic section and a switch circuit for fixing a portion of the internal address signal at a predetermined value, a plurality of memory array blocks having a plurality of data lines, and an input/output data buffer block for outputting data of a memory cell of the memory array blocks through the data lines to the logic section. In the semiconductor chip, the data lines may be shared by the memory array blocks.

The present invention is also directed to a semiconductor chip in which a memory macro and a logic section are integrated, wherein the memory macro comprises a control block including an address buffer circuit for generating an internal address signal in response to an external address signal inputted from the logic section, at least one memory array block comprising a plurality of sub memory array blocks arranged in a row direction and has a plurality of data lines, and a plurality of input/output data buffers each comprising an amplifying circuit for amplifying data of a memory cell of the at least one memory array block and outputting the data through the data lines to the logic section. In the semiconductor chip, each of the input/output data buffers may comprise a voltage-down-converting transistor for receiving an external power source voltage and generating an internal power source voltage for the amplifying circuit. In the semiconductor chip, the at least one memory array block may further comprise first, second and third sense amplifiers arranged in a column direction, a first memory cell array provided between the first and second sense amplifiers, and a second memory cell array provided between the second and third sense amplifiers. In the semiconductor chip, the at least one memory array block may further comprise a first memory cell array, a first sense amplifier, a second memory cell array, a second sense amplifier arranged in a column direction. In the semiconductor chip, the address buffer circuit of the control block may comprise a plurality of address buffers, and the switch circuit of the control block may comprise a plurality of switches arranged between a plurality of external address signal lines of the external address signal and the plurality of address buffers. In the semiconductor chip, the plurality of switches may be made of a plurality of metal layers. In the semiconductor chip, the plurality of switches may be made of a plurality of contact layers. In the semiconductor chip, the memory macro may further comprise at least one memory array power source driver block corresponding to the at least one memory array block, and the at least one memory array power source driver block may comprise an internal power source generating circuit for receiving an external power source voltage and generating an internal power source voltage which drives a memory cell array of the memory array block. In the semiconductor chip, the internal power source generating circuit may comprise a voltage-down-converting transistor for receiving an external power source voltage and generating an internal power source voltage which drives the memory cell array of the memory array block. In the semiconductor chip, a memory cell array of the memory array block may be constituted of DRAMs configured in a matrix.

The present invention is also directed to a semiconductor chip in which a memory macro and a logic section are integrated, wherein the memory macro comprises a control block including an address buffer circuit for generating an internal address signal in response to an external address signal inputted from the logic section, a plurality of memory array blocks each comprising a plurality of sub memory cell array blocks arranged in a row direction and has a plurality of data lines, and a plurality of input/output data buffers each comprising an amplifying circuit for amplifying data of a memory cell of the memory array blocks and outputting the data through the data lines to the logic section. In the semiconductor chip, the data lines may be shared by the memory array blocks.

The present invention is also directed to a designing method for a semiconductor chip comprising a logic section and a memory macro which comprises a control block including an address buffer circuit for generating an internal address signal in response to an external address signal inputted from the logic section and a switch circuit for fixing a portion of the internal address signal at a predetermined value, at least one memory array block having a plurality of data lines, and an input/output data buffer block for outputting data of a memory cell of the at least one memory array block through the data lines to the logic section, the designing method comprising: a step of determining the number L of memory array blocks satisfying a specification of the memory macro, and a step of creating layout data of arranging L memory array blocks at positions adjacent to the input/output data buffer block and the control block by automatic processing according to a program. In the designing method for a semiconductor chip, the number L of the memory array blocks may be determined based on at least one constituent of a specification comprising the number of rows, the number of columns, the number of input/output terminals, the number of pairs of data lines, the storage capacity of the memory macro and the storage capacity of each of the memory array blocks. In the designing method for a semiconductor chip, the number L of the memory array blocks may be determined by $L=N/K$, where N represents the storage capacity of the memory macro and K represents the storage capacity of each of the memory array blocks.

The present invention is also directed to a designing method for a semiconductor chip comprising a logic section and a memory macro which comprises a control block including an address buffer circuit for generating an internal address signal in response to an external address signal inputted from the logic section, at least one memory array block comprising a plurality of sub memory array blocks arranged in a row direction and has a plurality of data lines, and a plurality of input/output data buffers each comprising an amplifying circuit for amplifying data of a memory cell of the at least one memory array block and outputting the data through the data lines to the logic section, the designing method comprising a step of determining the number P of the sub memory array blocks and the number L of the memory array blocks satisfying a specification of the memory macro, and a step of creating layout data of arranging L memory array blocks comprising P sub memory array blocks at positions adjacent to the input/output data buffers and the control block by automatic processing according to a program. In the designing method for a semiconductor chip, the number P of the sub memory array blocks and the number L of memory array blocks may be determined based on at least one constituent of a specification comprising the number of rows, the number of columns, the number of input/output terminals, the storage capacity of the memory macro, the storage capacity of each of the sub memory array blocks, the number of pairs of data lines of each of the sub memory array blocks and the storage capacity of the memory array block. In the designing method for a semiconductor chip, the number P of the sub memory array blocks may be determined by $P=R/Q$ and the number L of memory array blocks may be determined by $L=N/(M\times P)$, where R represents the number of input/output terminals, Q represents the number of pairs of data lines of each of the sub memory array blocks, N represents the storage capacity of memory macro, M represents the storage capacity of each of the sub memory array blocks.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 13A, 13B, 13C, and 13D are representations showing a change-over method for the switches of FIGS. 11 and 12.

FIG. 18 is a flow chart for designing a memory macro.

FIG. 24 is a representation showing a floor plan of the memory array block of FIG. 22.

FIG. 25 is a schematic representation showing part of a structure of a sub memory array block of the memory array block of FIGS. 23, 24.

FIG. 26 is a schematic representation showing another part of a structure of a sub memory array block of the memory array block of FIGS. 23, 24.

FIG. 39 is a flow chart for designing a memory macro.

DETAILED DESCRIPTION OF THE INVENTION

A memory integrated with logic will below be described in reference to the accompanying drawings in a detailed manner.

Figure 1:
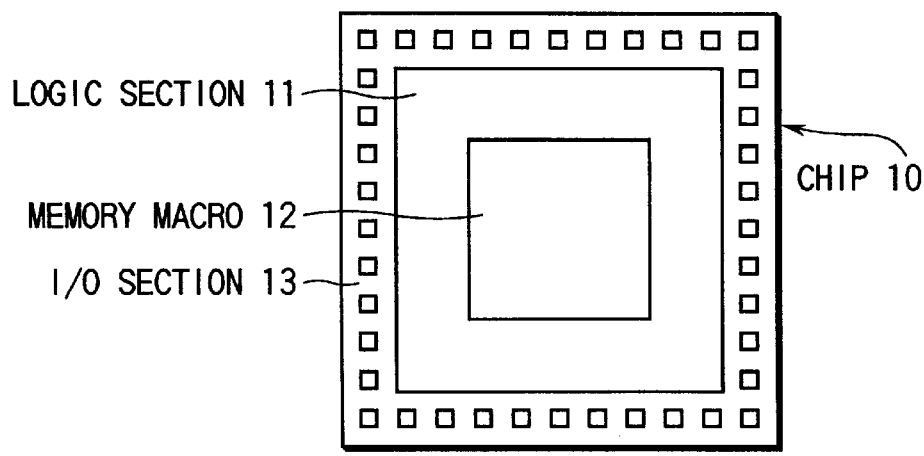
FIG. 1 is a view showing a floor plan of a memory integrated with a logic.
Figure 2:
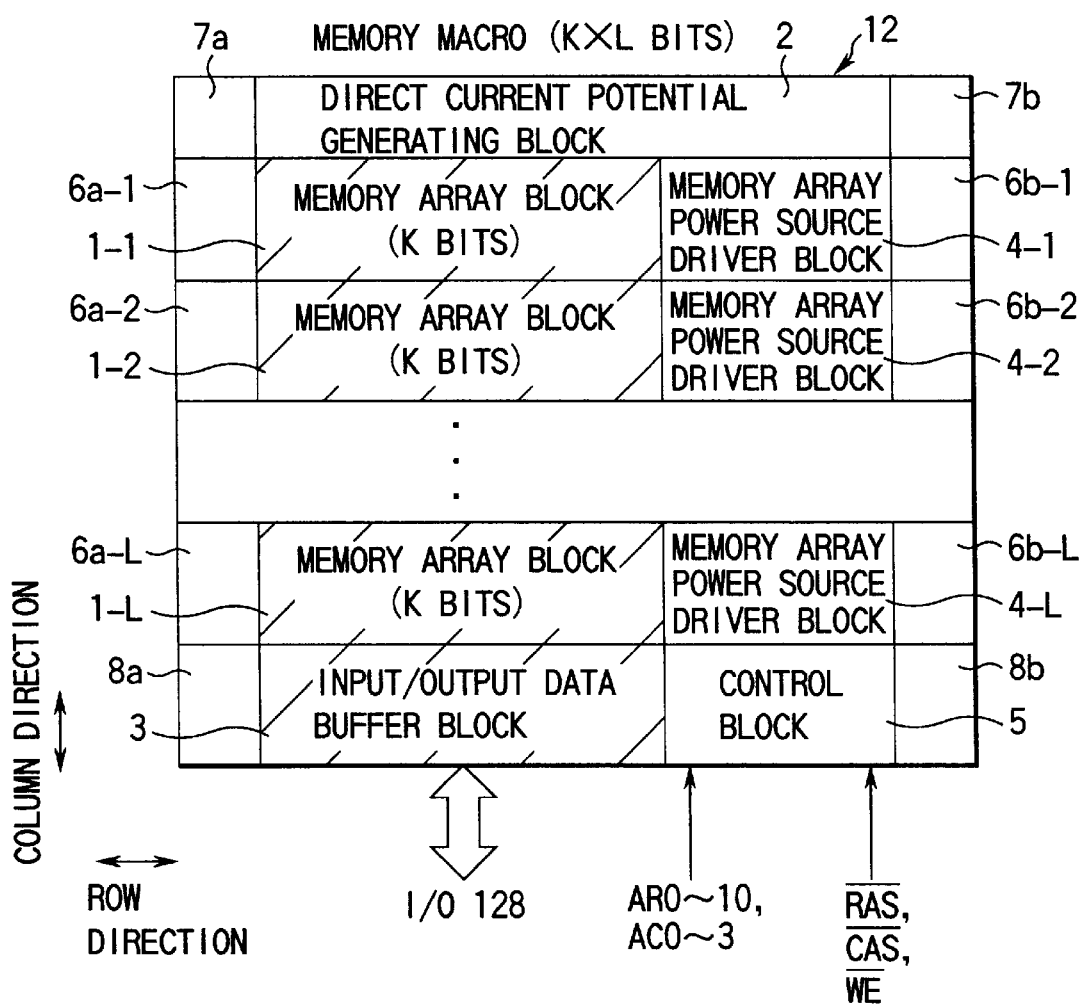
FIG. 2 is a representation showing a floor plan of memory macro of a first embodiment of the present invention.

FIG. 1 is a view showing a floor plan of a memory integrated with a logic. FIG. 2 is a representation showing a floor plan of memory macro of a first embodiment of the present invention.

A chip 10 is occupied by a logic section 11, a memory macro 12 and an I/O section 13. The memory macro 12 is formed in such a manner that, after a functional block (IP) or a megacell having a function as a memory is designed, the functional block or the megacell is arranged on the chip 10 without any change thereof.

The chip 10 has at least one memory macro 12 arranged thereon. The chip 10 may further comprises a functional block (or megacell) having a predetermined function such as PLL circuit. The region of the chip 10 other than the memory macro 12 is arranged is occupied by a logic section 11 where a logic which performs a specific operation is formed. The logic section 11 is designed by a designing method used for a gate array, a standard cell or the like.

The memory macro 12 is designed separately from the logic section. The memory macro 12 comprises: L (L is a natural number) memory array blocks consisting of memory blocks 1-1, 1-2, . . . 1-L, a direct potential generating block 2, an input/output data buffer block 3, a memory array power source driver blocks 4-1, 4-2, . . . 4-L, a control block 5 and a power source line blocks 6a-1, 6a-2, . . . 6a-L, 6b-1, 6b-2, . . . 6b-L, 7a, 7b, 8a, 8b.

A storage capacity of the memory macro 12 is determined by the number of memory array blocks. That is, when a storage capacity of one memory array block is K bits (for example 1 megabits), the storage capacity of the memory macro 12 is K×L (L is the number of memory array blocks).

A storage capacity of one memory array block is the minimal unit for a storage capacity of the memory macro 12 in a design stage. That is, a storage capacity of the memory macro 12 can freely be changed with K bits as a unit. Thought it is described later, the maximum of a storage capacity, up to which can be changeable is determined according to a structure of the control block 5.

The memory array blocks 1-1, 1-2, . . . 1-L are arranged in a column direction (a direction along which a bit line extends) in an adjacent manner to one another. For example, 128 pairs of DQ lines (data lines) extending along a column direction are arranged on the memory array blocks 1-1, 1-2, . . . 1-L and a pair of DQ lines of each memory array are mutually connected when the memory array blocks are arranged in an adjacent manner to one another.

The direct potential generating block 2 comprises circuits each for generating a constant potential, such as a substrate potential VBB, a word line potential VPP, a bit line potential VBL, a sense amplifier power source driver reference potential VPPA, a peripheral circuit power source potential VINT etc. The direct potential generating block 2 is arranged at an end of the memory array blocks 1-1, 1-2, . . . 1-L in a column direction.

The input/output data buffer block 3 is arranged at the other end of the memory array 1-1, 1-2, . . . 1-L in the column direction. The DQ pairs of the memory array blocks 1-1, 1-2, . . . 1-L are connected to the input/output data buffer block 3. The direct potential generating block 2 and input/output data buffer block 3 are arranged at opposed positions between which the memory array blocks 1-1, 1-2, . . . 1-L are sandwiched.

The memory array power source driver blocks 4-1 4-2, . . . 4-L are located in a corresponding manner to the memory array 1-1, 1-2, . . . 1-L. The memory array power source driver blocks 4-1 4-2, . . . 4-L include a circuit (transistor) which supplies a power source to a driver driving a sense amplifier.

The reason why the memory array power source driver blocks 4-1 4-2, . . . 4-L are located in a corresponding manner to the memory array blocks 1-1, 1-2, . . . 1-L is that a size of a circuit (transistor) supplying a power source to a driver driving the sense amplifier can be variable according to a scale (storage capacity) of a memory cell array.

That is, for example, when only one power source driver block (transistor) is provided, the transistor has to be fabricated to have a size which corresponds to the case which a scale of the memory cell array is maximal regardless of an actual scale of the memory cell array. If this is the case, since a transistor with a large size is always present even when a storage capacity of the memory macro is small, which is resulted in a large area overhead.

If the memory array power source drive blocks 4-1, 4-2, . . . 4-L are arranged in a corresponding manner to the memory array blocks 1-1, 1-2, . . . 1-L, a size of a circuit (transistor) which supplies a power source to a driver driving a sense amplifier is variable according to a scale (storage capacity) of the memory cell array and therefore, such a difficult situation can be avoided and a design time can simultaneously be shortened.

The control block 5 comprises: buffers respectively for a row address strobe signal/RAS, column address strobe signal/CAS and write signal/WE. The control block 5 buffers row address signals (external row address signals)AR0 to AR10 and column address signals (external column address signals) AC0 to AC3 and comprises: buffers to produce an internal row address signal and an internal column address signal; and a switch which can fix part (a block selection address signal) of the internal row address signal at a predetermined value according to a storage capacity (the number of memory array blocks) of a memory macro. The switch can be changed over with freedom by different ways of connection in a metal layer (interconnection layer) and a contact layer and therefore, while connection of the switch can be changed over in a design stage, no change over of the switch can be effected after a sample is completed.

The power source line blocks 6a-1, 6a-2, . . . 6a-L, 6b-1, 6b-2, . . . 6b-L, 7a, 7b, 8a, 8b are arranged at row direction ends respectively of the memory array blocks 1-1, 1-2, . . . 1-L. The power source line blocks 6a-1, 6a-2, . . . 6a-L, 6b-1, 6b-2, . . . 6b-L, 7a, 7b, 8a, 8b supply an external power source VEXT and a ground potential GND to the memory array blocks 1-1, 1-2, . . . 1-L, the direct potential generating block 2, the input/output data buffer block 3, the memory array power source driver blocks 4-1, 4-2, . . . 4-L and the control block 5.

Figure 3:
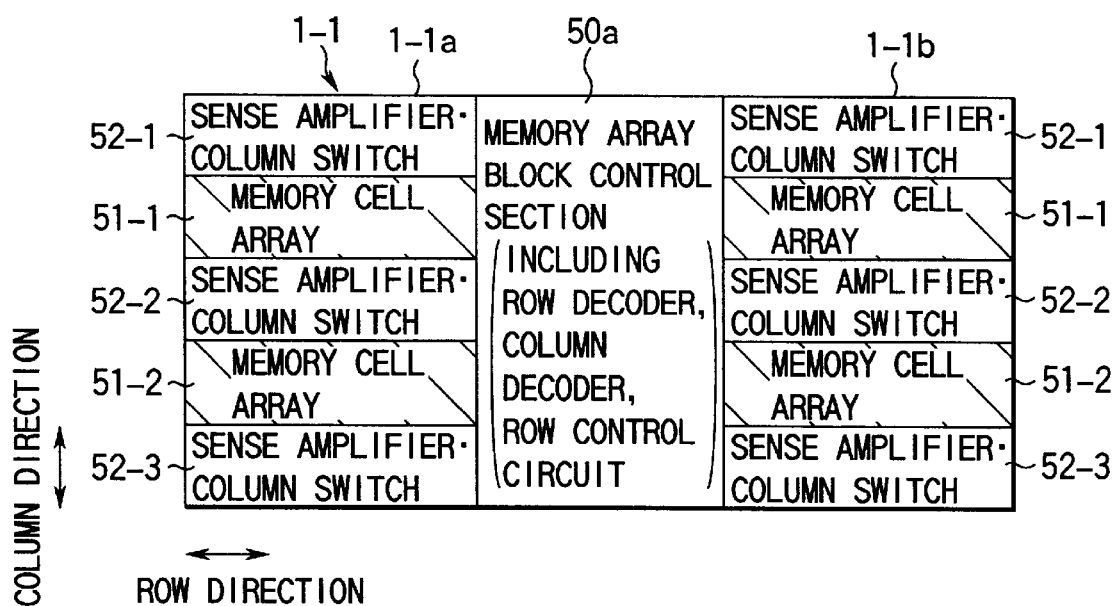
FIG. 3 is a representation showing a floor plan of the memory array block of FIG. 2.
Figure 4:
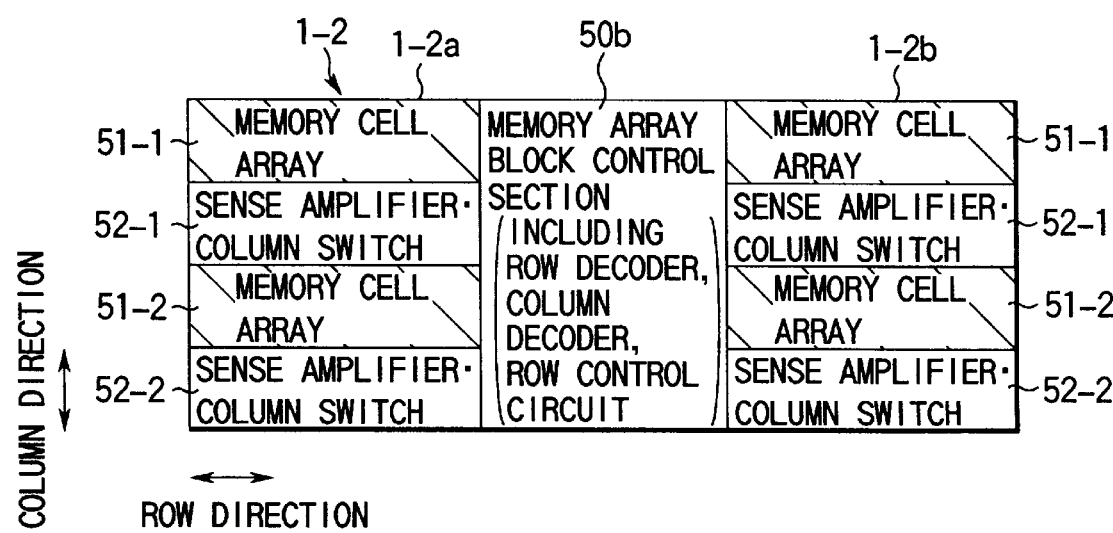
FIG. 4 is a representation showing a floor plan of the memory array block of FIG. 2.

FIGS. 3, 4 show floor plans of memory array blocks. In the floor plans of the memory arrays, a common sense amplifier scheme is employed and memory cell arrays respectively abutting on both sides of a sense amplifier use the sense amplifier commonly.

FIG. 3 shows a floor plan of the memory array block 1-1 of FIG. 2. A memory array block control section 50a comprises a row decoder, a column decoder, a row control circuit, etc. Memory cell arrays 51-1, 51-2 and 51-1, 51-2 are, respectively, arranged at one end and the other end of the memory array block control section 50a in a row direction. Specifically, a memory array block 1-1a is arranged at one side of the memory array block control section 50a and comprises the memory cell arrays 51-1 and 51-2. Similarly, a memory array block 1-1b is arranged at the other side of the memory array block control section 50a and comprises the memory cell arrays 51-1 and 51-2. Kokokara7/10

In the memory array block 1-1a, the memory cell arrays 51-1, 51-2 are located in an adjacent relation to each other in a column direction. A sense amplifier (including a column switch) 52-2 is arranged between one end of the memory cell array 51-1 and one end of the memory cell array 51-2. A sense amplifier (including a column switch) 52-1 is arranged at the other end of the memory cell array 51-1 in the column direction, and similarly a sense amplifier (including a column switch) 52-3 is arranged at the other end of the memory cell array 51-2 in the column direction.

Likewise, in the memory array block 1-1b, the memory cell arrays 51-1, 51-2 are located in an adjacent relation to each other in the column direction. A sense amplifier (including a column switch) 52-2 is arranged between one end of the memory cell array 51-1 and one end of the memory cell array 51-2. A sense amplifier (including a column switch) 52-1 is arranged at the other end of the memory cell array 51-1 in the column direction, and similarly a sense amplifier (including a column switch) 52-3 is arranged at the other end of the memory cell array 51-2 in the column direction.

When one memory array block constitutes a memory macro (when only a memory array block 1-1 is present in FIG. 2), the floor plan of FIG. 3 is employed. However, if a so-called common sense amplifier scheme is not employed, a sense amplifier (including a column switch) may be inserted only between adjacent memory cell arrays in a column direction.

FIG. 4 shows a floor plan of the memory array block 1-2 of FIG. 2. A memory array block control section 50b comprises: a row decoder, a column decoder, a row control circuit, etc. Memory cell arrays 51-1, 51-2 and 51-1, 51-2 are, respectively, arranged at one end and the other end of the memory array block control section 50b in a row direction, Specifically, a memory array block 1-2a is arranged at one side of the memory array block control section 50b and comprises the memory cell arrays 51-1 and 51-2. Similarly, a memory array block 1-2b is arranged at the other side of the memory array block control section 50b and comprises the memory cell arrays 51-1 and 51-2.

In the memory array block 1-2a, the memory cell arrays 51-1, 51-2 are located in an adjacent relation to each other in a column direction. A sense amplifier (including a column switch) 52-1 is arranged between one end of the memory cell array 51-1 and one end of the memory cell array 51-2. A sense amplifier (including a column switch) 52-2 is arranged at the other end (I/O buffer side) of the memory cell array 51-2 in the column direction.

Likewise, in the memory array block 1-2b, the memory cell arrays 51-1, 51-2 are located in an adjacent relation to each other in a column direction. A sense amplifier (including a column switch) 52-1 is arranged between one end of the memory cell array 51-1 and one end of the memory cell array 51-2. A sense amplifier (including a column switch) 52-2 is arranged at the other end (I/O buffer side) of the memory cell array 51-2 in the column direction. The floor plans of the other memory array blocks 1-3, . . . 1-L are similar to that of the memory array block 1-2, and thus the explanation thereof is omitted.

When a storage capacity of a memory array block is, for example, 1 Mbit, a storage capacity of each of the memory cell arrays 51-1 to 51-2 is 256 kbits. The memory cell array of 256 kbits has a structure of, for example, 256 (row)×1024 (column). The number of bits (the number of I/Os) which can simultaneously be input or output can be set 128 bits (128 I/Os).

Figure 5:
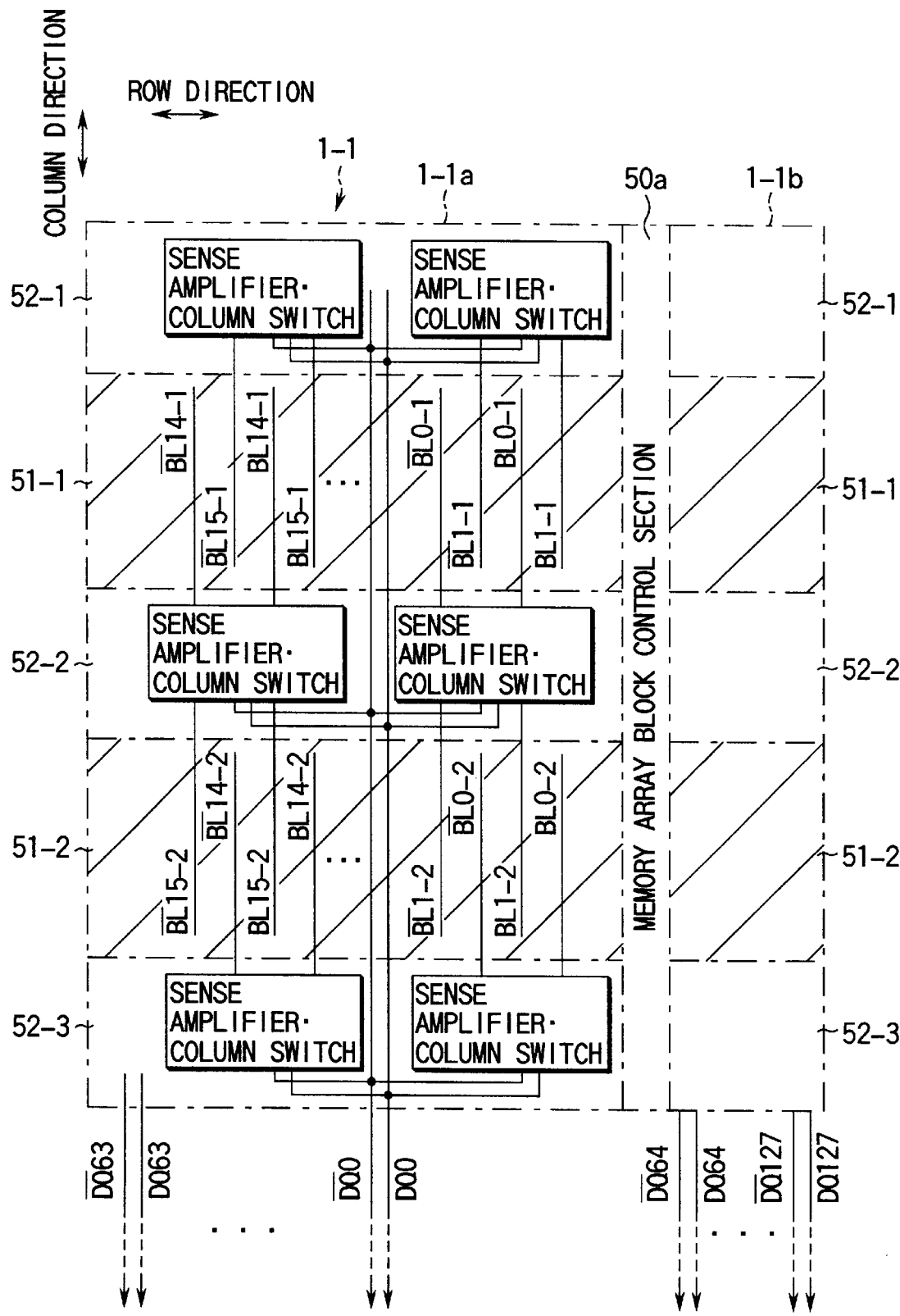
FIG. 5 is a diagram showing an inner structure of the memory array block of FIG. 3.
Figure 6:
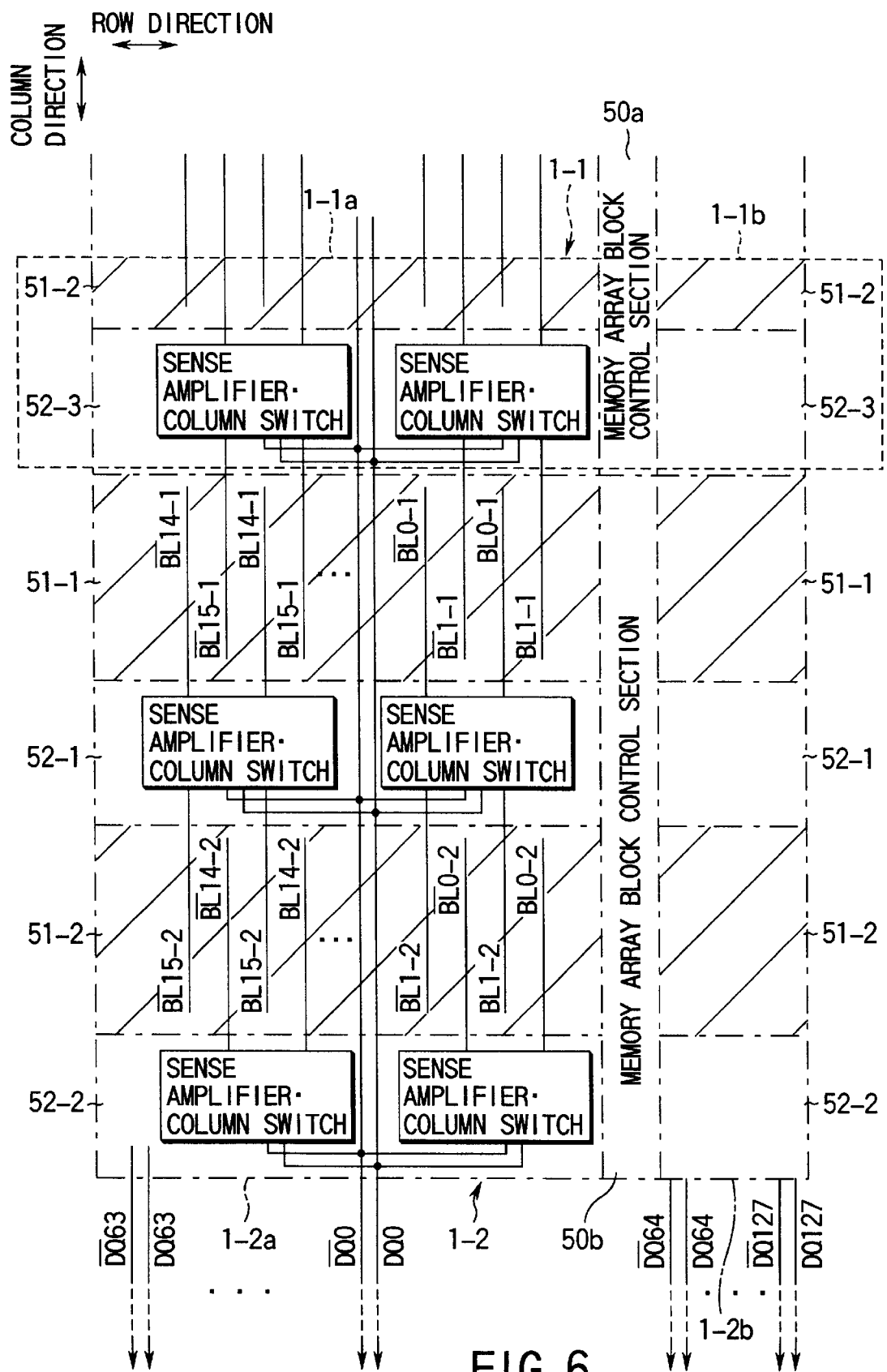
FIG. 6 is a diagram showing an inner structure of the memory array block of FIG. 4.

FIG. 5 shows a layout of the memory array clock 1-1 of FIG. 3. FIG. 6 shows a layout of the memory array block 1-2 of FIG. 4.

In this example, the case where a storage capacity of a memory array block is 1 Mbit will be described. In this case, a storage capacity of each of the memory cell arrays 51-1 to 51-2 is 256 kbits and each of the memory cell arrays 51-1 to 51-2 is has, for example, a structure of 256 (row)×1024 (column).

DQ line pairs DQ0 to DQ63, /DQ0 to /DQ63 are arranged on the memory cell arrays 51-1, 51-2 at an end of a memory array block control section 50a and DQ line pairs DQ64 to DQ127, /DQ64 to /DQ127 are arranged on the memory cell arrays 51-2, 51-2 at the other end of a memory array block control section 50a.

Bit line pairs for 16 columns are connected to one DQ line pair. Since data transfer can be effected between bit line pairs for one column selected by a column selecting signal and one DQ line pair, the number of bits (the number of I/Os) which can simultaneously be input or output is 128 bits (128 I/O). As shown in an area which is enclosed by a broken line of FIG. 6, a sense amplifier of the memory array block 1-2 corresponding to the sense amplifier 52-1 of the memory array block 1-1 also is in a common use relation with the memory array block 1-2 side sense amplifier 52-3 of the memory array block 1-1. That is, a pair of memory array blocks adjacent to each other commonly use a sense amplifier arranged therebetween.

There will be given a detailed description. As shown in FIG. 5, a memory array block 1-1a of a memory array block 1-1 comprises: two 256-kbit sub memory cell arrays 51-1, 51-2 arranged along a column direction. A sense amplifier/column switch 52-2 is inserted between adjacent ends of the two 256 kbit sub memory cell arrays 51-1, 51-2 in an adjacent manner thereto. The sense amplifier/column switch 52-2 which is inserted between both ends co-owned between the two 256 kbit sub memory cell arrays 51-1, 51-2. Besides, sense amplifier/column switches 52-1, 52-3 are arranged respectively at the other ends of the two 256 kbit sub memory cell arrays 51-1, 51-2 in a column direction in an adjacent manner to both ends. Since a structure of the memory array block 1-1b of the memory array block 1-1 is similar to that of the memory array block 1-1a of the memory array block 1-1, description thereof is omitted.

As shown in FIG. 6, a memory array block 1-2a of a memory array block 1-2, in a similar way, comprises two 256-kbit sub memory cell arrays 51-1, 51-2 arranged along a column direction. The two 256-kbit sub memory cell arrays 51-1, 51-2 are arranged along a column direction. A sense amplifier/column switch 52-1 is inserted between adjacent ends of the two 256 kbit sub memory cell arrays 51-1, 51-2 in an adjacent manner to the ends. The sense amplifier/column switch 52-1 which is inserted between both ends is co-owned between the two 256 kbit sub memory cell arrays 51-1, 51-2. Besides, a sense amplifier/column switch 52-2 is arranged respectively in an adjacent manner to the other end of the 256 kbit sub memory cell array 51-2 in a column direction. In the memory array block 1-2a, there is not provided a sense amplifier corresponding to the sense amplifier/column switch 52-1 arranged at the other end of the sub memory cell array 51-1 in the memory array block 1-1 (FIG. 5). Instead, a sense amplifier/column switch 52-3 arranged at the other end of the sub memory cell array 51-2 (FIG. 5) in the memory array block 1-1a arranged in the upper row by one row are shared. A structure of a memory array block 1-2b of a memory array block 1-2 is similar to the memory array block 1-2a of the memory array block 1-2, description thereof is omitted. Since the other memory array blocks in the macro cell of FIG. 2 are similar to the memory array block 1-2 shown in FIG. 6, descriptions thereof are also omitted.

Figure 7:
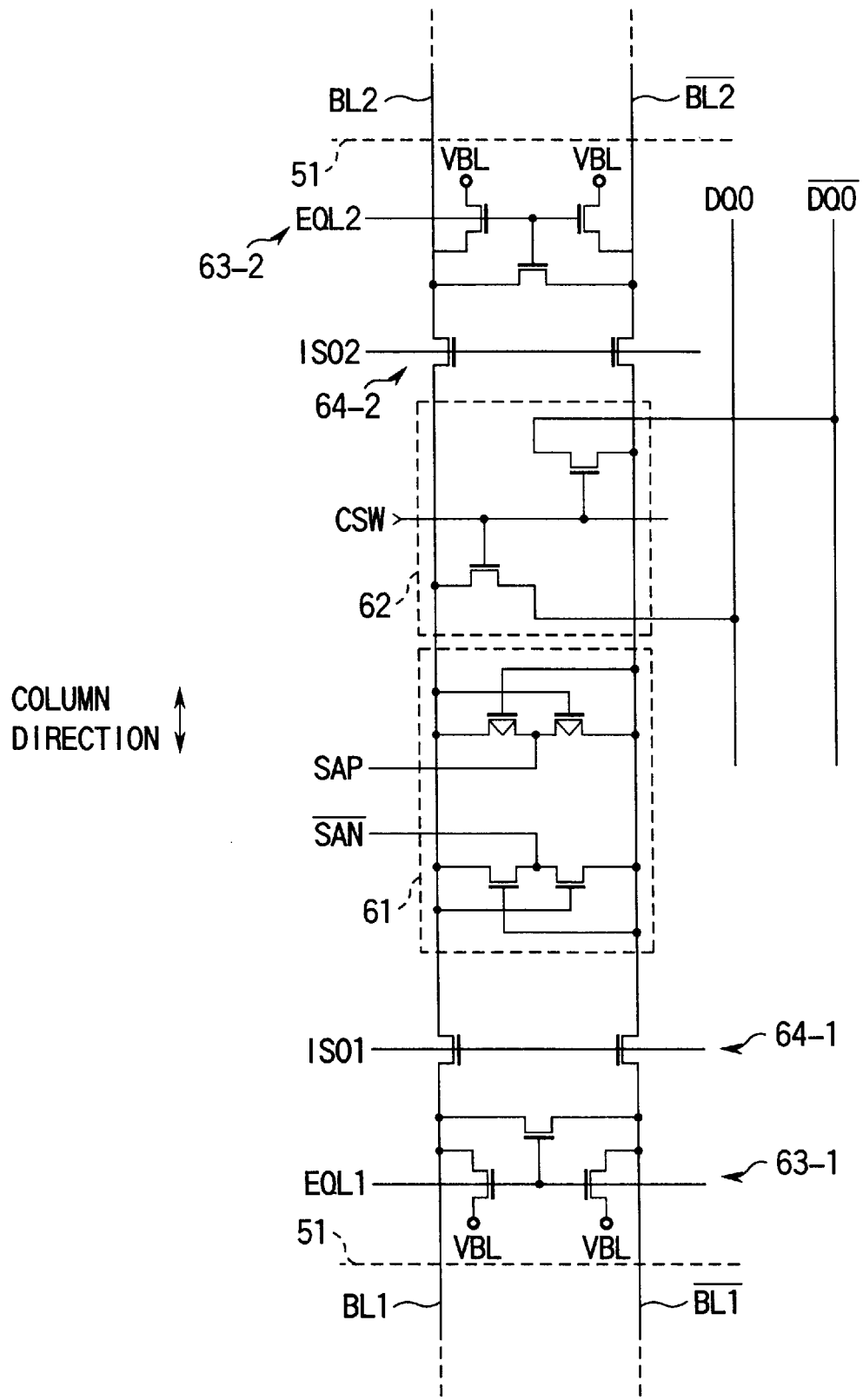
FIG. 7 is a diagram showing a sense amplifier/column switch of a common sense amplifier scheme.

FIG. 7 shows a structure of a sense amplifier of a common sense amplifier scheme.

A sense amplifier 61 and a column switch 62 are arranged between two memory cell arrays 51 adjacent to each other in a column direction. The sense amplifier 61 is activated by activating signals SAP, /SAN and a column switch 62 is activated by a column selecting signal CSW.

A bit line pair BL1, /BL1 extending in a memory cell on one side are connected to a sense amplifier 61 and a column switch 62 by way of an equalizer 63-1 and a selective gate 64-1. A bit line pair BL2, /BL2 extending in a memory cell on the other side are connected to a sense amplifier 61 and a column switch 62 by way of an equalizer 63-2 and a selective gate 64-2.

The selective gate 64-1 is activated by a selecting signal ISO1 and the selective gate 64-2 is activated by a selecting signal ISO2. Any one of the selective gates 64-1, 64-2 and either the bit line pair BL1, /BL1 or the bit line pair BL2, /BL2 are connected to the sense amplifier 61 and the column switch 62.

Figure 8:
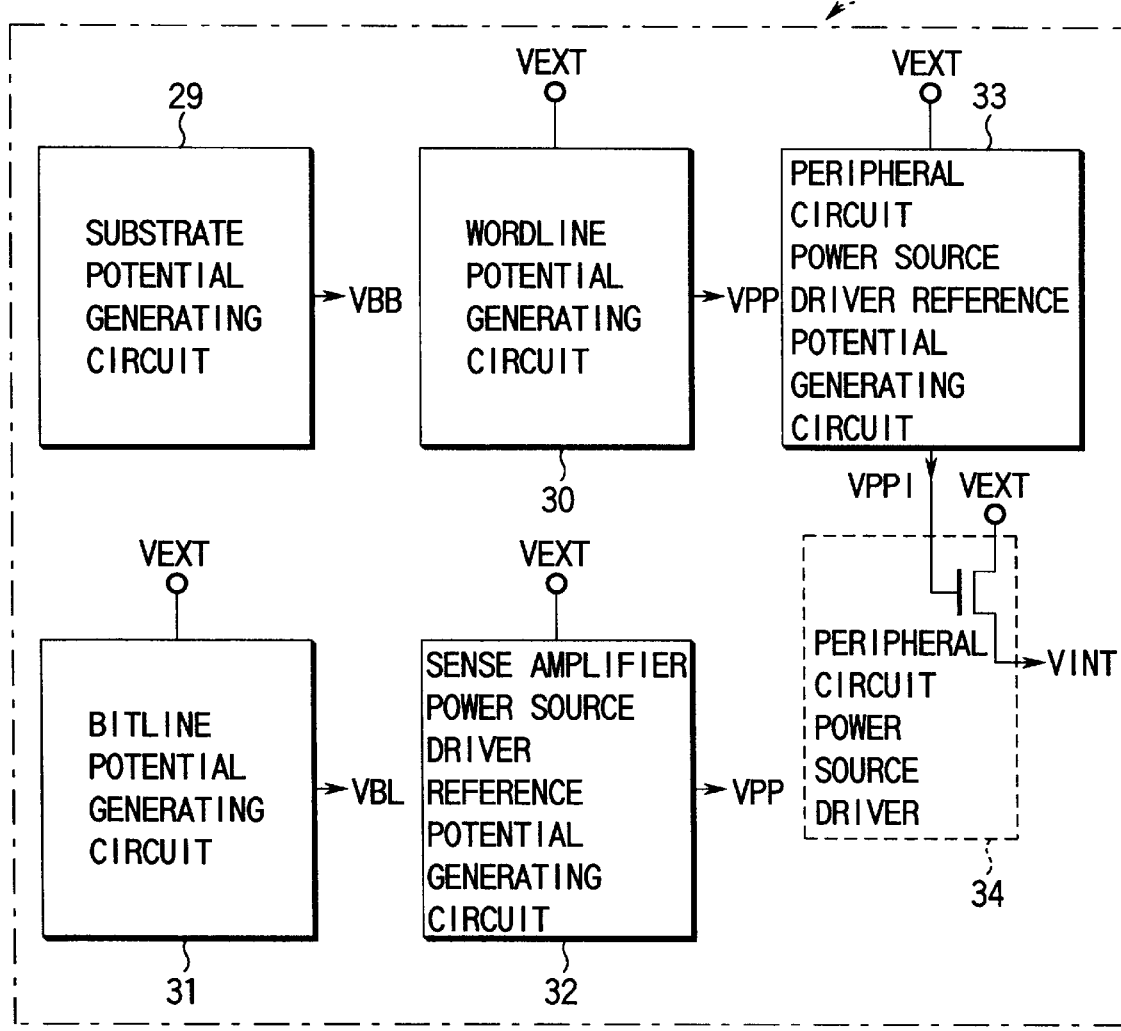
FIG. 8 is a representation showing an inner structure of a direct potential generating block of FIG. 2.

FIG. 8 shows a circuit formed in the direct current potential generating block of FIG. 2.

The substrate potential generating circuit 29 generates a substrate potential VBB in a memory macro. The word line potential generating circuit 30 generates a potential VPP supplied to a word line selected by a row address signal. The bit line potential generating circuit 31 is provided to equalize a potential of a bit line pair to a predetermined value before read or write data is guided to the bit line pair.

Figure 9:
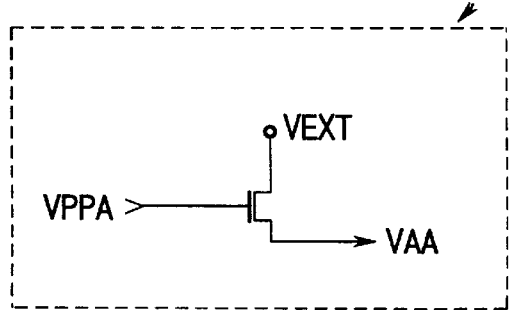
FIG. 9 is a diagram showing an inner structure of a memory array power source driver block of FIG. 2.

The sense amplifier power source driver reference potential generating circuit 32 generates a power source VPPA based on an external power source VEXT. The power source VPPA is supplied to a memory cell array power source driver block 4 as shown in FIG. 9. The memory cell array power source driver block 4 comprises a voltage-down-converting transistor which receives the external power source voltage VEXT at the drain, the power source VPPA at the gate and thereby generates the internal power source voltage (a power source VAA of a sense amplifier driver (for example see FIG. 14) and a memory array block). A sense amplifier driver generates signals SAP, /SAN to be supplied to a sense amplifier.

A peripheral circuit power source potential generating circuit 33 generates an internal power source VINT to drive a peripheral circuit in the memory macro.

The peripheral circuit power source driver reference potential generating circuit 33 generates a power source VPPI by giving the external power source VEXT.

A peripheral circuit power source driver 34 is provided with the external power source VEXT as a drive power source and provided with the power source VPPI from the peripheral circuit power source driver reference potential generating circuit 33 to generate the internal power source VINT in order to drive a peripheral circuit such as an input/output buffer block in the memory macro.

A detailed structure of the peripheral circuit power source driver 34 is constituted of, for example, a MOS transistor functioning as a voltage-down-converting transistor, as shown in FIG. 8. The external power source VEXT is supplied to the drain of the MOS transistor as a drive power source and the power source VPPI is supplied to the gate from the peripheral circuit power source driver reference potential generating circuit 33 as a control signal to generate the internal power source voltage VINT. The internal power source voltage VINT is supplied to the peripheral circuit, for example, an amplifying circuit of the input/output buffer block.

Figure 10:
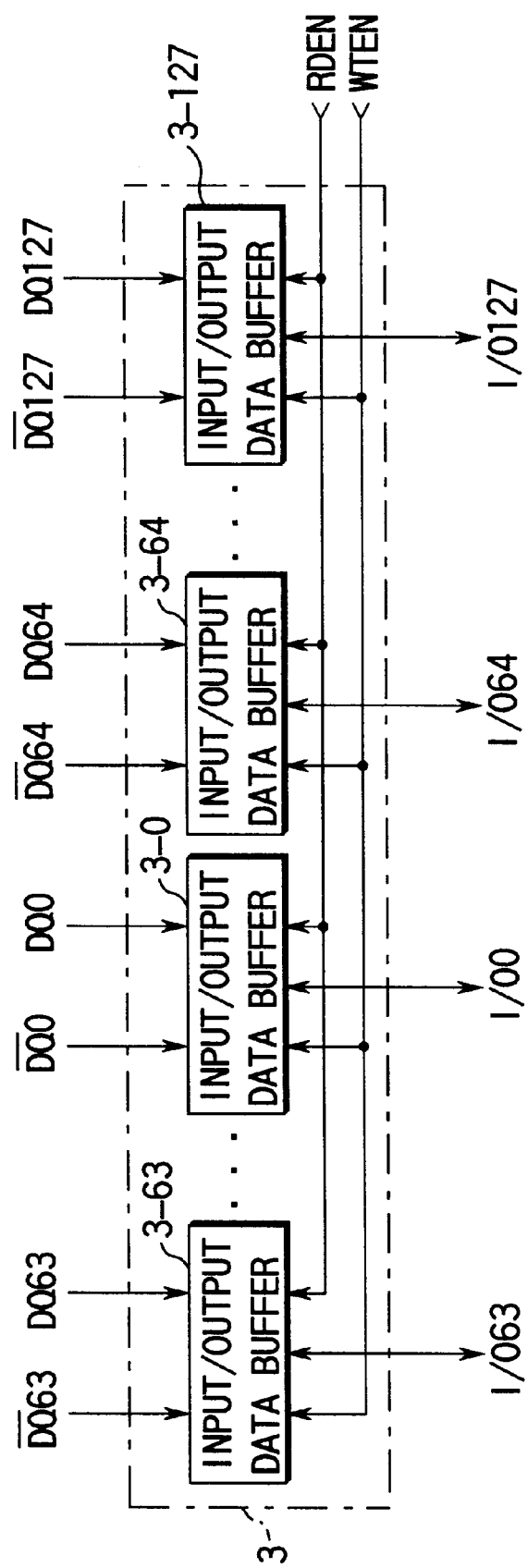
FIG. 10 is a diagram showing an inner structure of an input/output data buffer block of FIG. 2.

FIG. 10 is a diagram showing an inner structure of an input/output data buffer block of FIG. 2.

An input/output buffer block comprises 128 input/output data buffers 3-0 to 3-127. That is, in the case of the memory macro as shown in FIG. 2, the memory macro has a storage capacity of, for example, 4 Mbit of 2048 (row)×2048 (column). One memory array block has a storage capacity of 1 M bit of 512 (row)×2048 (column) and one memory cell array has a storage capacity of 256 kbit of 256(row)×1024 (column).

Since one DQ line pair is provided for 16 columns (16 bit line pairs) in each memory cell array, 128 DQ line pairs are necessary for 2048 columns.

Accordingly, in the case of such a structure on which 128 bit data I/O 0 to I/O 127 can simultaneously be read or written, it is natural that 128 input/output data buffers are necessary. The input/output data buffers 3-0 to 3-127 are controlled by a read activating signal RDEN which is activated in a read operation and a write activating signal WTEN which is activated in a read operation.

Figure 11:
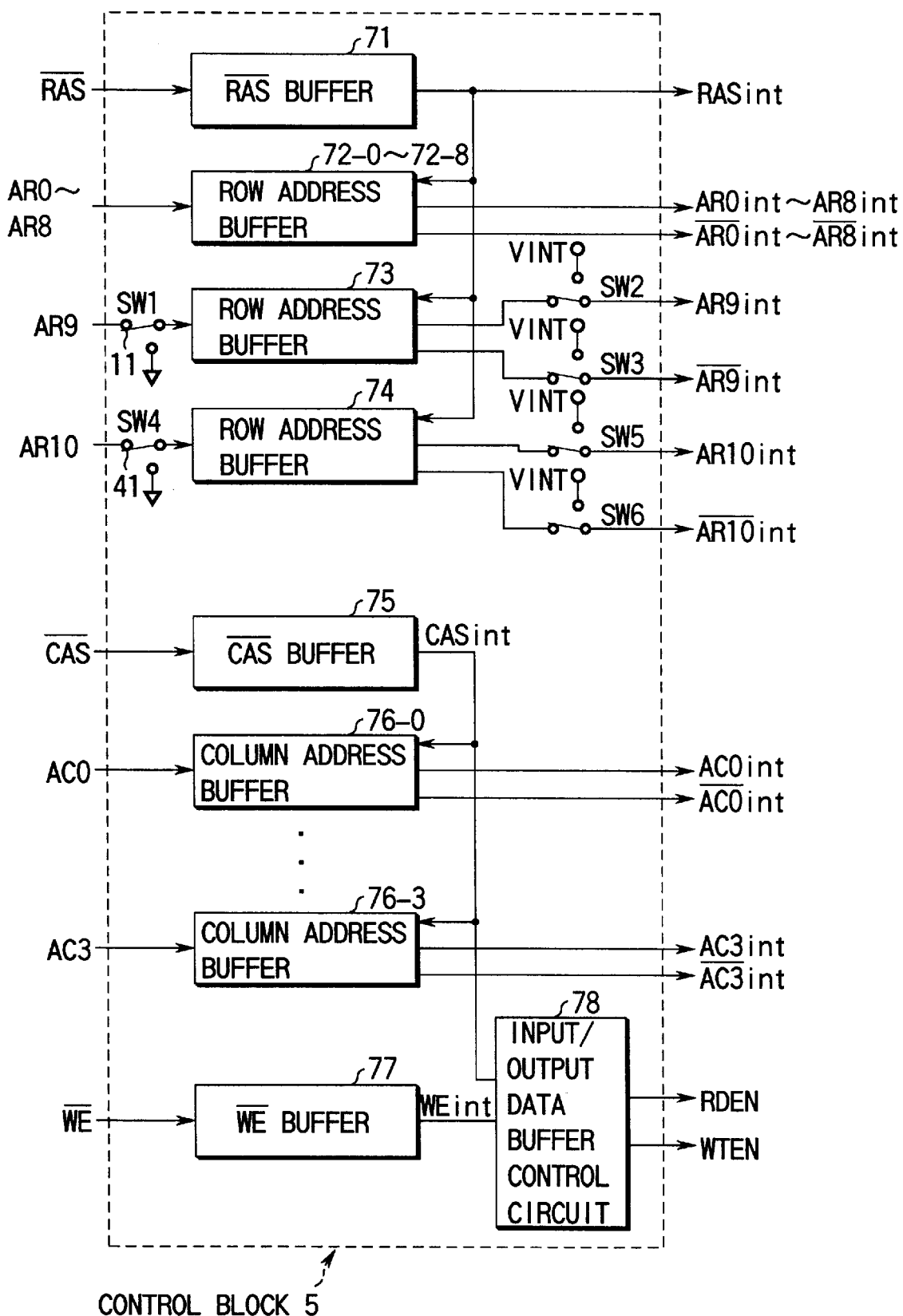
FIG. 11 is a diagram showing an inner structure of a control block of FIG. 2.

FIG. 11 is a diagram showing an inner structure of a control block of FIG. 2.

A control block 5 comprises: a /RAS buffer 71, a row address buffers 72-0 to 72-8, 73, 74, a /CAS buffer 75, column address buffers 76-0 to 76-3, a /WE buffer 77 and an input/output data buffer control circuit 78.

The /RAS buffer 71 generates a row address strobe signal RASint which used in the interior of a memory macro based on a row address strobe signal /RAS supplied from the outside of the memory macro.

The row address buffers 72-0 to 72-8 take row address signals (external row address signals) AR0 to AR8 into the interior of the memory macro in synchronization with the row address strobe signal RASint and generate internal row address signals AR0int to AR8int, /AR0int to /AR8int. The internal row address signals AR0int to AR8int, /AR0int to /AR8int are supplied to row decoders to select one row of 512 rows in a selected memory array block.

The row address buffers 73, 74, take row address signals (external row address signals) AR9, AR10 into the interior of the memory macro in synchronization with the row address strobe signal RASint and generate internal row address signals AR9int to AR10int, /AR9int to /AR10int. The internal row address signals AR9int to AR10int, /AR9int to /AR10int select one memory array block of a plurality (for example 4) of memory array blocks.

The number of the row address signals (block selecting row address signals) to select a memory array block are varied according to the different number of memory array blocks in the memory macro. The number M of memory array blocks in the memory macro and the number m of block selecting row address signals have a relation therebetween of $M \leq 2^m$.

Since the maximum number of memory array blocks which can be provided in this embodiment is set as 4, the block selecting row address signals are composed of two signals of AR9 and AR10. When one memory array block is employed, since the block selecting address signals AR9 and AR10 are fixed at a predetermined value (herein GND), it is only required to change over SW1 and SW4 so as to be connected to connection points 91, 92.

What is important at this point, the control block 5 is designed in advance so as to correspond to the maximal value of the variable number (storage capacity) of memory array blocks. That is, when the maximal number of memory array blocks which can be arranged in the memory macro is indicated by Lmax, the number n of block selecting row address signals (external row address signals) to select a memory array block is set so as to assume a value equal to or more than $\log_2 Lmax$.

When the maximum number of the memory array blocks are employed, (that is, a storage capacity of the memory macro is maximized), the switches SW1 to SW6 are changed over so as to utilize all the block selecting row address signals.

When two memory array blocks are employed, for example, one block selecting row address signal (an external row address signal AR9) is used as internal row address signals AR 9int, /AR9int and the other block selecting row address signal (an external row address signal AR10) is cut off and the switches SW1 to SW6 are changed over so that the internal row address signals AR10int, /AR10int are both fixed at a predetermined value(for example a power source potential VINT).

Figure 12:
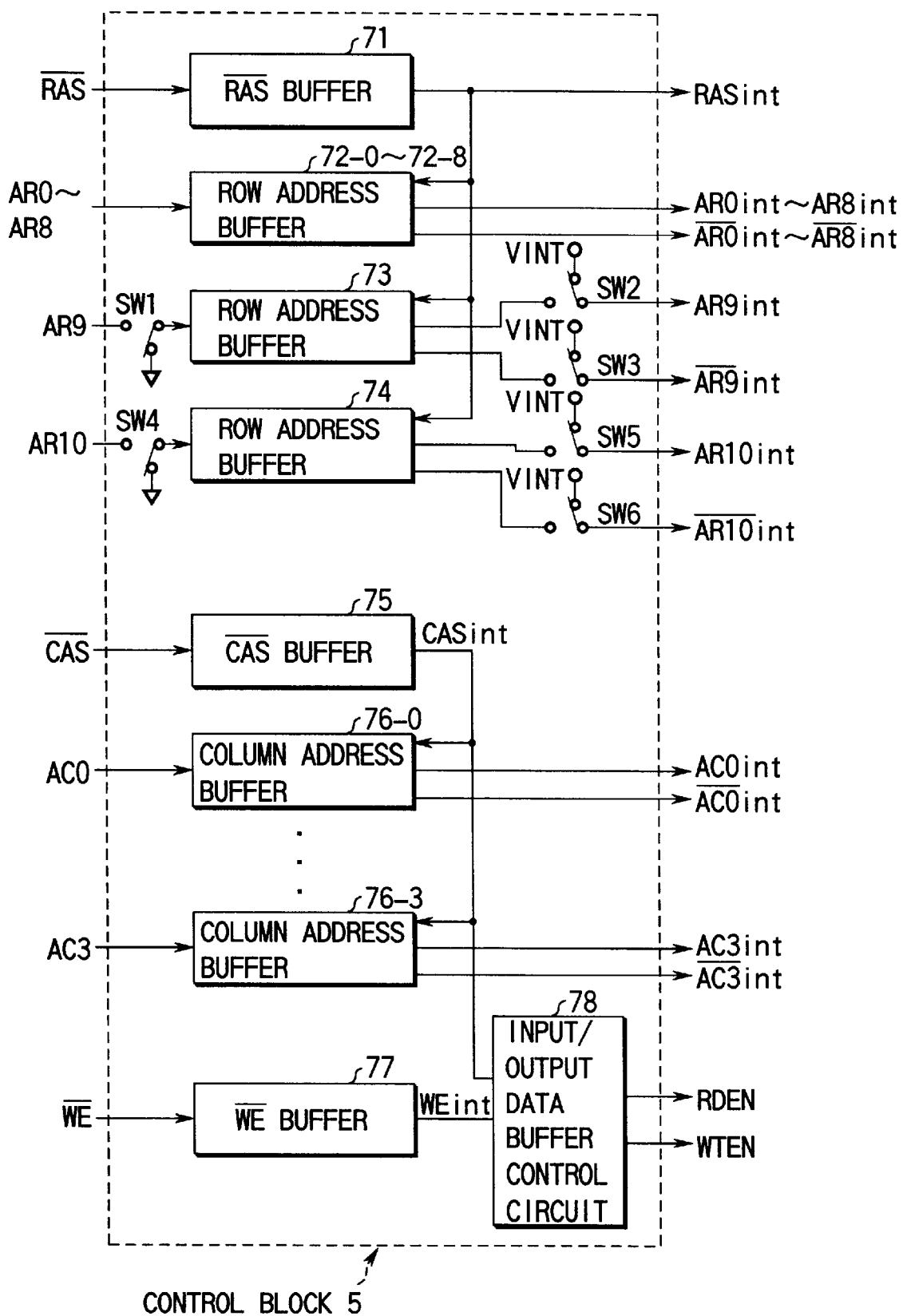
FIG. 12 is a diagram showing an inner structure of a control block of FIG. 2.

When only one memory array block is employed, as shown FIG. 12, the switches SW1, SW4 are changed over to the GND side to cut off all the block selecting row address signals (the external row address signals AR9. AR10) and the switches SW2, SW3, SW5, SW6 are changed over so that the internal row address signals AR9int, /AR9int, AR10int, /AR10int are all fixed at a predetermined value (for example a power source potential VINT).

That is, for example, when one memory array block is employed, if inputs of row address buffers 73, 74 are grounded, the row address buffers 73, 74 are always in an inactive condition. On the other hand, if block selecting row address signals AR9int, AR10int, /AR9int, /AR10int are fixed at a power source VINT, the memory array block is always in a select condition.

If the switches SW1 to SW6 are changed over as in the above mentioned manner, a corresponding relation between the external address signals AR9, AR10 and the internal address signals AR9int, AR10int, /AR9int, /AR10int can be coincided with address allocation of the memory array block. That is, the desired number of row address buffers 73, 74 are activated and thereby the corresponding relation between the external address signals AR9, AR10 and the internal address signals AR9int, AR10int, /AR9int, /AR10int can be coincided with address allocation of the memory array block.

While the switches SW1 to SW6 may electrically be changed over, the change over can practically be effected only by CAD processing and the change over is impossible as a product or after a sample is completed. In other words, if a storage capacity of a memory macro (the number of memory array blocks) is determined in a design stage, connecting relations for the switches SW1 to SW6 can be determined.

The switches SW1 to SW6 are constructed from a metal layer 80a or a contact layer 80b arranged as shown in FIGS. 13A, 13B, 13C, and 13D.

For example, when line A and line B formed on surfaces with the same height is connected, the metal layer 80a which connects the lines A and B is only required to be arranged by CAD as shown in a frame I enclosed by broken lines of FIGS. 13A, 13B. Likewise, when line B and line C (power source line) formed on surfaces with the same height is connected, the metal layer 80a which connects the lines B and C (power source line) is only required to be arranged by CAD as shown in a frame I enclosed by broken lines of FIGS. 13C, 13D.

On the other hand, when line A and line B made in a multilayer structure, a contact layer 80b connecting the lines A and B is arranged by CAD as shown in a frame II enclosed by broken lines of FIGS. 13A, 13B. In addition, when connection with lines B, C (power source line) formed in a multilayer structure is required, all that is necessary to do is that a contact layer 80b which connects the lines B, C therebetween is arranged by CAD as shown in frames enclosed by broken lines of FIGS. 13C, 13D.

After the metal layers 80a, 80b are completed in an actual wafer process, change-over of the switches SW1 to SW6 cannot be effected any longer.

The reason why such switches SW1 to SW6 are provided is that design of a memory macro is easy to be performed. That is, with such switches in use, a control block is not required to repeat its design process according to different specifications of the memory macro (the number of rows, the number of columns, the number of I/Os, a storage capacity etc.) and as shown in FIG. 13, only if a pattern of a metal layer or contact layer is changed by CAD processing for a control block which has been designed, the control block can be obtained in conformity with the specification of the memory macro.

/CAS buffer 75 generates a column address strobe signal CASint which is used in the interior of the memory macro based on a column address strobe signal /CAS which is supplied from the outside of the memory macro.

Column address buffers 76-0 to 76-3 take column address signals AC0 to AC3 into the interior of the memory macro in synchronization with a column address strobe signal CASint and generate internal row address signals AC0int to AC3int, /AC0int to /AC3int. The internal row address signals AC0int to AC3int, /AC0int to /AC3int are supplied to a column decoder and one column of 16 columns connected to one DQ line pair is selected.

A /WE buffer 77 generates a write signal WEint used in the interior of the memory macro based on a write signal /WE supplied from the outside of the memory macro. An input/output data buffer control circuit 78 generates read activating signal RDEN and a write activating signal WTEN which is supplied to the input/output data buffer block 3 of FIG. 10 based on the column address strobe signal CASint and the write signal WEint.

Figure 14:
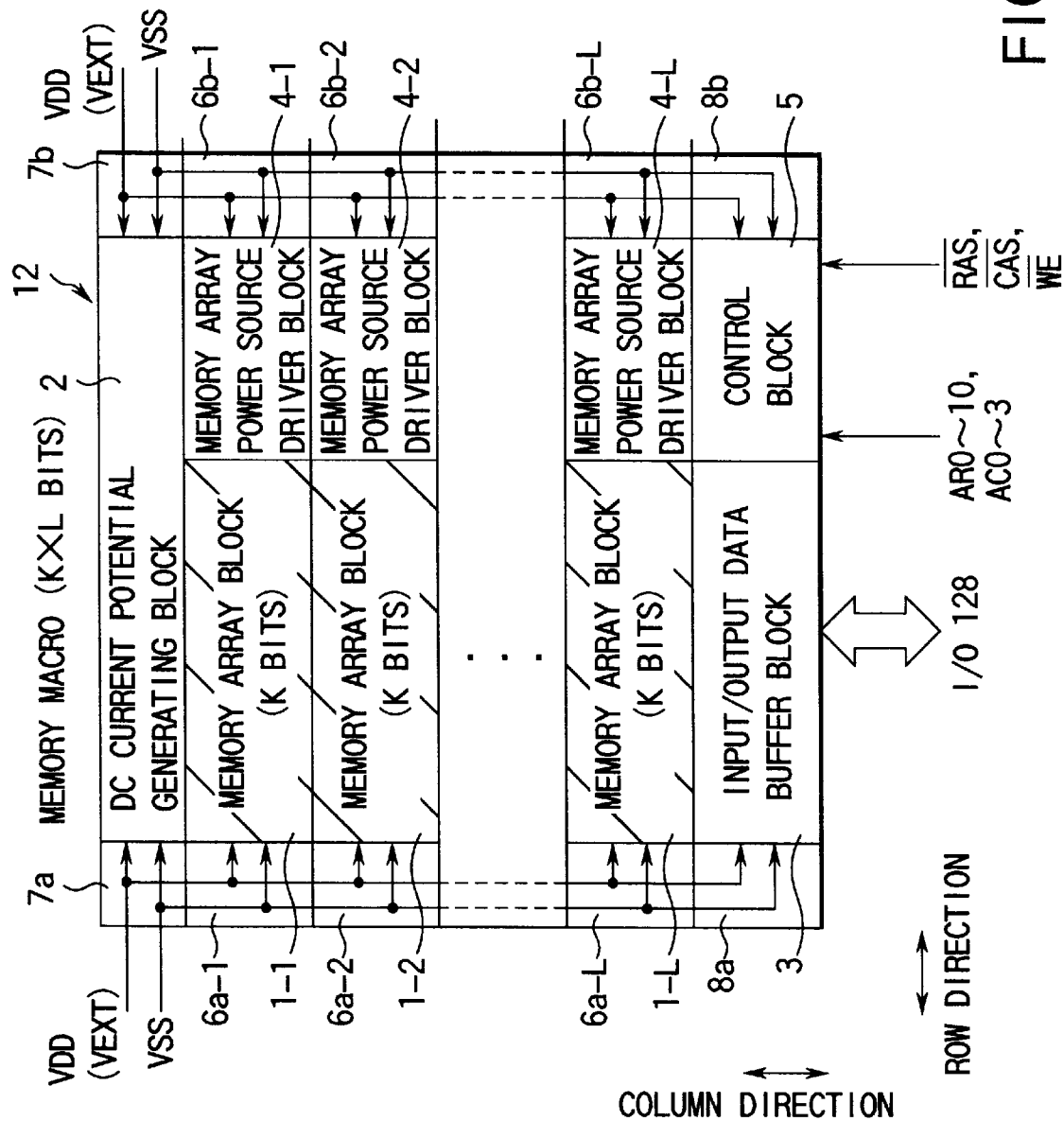
FIG. 14 is a representation showing an inner structure of the power source line block of FIG. 2.

FIG. 14 shows structures of, especially, power source line blocks 6a-1, to 6a-L, 6b-1 to 6b-L a of the memory macro 12 of FIG. 12 in a detailed manner.

Source line blocks 6a-1 to 6a-L, 7a, 8a comprises: a first main power source line which extends from an end of a memory macro 12 in a column direction; a plurality of first subpower source lines to supply power sources VDD, VSS to memory array blocks 1-1 to 1-L, a direct potential generating block 2 and an input/output buffer block 3 from the first main power source; a second main power source line which extends from the other end of the memory column 12 in a column direction; and a plurality of second subpower source lines to supply the power sources VDD, VSS to memory array power source driver blocks 4-1 to 4-L, the direct potential generating block 2 and a control block 5 from the second main power source line 2.

Figure 15:
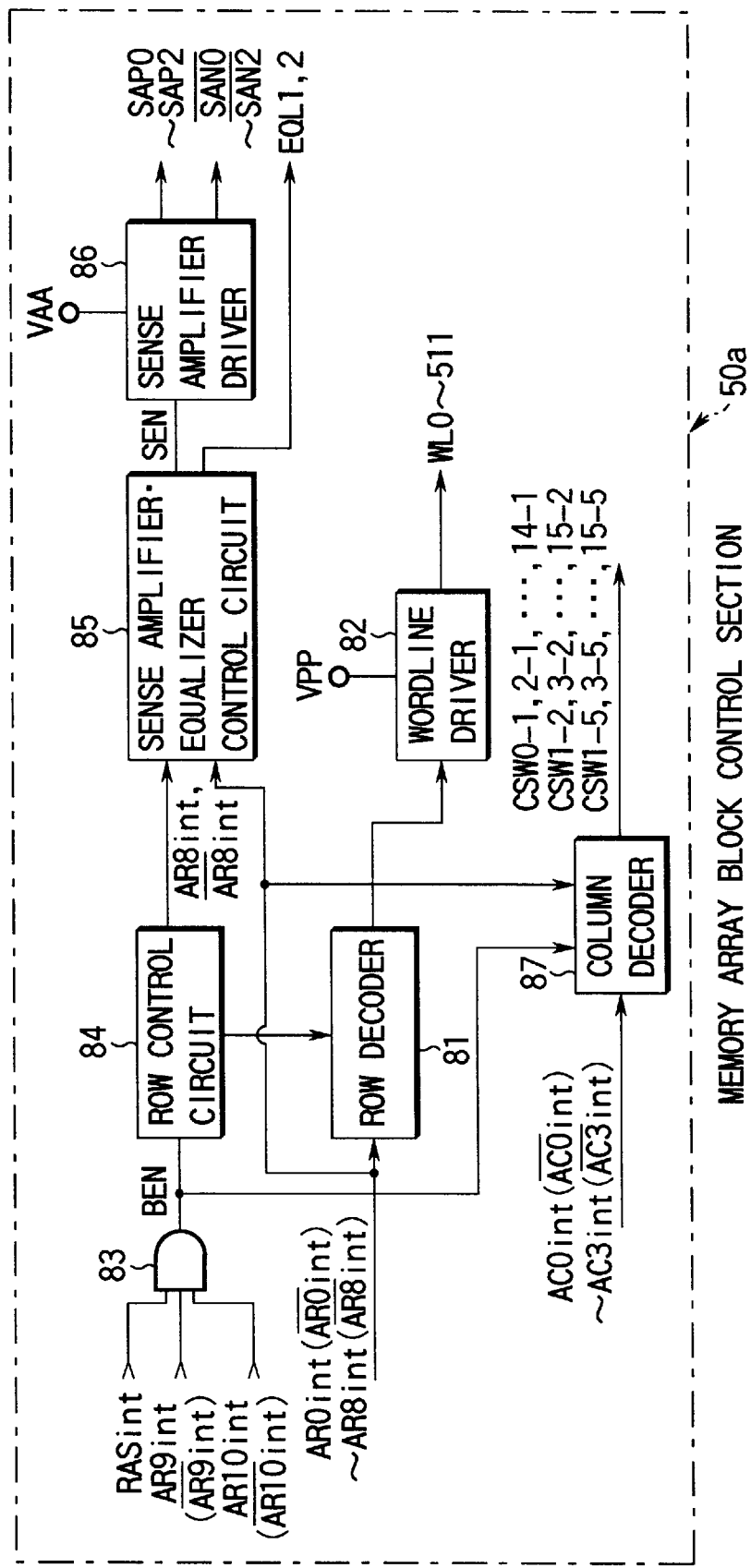
FIG. 15 is a representation showing an inner structure of the memory array block control section of FIGS. 3 and 4.

FIG. 15 shows a structure of the memory array block control section 50a of FIGS. 3, 4.

When a storage capacity of a memory array block 6a-1 is 1 Mbit, since, for example, the memory array block has a structure of 512 (row)×1024 (column), a word line in the memory array block 6a-1 is selected by the low order 9 bits AR0int to AR8int, /AR0int to /AR8int of a row address signal.

The low order 9 bits AR0int to AR8int, /AR0int to /AR8int of a row address signal are supplied to a row decoder 81 from a control block 5 of FIG. 11 or FIG. 12. An output of the row decoder 81 is supplied to a word line driver 82. The word line driver 82 supplies a predetermined potential to one word line selected by the internal row address signals AR0int to AR8int, /AR0int to /AR8int.

The high order 2 bits AR9int, AR10int, /AR9int, /AR10int of the internal row address signals are used to select one block when the memory macro is constructed from a plurality of memory array blocks.

The internal row address signals AR9int, AR10int, /AR9int, /AR10int for block selection internal row address signals are input to an AND circuit 83 together with an internal row address strobe signal RASint. An output of the AND circuit 83 is transformed into a memory array block activating signal BEN and a row control circuit 84 is activated by the memory array block activating signal BEN.

An output of the row control circuit 84 is supplied to a sense amplifier/equalizer control circuit 85. The sense amplifier/equalizer control circuit 85 outputs an equalizer control signal EQL 1, 2 to determine timing of equalization of a bit line pair. The sense amplifier/equalizer control circuit 85 supplies a sense amplifier control signal SEN to a sense amplifier driver 86. The sense amplifier driver 86 outputs sense amplifier activating control signal SAP0 to SAP2 to determine timing activation of a sense amplifier.

A column decoder 87 is input with a memory array block activating signal BEN which indicates whether or not a block is selected, internal row address signals AR0int to AR8int, /AR0int to /AR8int and internal column address signals AC0int to AC3int, /AC0int to /AC3int. The column decoder 87 controls activation of column selecting signals CSW0-1, 2-1, . . . 14-1, CSW1-2, 3-2, . . . 15-2, CSW1-5, 3-5, . . . 15-5.

For example, when the internal row address signal AR8int is "H" and the internal row address signal /AR8int is "L", activation of the column selecting signals CSW0-1, 2-1, . . . 14-1, CSW1-5, 3-5, . . . 15-5 is controlled by the internal column address signals AC0int to AC3int, /AC0int to /AC3int.

Figure 16:
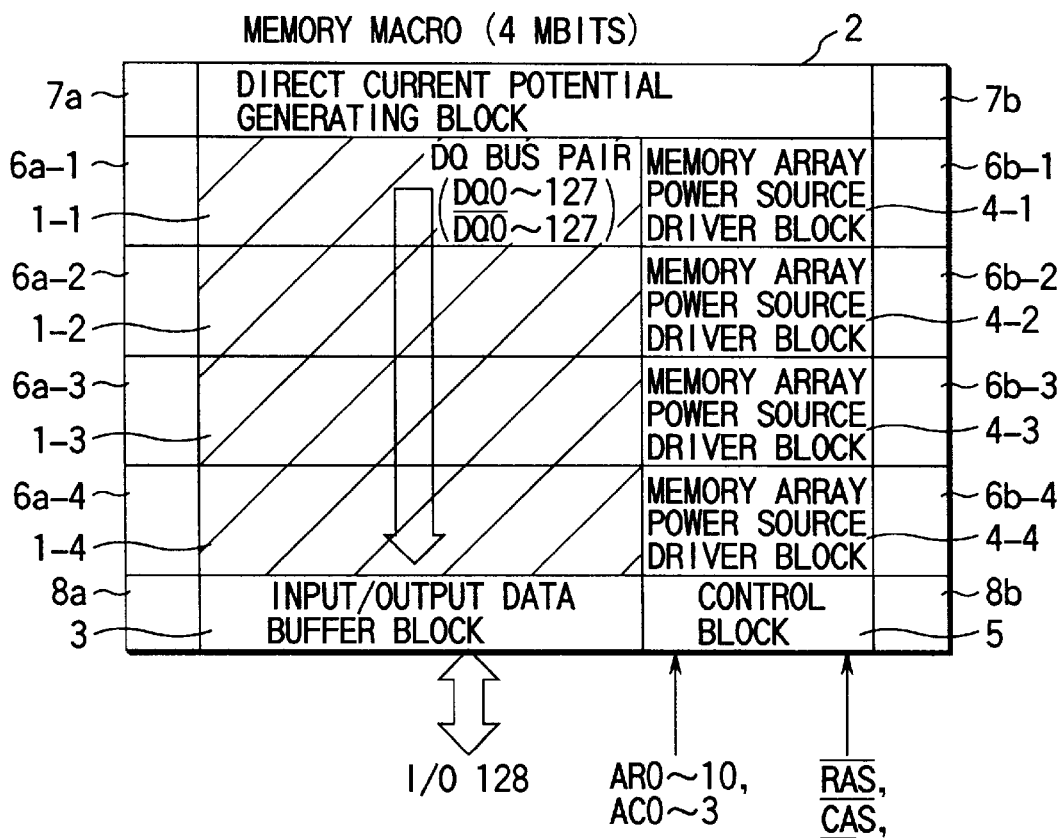
FIG. 16 is a representation showing a floor plan of a 4 Mbit memory macro.
Figure 17:
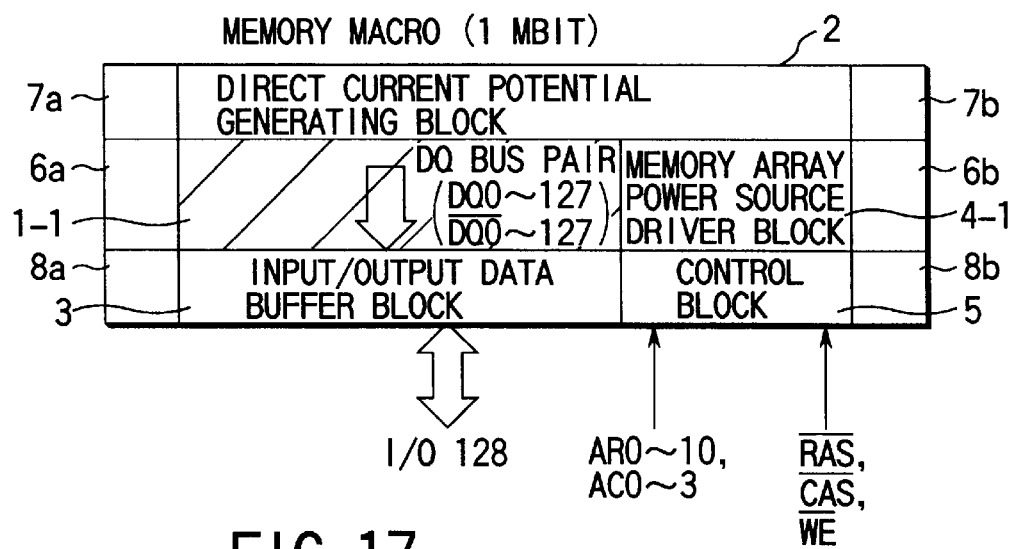
FIG. 17 is a representation showing a floor plan of a 1 Mbit memory macro.

FIG. 16 shows a memory macro comprising four memory array blocks 6a-1 to 6a-4 and FIG. 17 shows a memory macro comprising only one memory array block 6a.

For these two kinds of memory macro, since all the memory array blocks fundamentally have the same structure, the memory macro of FIG. 16 has a storage capacity 4 times as large as that of the memory macro of FIG. 17. In other words, a simple combination of L memory array blocks having a storage capacity K bits can provide a memory macro having a storage capacity of K×L bits.

However, when a bit line sharing scheme is employed, a first one memory array block (if one memory array block is employed, the one memory array block is considered) has the configuration of column switches as in FIG. 3 and the other memory array blocks have a configuration of sense amplifier/column switches as in FIG. 4. If a bank structure is adopted, each memory array block assumes the structure of FIG. 3.

Even if memory macros have different storage capacities, those memory macros can be designed with ease by combining blocks which have been designed in advance. In the present invention, the number of block selecting row address signals can be adjusted in accordance to a storage capacity of a memory macro only if switches are changed over in a control block 5 by CAD processing in a design stage.

FIG. 18 shows a flow chart for designing a memory macro.

First of all, a block which is a fundamental element to construct a memory macro is designed. The block which is designed herein comprises: a direct current potential generating block, a memory array block (K-bits), an input/output data buffer block, a memory array power source driver block, a control block and a power source line block. In design of a control block, as mentioned above, the number of address buffers to which block selecting row address signals are supplied is determined based on the maximal storage capacity of the memory macro.

Then, a specification of the memory macro which is intended to be designed are confirmed: a storage capacity, the number of rows, the number of columns, the number of I/Os etc. That is, with respect to the storage capacity, the number of rows, the number of columns and the number of I/Os, for example, it is examined whether or not a formula of a storage capacity=the number of rows×the number of columns×the number of I/Os is satisfied and it is confirmed that the formula is satisfied. If the satisfaction of the formula is confirmed, the storage capacity, the number of rows, the number of columns, the number of I/Os etc. determined in the specification are input. Then,.the number of memory array blocks L=(N/K) is calculated based on the storage capacity (or the number of rows and the number of columns) N of the memory macro and the storage capacity K of the memory array block. After the number L of memory array blocks is determined, the memory macro is designed by automatically combining blocks in CAD processing. Simultaneously, change-over of switches for block addressing in the control block is automatically processed in CAD processing based on the number L of memory array blocks.

The design of a memory macro is completed by executing the above mentioned procedures. Thereafter, a logic section constructed from a gate array or a standard array and the memory macro are combined and design of a memory integrated with a logic is thus completed.

According to such a design method, if a storage capacity (or the number of rows and the number of columns) of a memory macro is determined, with application of CAD processing blocks are automatically combined and the memory macro is thereby designed. At the same time, change-over of switches for block addressing in a control block is automatically performed by the CAD processing based on the number L of memory array blocks. Therefore, a memory macro with a small area overhead can be provided in a short design time.

Figure 19:
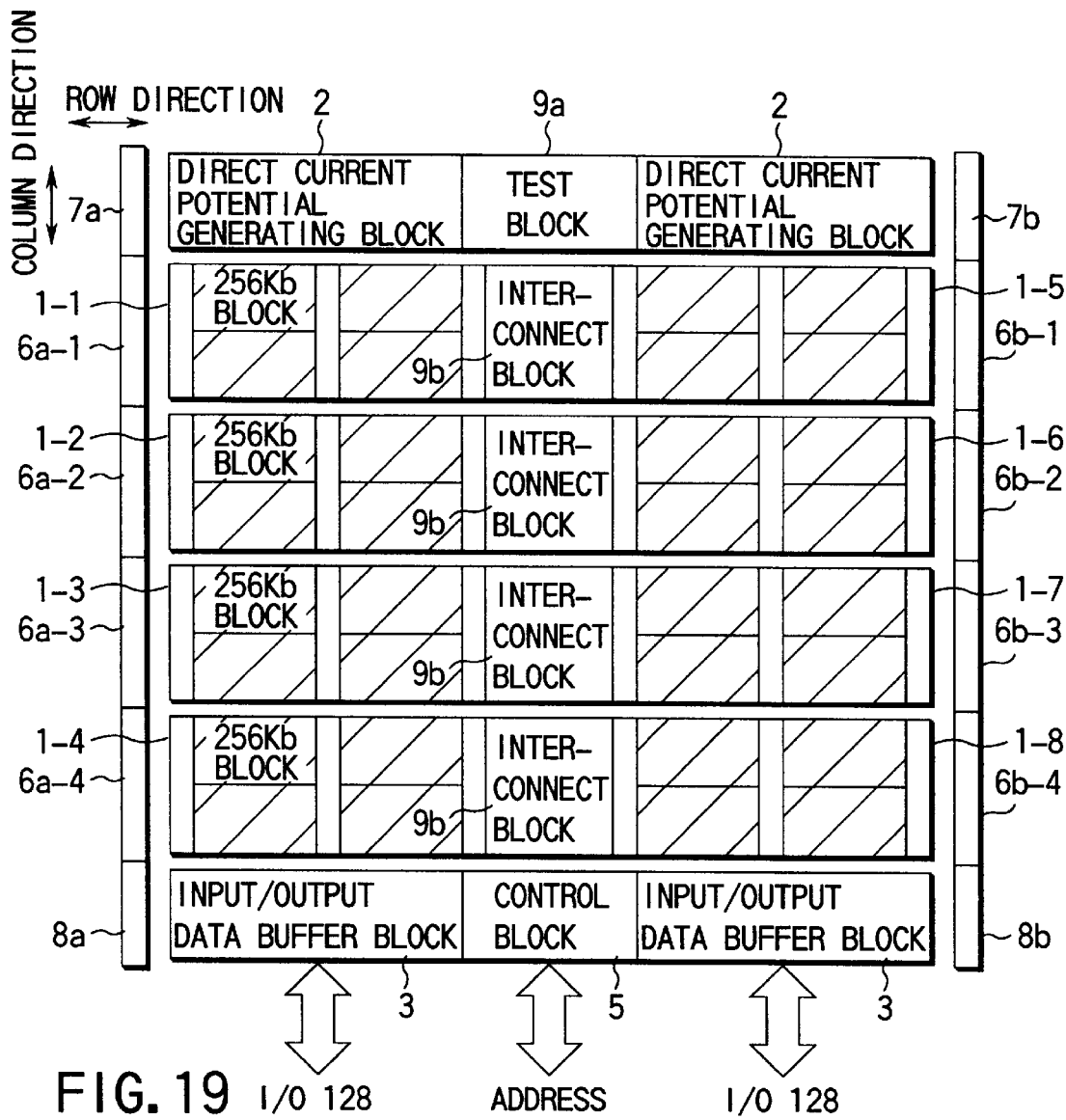
FIG. 19 is a representation showing a floor plan of a memory macro of a second embodiment of the present invention.
Figure 20:
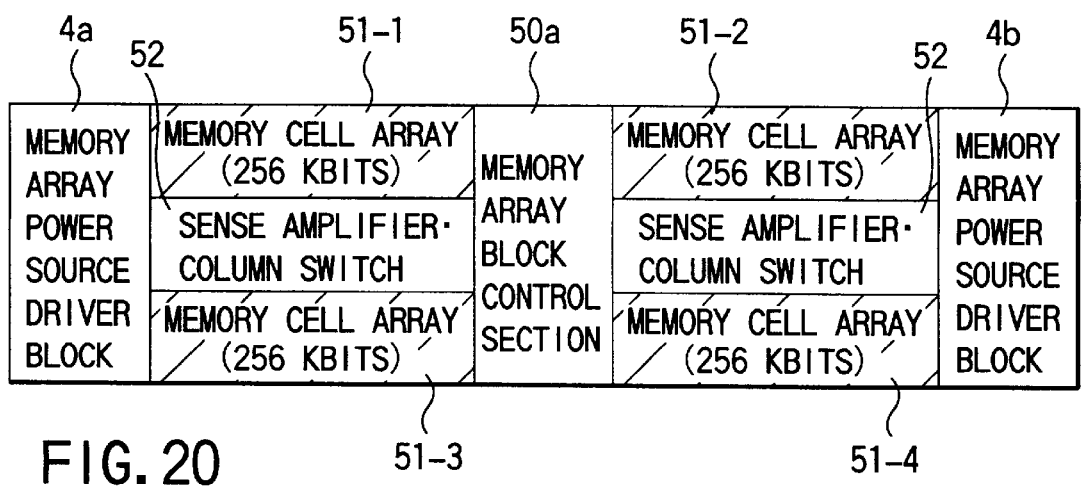
FIG. 20 is a representation showing a floor plan of the memory macro of FIG. 19.

FIG. 19 shows a floor plan of a memory macro pertaining to a second embodiment of the present invention. FIG. 20 shows a detailed floor plan of the memory array block 1-1 of FIG. 19.

The memory macro is integrated with a logic section in the chip 10 shown in FIG. 1 as in the above mentioned first embodiment and comprises an 8 Mbit×4 bank structure.

The memory macro comprises: 8 memory array blocks 1-1, 1-2, . . . 1-8, a direct current potential generating block 2, an input/output data buffer block 3, memory array power source driver blocks 4a, 4b, a control block 5, power source line blocks 6a-1, 6a-2, . . . 6a-4, 6b-1, 6b-2, . . . 6b-4, 7a, 7b, 8a, 8b, a test block 9a and an interconnect block 9b.

A storage capacity of the memory macro is determined by the number of memory array blocks. In this example, since a storage capacity of one memory array block 1-1 is, for example, 1 Mbit, the memory macro storage capacity in this case amounts to 8 Mbit since the number of memory array blocks is 8.

It is the same as the first embodiment that a storage capacity of one memory array block 1-1 is the minimal unit of a storage capacity of a memory macro in a design stage. That is, a storage capacity of a memory macro can freely be variable, for example with 1 Mbit as a unit.

The memory array blocks 1-1, 1-2, . . . 1-4 are arranged in an adjacent manner to one another along a column direction (along an extending direction of a column line).

The memory array blocks 1-1, 1-12, . . . 1-4 are provided with, for example, 128 DQ line pairs which extend along a column direction. DQ line pairs on memory array blocks are connected to each other by disposing the memory array blocks 1-1, 1-2, . . . 1-4 in an adjacent manner to one another.

Likewise, the memory array blocks 1-5, 1-6, . . . 1-8 are arranged in an adjacent manner to one another in a column direction. The memory array blocks 1-5, 1-6, . . . 1-8 are provided with, for example, 128 DQ line pairs which extend along a column direction and DQ line pairs of memory array blocks are connected to each other by disposing the memory array blocks 1-5, 1-6, . . . 1-8 in an adjacent manner to one another.

In the direct current potential generating block 2, circuits which produce constant potentials such as a substrate potential VBB, a word line potential VPP, a bit line potential VBL, a reference potential for a sense amplifier power source driver VPPA, a peripheral circuit power source potential VINT etc. are formed. The direct current potential generating block 2 is arranged at an end of the memory array blocks 1-1, 1-2, . . . 1-8 in a column direction.

The input/output buffer block 3 is arranged at the other end of the memory array blocks 1-1, 1-2, . . . 1-8 in a column direction. DQ line pairs of the memory array blocks 1-1, 1-2, . . . 1-8 are connected to the input/output buffer block 3. The direct potential generating block 2 and the input/output data buffer block 3 are arranged in opposed positions with the memory array blocks 1-1, 1-2, . . . 1-8 sandwiched therebetween.

The memory array power source driver block 4a, 4b are arranged adjacent to the memory array blocks 1-1, 1-2, . . . 1-8. The memory array power source driver block 4a, 4b comprises a driver (transistor) for supplying a sense amplifier power source to a sense amplifier.

The control block 5 comprises: buffers such as external row address signals AR0 to AR10, external column address signals AC0 to AC3, an external row address strobe signal /RAS, external column address strobe signal /external CAS and a write signal /external WE; and switches which can change over on whether or not part of the external row address signals AR0 to AR10 is used according to a storage capacity (the number of memory array blocks) of the memory macro. The switches can be changed over with freedom according to connecting ways of a metal layer (interconnect layer) or a contact layer and while such change-over can freely performed in a design stage, no change-over is possible after a sample is completed.

The power source line blocks 6a-1, 6a-2, . . . 6a-4, 6b-1, 6b-2, . . . 6b-4, 7a, 7b, 8a, 8b are respectively arranged at ends of the memory array blocks 1-1, 1-2, . . . 1-8 in a row direction.

A memory array block control section 50a comprises a row decoder, a column decoder, a row control circuit, etc. Memory cell arrays 51-1, 51-2 and 51-1, 51-2 are, respectively, arranged at one end and the other end of the memory array block control section 50a in a row direction. Specifically, a memory array block 1-1a is arranged at one side of the memory array block control section 50a and comprises the memory cell arrays 51-1 and 51-2. Similarly, a memory array block 1-1b is arranged at the other side of the memory array block control section 50a and comprises the memory cell arrays 51-1 and 51-2.
Kokokara7/10

In the memory array block 1-1a, the memory cell arrays 51-1, 51-2 are located in an adjacent relation to each other in a column direction. A sense amplifier (including a column switch) 52-1 is arranged between one end of the memory cell array 51-1 and one end of the memory cell array 51-2 Likewise, in the memory array block 1-1b, the memory cell arrays 51-1, 51-2 are located in an adjacent relation to each other in the column direction. A sense amplifier (including a column switch) 52-1 is arranged between one end of the memory cell array 51-1 and one end of the memory cell array 51-2. The floor plans of the other memory array blocks 1-2, . . . 1-8 are similar to that of the memory array blocks 1-1, and thus the explanation thereof is omitted.

According to the above mentioned floor plan of a memory macro, since memory array blocks can properly be arranged in a short time, even if a storage capacity is increased (the number of memory array blocks is increased), whereby a design in which not only is an area overhead reduced, but a short TAT (turnaround time) in design can also be realized.

In the above mentioned embodiment, the number of row addresses (or the number of rows) and the number of column addresses (or the number of columns) can freely be changed without a great increase in design turnaround time under a condition that a storage capacity of a memory macro is constant. The reason why is that, for example, even if the number of row addresses is changed in a design stage, structures of the row address buffer and the row address decoder are unchanged (redesign is unnecessary) and only changeover of a switch which determines whether or not part of an internal row address signal is fixed is only required to be effected.

In this case, since the storage capacity of a memory macro is constant, the number of row addresses and the number of column addresses are in inverse proportion to each other. That is, if the number of row addresses is decreased, the number of column addresses is increased.

In such a manner, according to the above example, while, if a specification (the number of rows, the number of columns, the number of I/Os, a storage capacity etc.) of a memory integrated with a logic is changed, the number of address signals is changed, there arises no need for redesigning of a circuit such as a /RAS buffer or the like. According to the invention of the present application, since a change of a circuit design accompanying with a change in the number of addresses can automatically be performed by CAD design, a TAT (turnaround time) can be shortened.

Moreover, when a memory is realized according to a specification (the number of rows, the number of column, the number of I/Os, a storage capacity etc.) of a memory integrated with a logic and if a sub memory array block which has manually been designed is incorporated by automatic processing, a change in design requires no manual assistance. When a-design of an input/output data buffer block is changed so as to match with a change of the number of I/Os and if a sub memory array block which has manually been designed in advance is incorporated by CAD processing, the change can automatically be performed in a short time.

Figure 21:
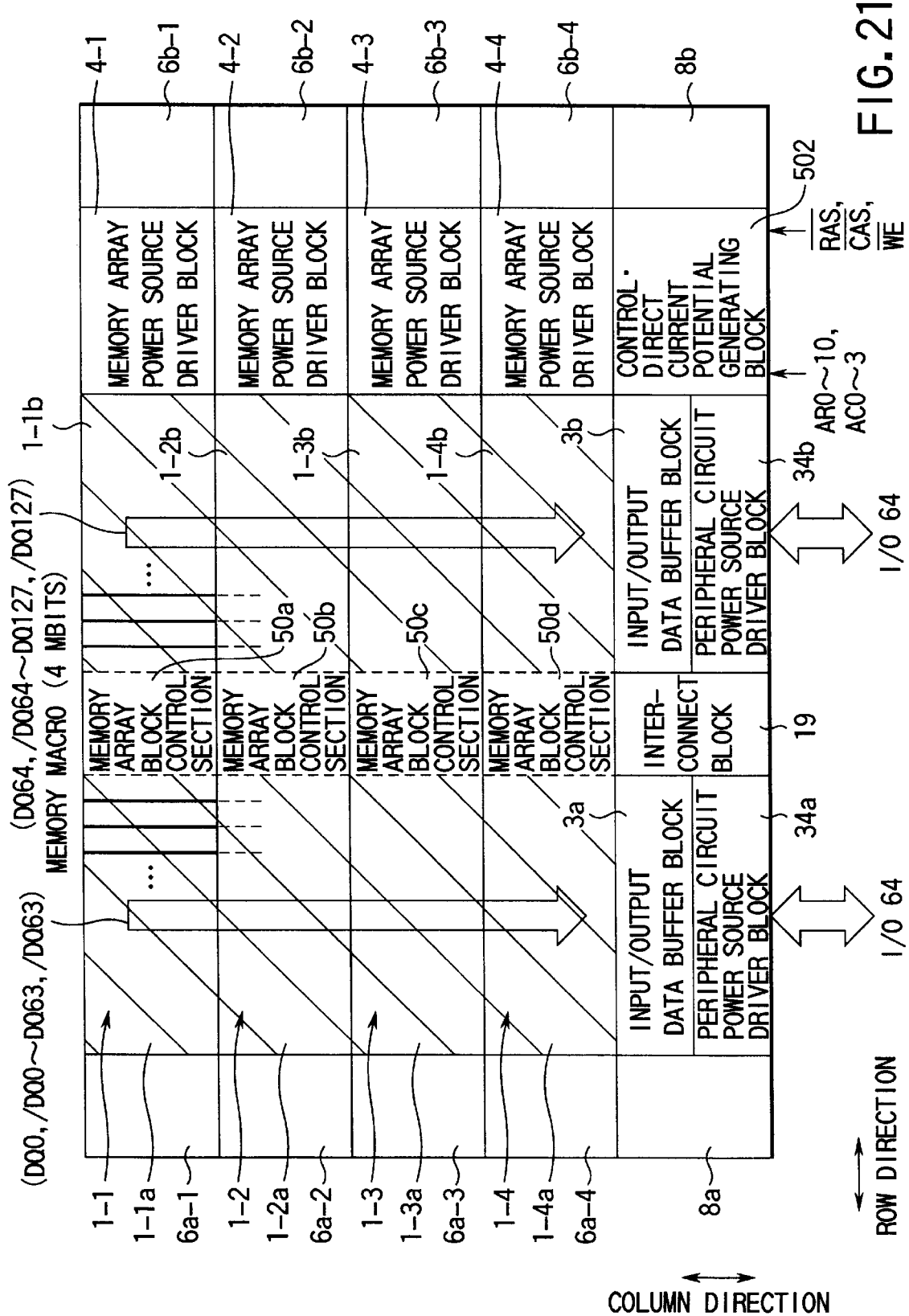
FIG. 21 is a representation showing a floor plan of a 4 Mbit memory macro of a third embodiment of the present invention.

FIG. 21 shows a floor plan of a 4 Mbit macrocell of the third embodiment of the present invention, wherein four 1-Mbit memory array blocks, that is memory array blocks 1-1 to 1-4, are arranged along a column direction. As shown in FIG. 21, memory array block control sections 50a to 50d are arranged in the center of the memory array blocks 1-1 to 1-4 in a column direction as in actual layout. An interconnection block 19 is arranged to be adjacent to the memory array block control section 50d in the column direction. 512-kbit memory array blocks 1-1a to 1-4a are arranged on one side of the memory array block control sections 50a to 50d and another 512-kbit memory array blocks 1-1b to 1-4b are arranged on the other side of the memory array block control sections 50a to 50d in such a manner that the memory array block control sections 50a to 50d are sandwiched therebetween. The memory array block 1-1 comprises the 512-kbit memory array block 1-1a, the memory array block control section 50a, and 512-kbit memory array block 1-1b. The memory array block 1-2 comprises the 512-kbit memory array block 1-2a, the memory array block control section 50b, and 512-kbit memory array block 1-2b. The memory array block 1-3 comprises the 512-kbit memory array block 1-3a, the memory array block control section 50c, and 512-kbit memory array block 1-3b. The memory array block 1-4 comprises the 512-kbit memory array block 1-4a, the memory array block control section 50d, and 512-kbit memory array block 1-4b. An input/output data buffer block 3a and a peripheral circuit power source driver block 34a are arranged on one side of the interconnect block 19 and an input/output data buffer block 3b and a peripheral circuit power source driver block 34b are arranged on the other side in such a manner that the interconnect block 19 is sandwiched therebetween. The input/output data buffer block 3a and the peripheral circuit power source driver block 34a are arranged in the order in the column direction in such a manner that those blocks 3a and 34a are to be adjacent to the memory array block 1-4a. Similarly, the input/output data buffer block 3b and the peripheral circuit power source driver block 34b are arranged in the order in the column direction in such a manner that those blocks 3b and 34b are to be adjacent to the memory array block 1-4b. The input/output data buffer block 3a is arranged in correspondence to DQ line pairs DQ0–DQ63 to /DQ0–/DQ63 which are in common provided to the memory array blocks 1-1 to 1-4. The input/output data buffer block 3b is arranged in correspondence to DQ line pairs DQ64–DQ127 to /DQ64–/DQ127 which are in common provided to the memory array blocks 1-1 to 1-4. While a direct current potential generating circuit 2 is arranged at an end of the memory array block 1-1 in a column direction in an adjacent manner in FIGS. 2, 16, the direct current potential generating circuit 2 is arranged adjacent to the control block as shown in FIG. 21 and formed as a control/direct current generating block 502 in a united manner in this embodiment.

Figure 22:
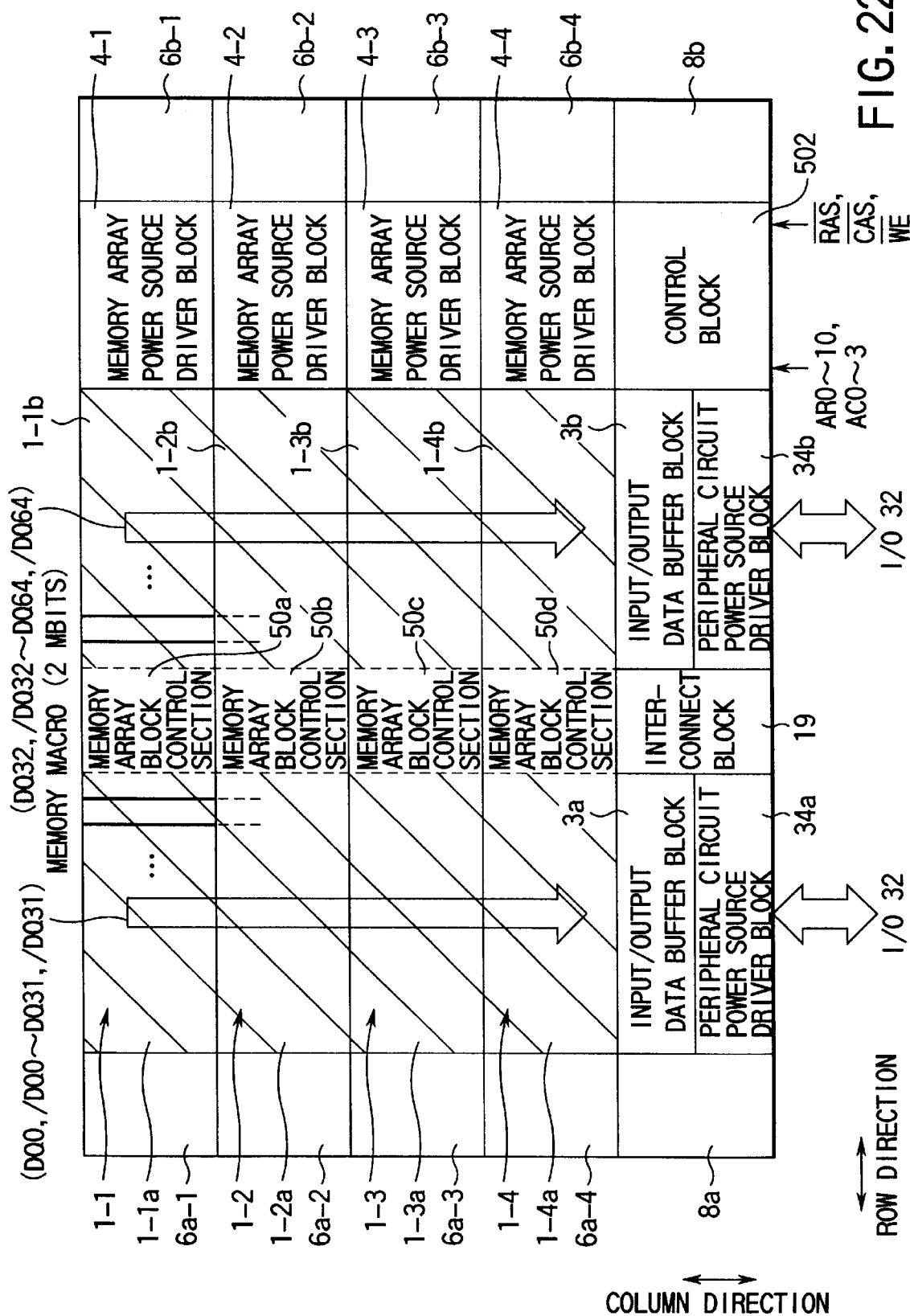
FIG. 22 is a representation showing a floor plan a 2 Mbit memory macro, which is a similar representation to FIG. 21.
Figure 31:
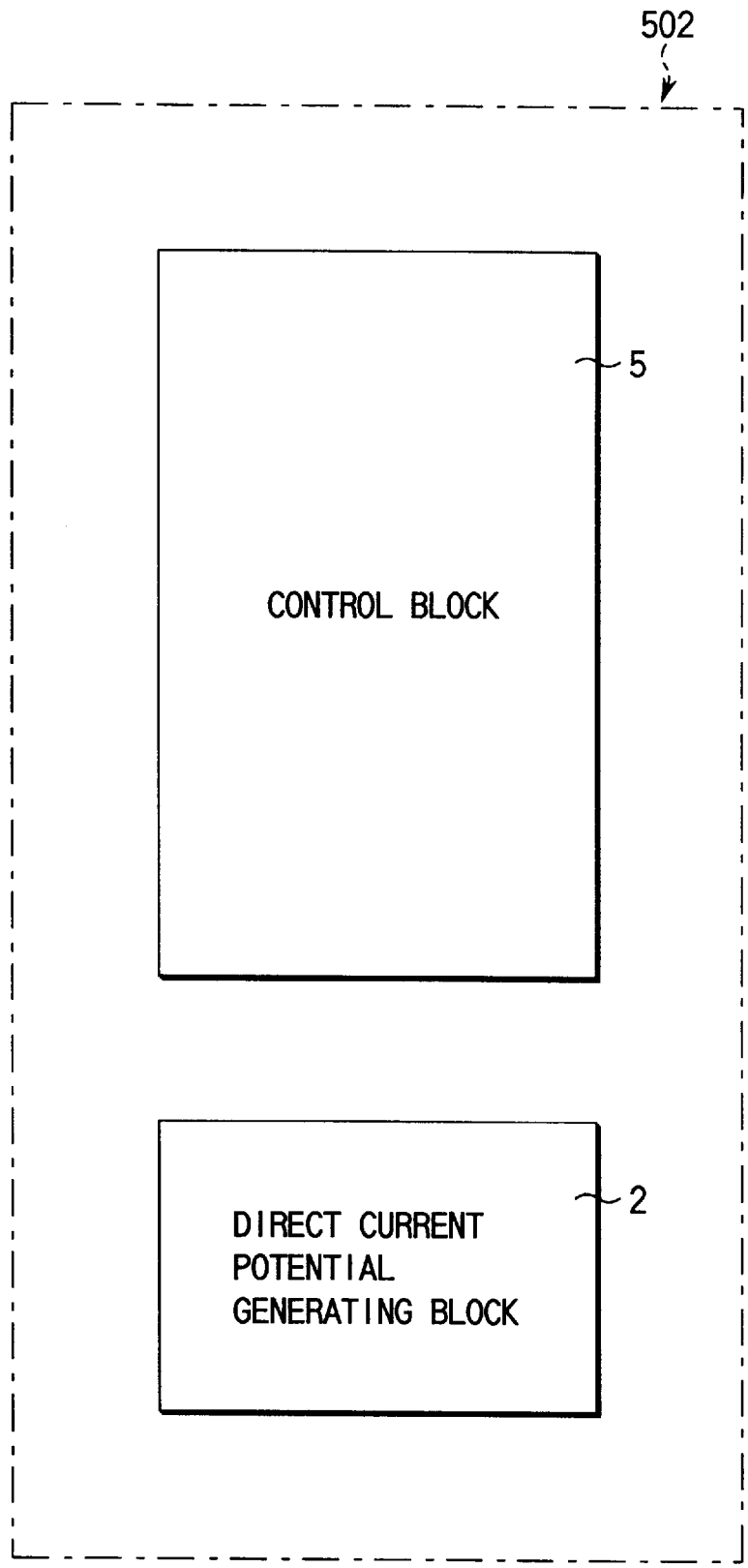
FIG. 31 is a schematic diagram showing an inner structure of the control/direct current potential generating block in the floor plan of the memory of FIGS. 21 and 22.

FIG. 22 shows a floor plan of a 2 Mbit memory macro, wherein four 512-kbit memory array blocks, that is memory array blocks 1-1 to 1-4, are arranged in a column direction. As shown in FIG. 22, memory array block control sections 50a to 50d are arranged in the center of the memory array blocks 1-1 to 1-4 in a column direction as in actual layout. An interconnection block 19 is arranged to be adjacent to the memory array block control section 50d in the column direction. 256-kbit memory array blocks 1-1a to 1-4a are arranged on one side of the memory array block control sections 50a to 50d and another 256-kbit memory array blocks 1-1b to 1-4b are arranged on the other side of the memory array block control sections 50a to 50d in such a manner that the memory array block control sections 50a to 50d are sandwiched therebetween. The memory array block 1-1 comprises the 256-kbit memory array block 1-1a, the memory array block control section 50a, and 256-kbit memory array block 1-1b. The memory array block 1-2 comprises the 256-kbit memory array block 1-2a, the memory array block control section 50b, and 256-kbit memory array block 1-2b. The memory array block 1-3 comprises the 256-kbit memory array block 1-3a, the memory array block control section 50c, and 256-kbit memory array block 1-3b. The memory array block 1-4 comprises the 256-kbit memory array block 1-4a, the memory array block control section 50d, and 256-kbit memory array block 1-4b. An input/output data buffer block 3a and a peripheral circuit power source driver block 34a are arranged on one side of the interconnect block 19 and an input/output data buffer block 3b and a peripheral circuit power source driver block 34b are arranged on the other side in such a manner that the interconnect block 19 is sandwiched therebetween. The input/output data buffer block 3a and the peripheral circuit power source driver block 34a are arranged in the order in the column direction in such a manner that those blocks 3a and 34a are to be adjacent to the memory array block 1-4a. Similarly, the input/output data buffer block 3b and the peripheral circuit power source driver block 34b are arranged in the order in the column direction in such a manner that those blocks 3b and 34b are to be adjacent to the memory array block 1-4b. The input/output data buffer block 3a is arranged in correspondence to DQ line pairs DQ0–DQ31 to /DQ0–/DQ31 which are in common provided to the memory array blocks 1-1 to 1-4. The input/output data buffer block 3b is arranged in correspondence to DQ line pairs DQ32–DQ64 to /DQ32–/DQ64 which are in common provided to the memory array blocks 1-1 to 1-4. While a direct current potential generating circuit 2 is arranged at an end of the memory array block 1-1 in a column direction in an adjacent manner in FIGS. 2, 16, the direct current potential generating circuit 2 is arranged adjacent to the control block as shown in FIG. 31 and formed as a control/direct current generating block 502 in a united manner in this embodiment.

Figure 23:
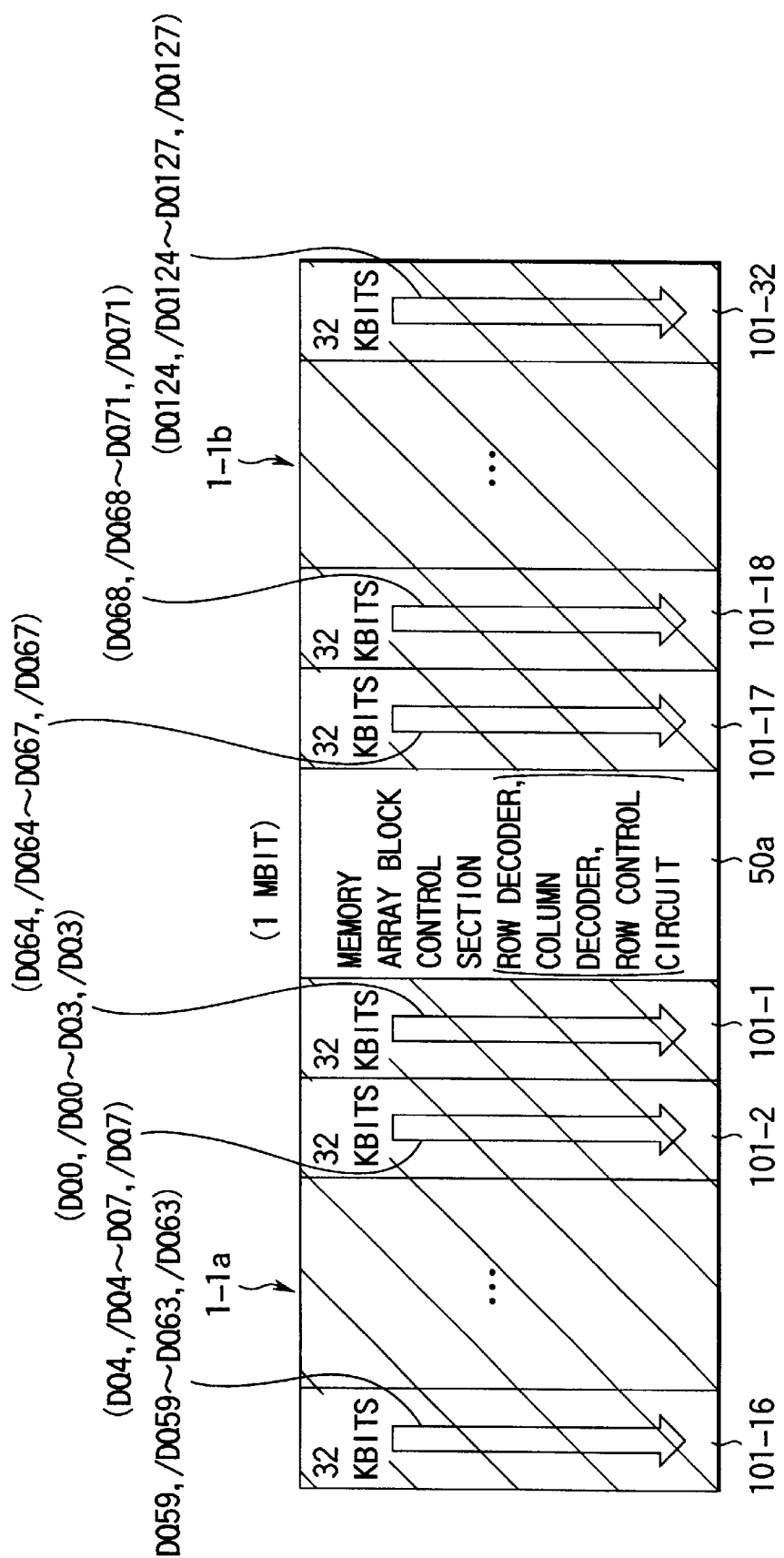
FIG. 23 is a representation showing a floor plan of the memory array block of FIG. 21.

FIG. 23 shows a floor plan of memory array block 1-1a, memory array block control section 50a, and memory array block 1-1b, which constitute the memory array block 1-1 of the macrocell in the floor plan shown in FIG. 21. A memory array power source driver block 4-1 and power source line blocks 6a-1, 6b-1 are not shown in the figure. As shown in FIG. 23, a memory array block control 50a comprises: a row decoder, a column decoder, a row control circuit, etc. as in FIG. 3 in the floor plan of 512-kbit memory array blocks 1-1a, 1-1b. The memory array blocks 1-1a, 1-1b are respectively arranged on the both sides of the memory array block control section 50a in a row direction.

The memory array block 1-1a comprises: sixteen 32-kbit sub memory array blocks 101-1 to 101-16 and the sub memory array blocks 101-1 to 101-16 are arranged along a row direction in an adjacent manner to one another. The memory array block 1-1b also comprises: sixteen 32-kbit sub memory array blocks 101-17 to 101-32 and the sub memory array blocks 101-17 to 101-32 are arranged along a row direction in an adjacent manner to one another.

In each of the 32-kbit sub memory array blocks 101-1 to 101-32, one DQ data line pair is provided for each group of 16 bit line pairs BL, /BL and each of 32-kbit sub memory array blocks 101-1 to 101-32 has 4 DQ line pairs. In other words, each of the 32-kbit sub memory array blocks 101-1, 101-2, ... 101-16 has 4 DQ line pairs DQ0, /DQ0 to DQ3, /DQ3; DQ4, /DQ4 to DQ7, /DQ7; ... DQ59, /DQ59 to DQ63, /DQ63. Therefore, the memory array block 1-1a has 64 DQ line pairs, that is DQ0, /DQ0 to DQ63, /DQ63. Likewise, each of the 32-kbit sub memory array blocks 101-17, 101-18, ... 101-32 has 4 DQ line pairs DQ64, /DQ64 to DQ67, /DQ67; DQ68, /DQ68 to DQ71, /DQ71; ... DQ124, /DQ124 to DQ127, /DQ127. Therefore, the memory array block 1-1b has 32 DQ line pairs, that is DQ64, /DQ64 to DQ127, /DQ127. Accordingly, one Mbit memory array block has 64 DQ line pairs, that is DQ0, /DQ0 to DQ127, /DQ127.

In such a manner, a storage capacity of one sub memory array block is the minimal storage capacity unit of a memory macro in a design stage, that is, a fundamental unit for storage capacity expansion of a memory macro. Therefore, according to this example, a storage capacity of a memory macro can be varied with a storage capacity of the sub memory array block 101-1 as a fundamental unit.

The number p of 32-kbit sub memory array blocks is selected in a proper manner in accordance to a specification of a memory macro and 8×p DQ line pairs can be arranged on a memory array block. In other words, generally, when a bit width of a DQ line pair is indicated by Q and the number of sub memory array blocks is indicated by P, Q×P DQ pairs can be arranged on a memory array block.

Since design of a sub memory array block which determines a fundamental storage capacity unit is dependent on a manual operation, it requires a considerable length of time for design, but once a sub memory array block is designed and registered in a library, design of a sub memory array block defined in a specification of a memory macro is easily realized in a short time in such a manner that a sub memory array block which has been prepared by manual design is retrieved from the library by a CAD operation and then a layout of the sub memory array block is automatically processed.

FIG. 24 shows a memory array block 1-1*a*, a memory array block control section 50*a* and a memory array block 1-1*b*, which constitute the memory array block 1-1 of the floor plan shown in FIG. 22. A memory array power source driver block 4-1, power source line blocks 6*a*-1, 6*b*-1 are not shown in the figure. In a floor plan of 256-kbit memory array blocks 1-1*a*, 1*b*-1, as shown in FIG. 24, the memory array block control section 50 comprises a row decoder, a column decoder, a row control circuit etc. as in FIG. 3. The memory array blocks 1-1*a*, 1-1*b* are arranged on both sides of the memory array block control section 50 in a row direction.

The memory array block 1-1*a* comprises eight 32-kbit sub memory array blocks 101-1 to 101-8 and the sub memory array blocks 101-1 to 101-8 are arranged along a row direction in an adjacent manner to one another. Likewise, in the memory array block 1-1*b* comprises eight 32-kbit sub memory array blocks 101-9 to 101-16 and the sub memory array blocks 101-9 to 101-16 are arranged along a row direction in an adjacent manner to one another.

In each of the 32-kbit sub memory array blocks 101-1 to 101-16, one DQ dataline pair is provided for each group of 16 bit line pairs BL, /BL and each of 32-kbit sub memory array blocks 101-1 to 101-16 has 4 DQ line pairs. In other words, each of the 32-kbit sub memory array blocks 101-1, 101-2, . . . 101-8 has 4 DQ line pairs DQ0, /DQ0 to DQ3, /DQ3; DQ4, /DQ4 to DQ7, /DQ7; . . . DQ28, /DQ28 to DQ 31, /DQ31. Therefore, the memory array block 1-1*a* has 32 DQ line pairs, that is DQ0, /DQ0 to DQ31, /DQ31. Likewise, each of the 32-kbit sub memory array blocks 101-8, 101-9, . . . 101-16 has 4 DQ line pairs DQ32, /DQ32 to DQ35, /DQ35; DQ36, /DQ36 to DQ39, /DQ39; . . . DQ60, /DQ60 to DQ 63, /DQ63. Therefore, the memory array block 1-1*b* has 32 DQ line pairs, that is DQ32, /DQ32 to DQ63, /DQ63. Accordingly, one Mbit memory array block has 64 DQ line pairs, that is DQ0, /DQ0 to DQ63, /DQ63.

FIG. 25 shows a schematic structure of a 32-kbit sub memory array block 101-1 of the memory array block 1-1 shown in FIGS. 23, 24 and two 16-kbit sub memory cell arrays 151-1, 151-2 is arranged along a column direction. A sense amplifier/column switch 152-2 is inserted between adjacent ends of the two 16-kbit sub memory cell array 151-1, 151-2. The sense amplifier/column switch 152-2 inserted between the adjacent ends is shared by the two 16-kbit sub memory cell arrays 151-1, 151-2. Sense amplifier/column switches 152-1, 152-3 are respectively at the other ends of the two 16-kbit sub memory cell arrays 151-1, 151-2 in a column direction.

FIG. 26 is a figure similar to FIG. 25 and shows a schematic structure of a 32-kbit memory array block 102-1 of the memory array block 1-2 of the memory macro of FIGS. 21, 22. The 32-kbit memory array block 102-1 of the memory array block 1-2 is arranged in a column direction in such a manner that the 32-kbit memory array block 102-1 is arranged to be adjacent to the 32-kbit memory array block 101-1 of the memory array block 1-1. In the 32-kbit memory array block 102-1 of the memory array block 1-2, two 16-kbit sub memory cell arrays 151-1, 151-2 are arranged in the column direction. A sense amplifier/column switch 152-1 is inserted between adjacent ends of the two 16-kbit sub memory cell arrays 151-1, 151-2. The sense amplifier/column switch 152-1 inserted between the adjacent ends of the two 16-kbit sub memory cell arrays 151-1, 151-2 is shared by the two 16-kbit sub memory cell arrays 151-1, 151-2. A sense amplifier/column switch 152-2 is arranged at the other end of the two 16-kbit sub memory cell array 151-2 in the column direction. However, in the memory array block 102-1, a sense amplifier/column switch corresponding to the sense amplifier/column switch 152-1 arranged at the other end of the 16-kbit sub memory cell array 151-1 in the 32-kbit memory array block 101-1 (FIG. 25) is not arranged. Instead, a sense amplifier/column switch 152-3 arranged at the other end of the sub memory cell array 151-2 in the memory array block 101-1 (FIG. 25) in the upper row by one row is shared. The sub memory cell array 151-1 of the memory array block 102-1 of the memory array block 1-2 is arranged in such a manner that the sub memory array block 151-1 is arranged to be adjacent to the sense amplifier/column switch 152-3 of the memory array block 101-1 (FIG. 25) in the column direction. Structures of 32-kbit memory array blocks of the other memory array blocks 1-3, 1-4 of the memory macro of FIGS. 21, 22 are similar to that of the 32-kbit memory array block 102-1 shown in FIG. 25, and thus description thereof is omitted.

Figure 27:
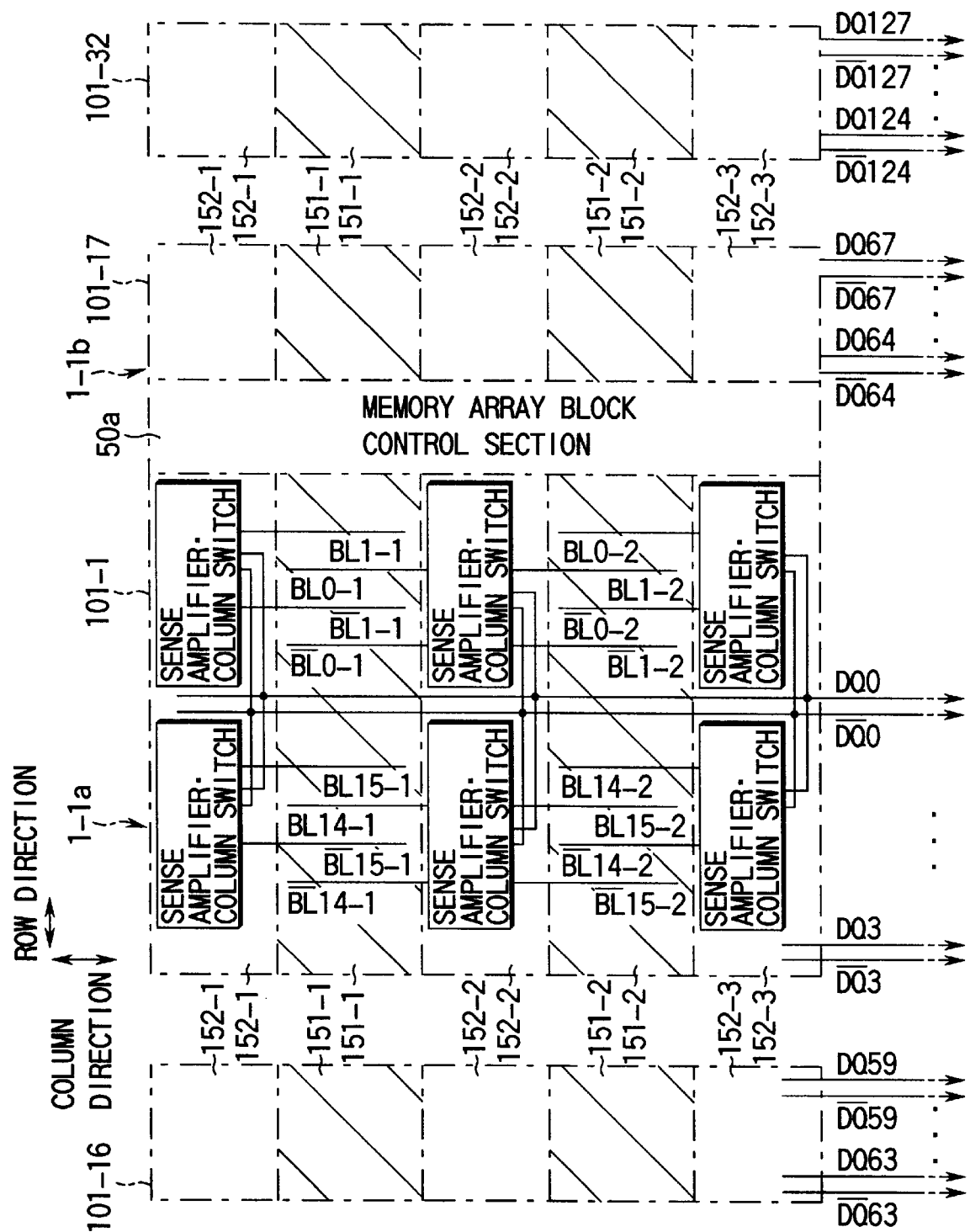
FIG. 27 is a detailed diagram showing part of a structure of the sub memory array block schematically shown in FIG. 23 and specifically a detailed diagram showing part of the sub memory array block.

FIG. 27 shows a detailed structure of the whole of the one-Mbit memory array block 1-1 of FIG. 21, in particular part relating to DQ0, /DQ0 of a 32-kbit sub memory array block 101-1 in a memory array block 1-1*a* of memory array block 1-1. A circuit structure of the 32-kbit sub memory array block 101-1 fundamentally is the similar to the circuit structure of the memory array block of FIG. 5 as can be seen if compared therebetween. However, there is a difference in the number of DQ line pairs provided. That is, while the memory array block 1-1*a* of FIG. 5 is provided with 64 DQ line pairs of DQ0, /DQ0 to DQ63, /DQ63, the sub memory array block 101-1 of the memory array block 1-1*a* of FIG. 27 is provided with 4 DQ line pairs of DQ0, /DQ0 to DQ3, /DQ3. In other words, the number of DQ line pairs provided in each of the sub memory array blocks 101-1 to 101-32 of FIG. 27 is one sixteenth (1/16) of the number of DQ line pairs provided in the memory array of FIG. 5. The reason why the number of DQ line pairs is decreased to one sixteenth (1/16) is that an expansion unit of storage capacity is set 32 kbits and one DQ line pair is provided for each group of bit line pairs for 16 columns. Since the number of DQ line pairs is one sixteenth, the number of I/Os which is defined in a specification of a memory macro can easily be realized in a 4 bit unit by only selecting the number of 32-kbit sub memory array blocks to be arranged in a row direction. The memory array block 1-1 of FIG. 27 is provided with thirty two 32-kbit sub memory array blocks and has, therefore, 64 DQ line pairs of DQ0, /DQ0 to DQ127, /DQ127 as a whole.

Figure 28:
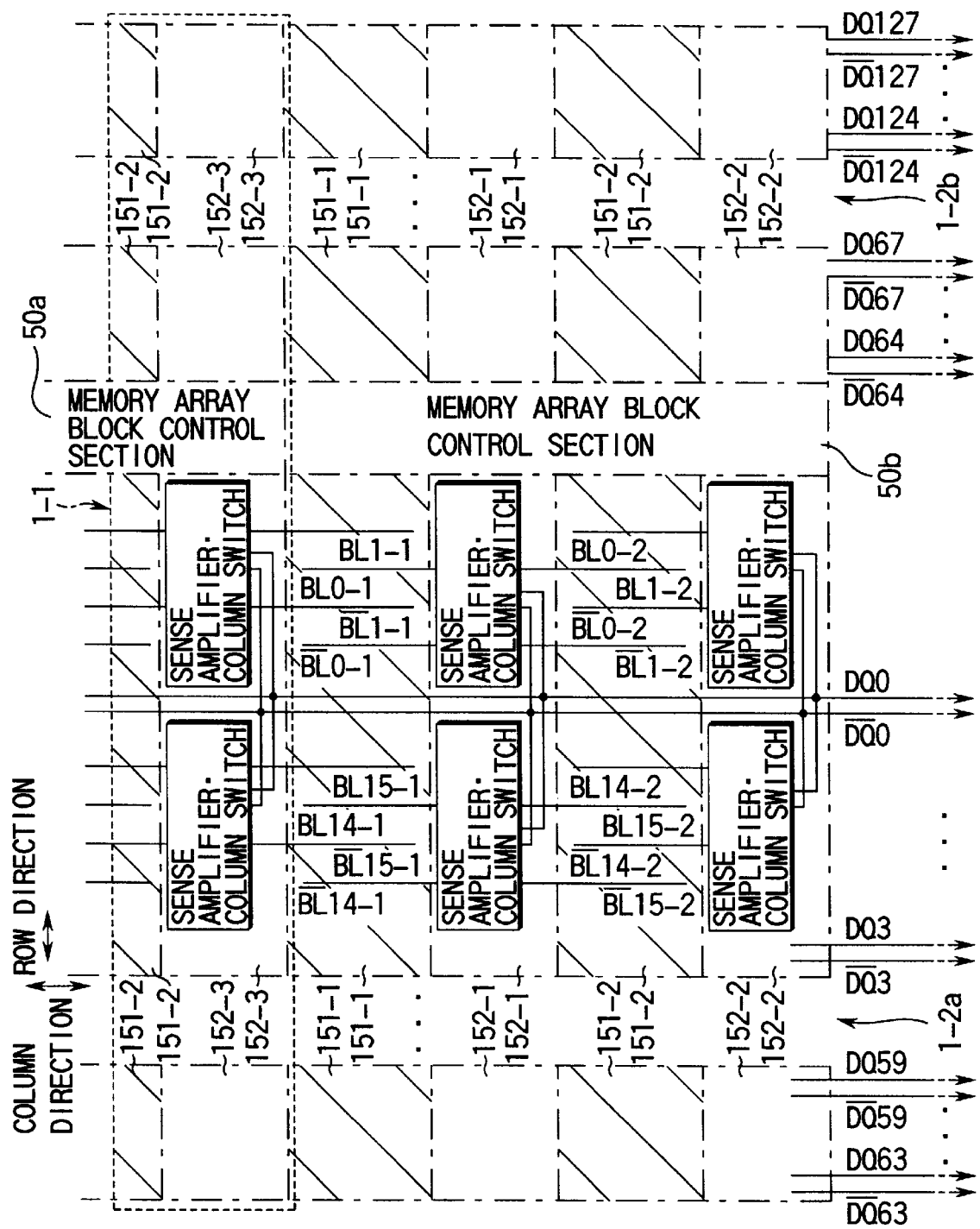
FIG. 28 is a detailed diagram showing part of a structure of the sub memory array block schematically shown in FIG. 23 and specifically a detailed diagram showing part of the sub memory array block.

FIG. 28 is a figure similar to FIG. 27 and shows a detailed structure of the whole of the memory array block 1-2 of the macro cell of FIG. 21, especially part relating to DQ0, /DQ0 of the 32-kbit sub memory array block 102-1 of the memory array block 1-2a. A structure of FIG. 28 is almost the same as that of FIG. 27. What is different from FIG. 27 is as seen from FIG. 28 that, in a memory array block 102-1, a sense amplifier/column switch corresponding to the sense amplifier/column switch 152-1 in the 32-kbit sub memory array block 101-1 (FIG. 27) of the memory array block 1-1 is not provided. Instead, a sense amplifier/column switch 152-3 arranged at the other end of the sub memory cell array 151-2 in a memory array block 101-1 (FIG. 27) of a memory array block 1-1a in the upper row by one row of the memory array block 1-1b is shared. From a view point of easy understanding, the sense amplifier/column switch 152-3 arranged in an adjacent manner at the other end of the sub memory cell array 151-2 in the memory array block 101-1 (FIG. 27) of the memory array block 1-1a is shown in FIG. 28. Since the 32-kbit memory array blocks of the other memory array blocks 1-3, 1-4 of the macro cell of FIG. 21 each have a structure similar to the 32-kbit memory array block 102-1 shown in FIG. 28, description thereon is omitted.

Bit line pairs for 16 columns are connected to one DQ line pairs. Since data transfer between one DQ pair and bit line pairs for one column selected by a column selecting signal among the bit line pairs for 16 columns is possible, the number of bits which can simultaneously be input or output (the number of I/Os) is 4 bits (4 I/O) for each 32-kbit sub memory array block or 128 bits (128 I/O) for each one-Mbit memory array block.

Figure 29:
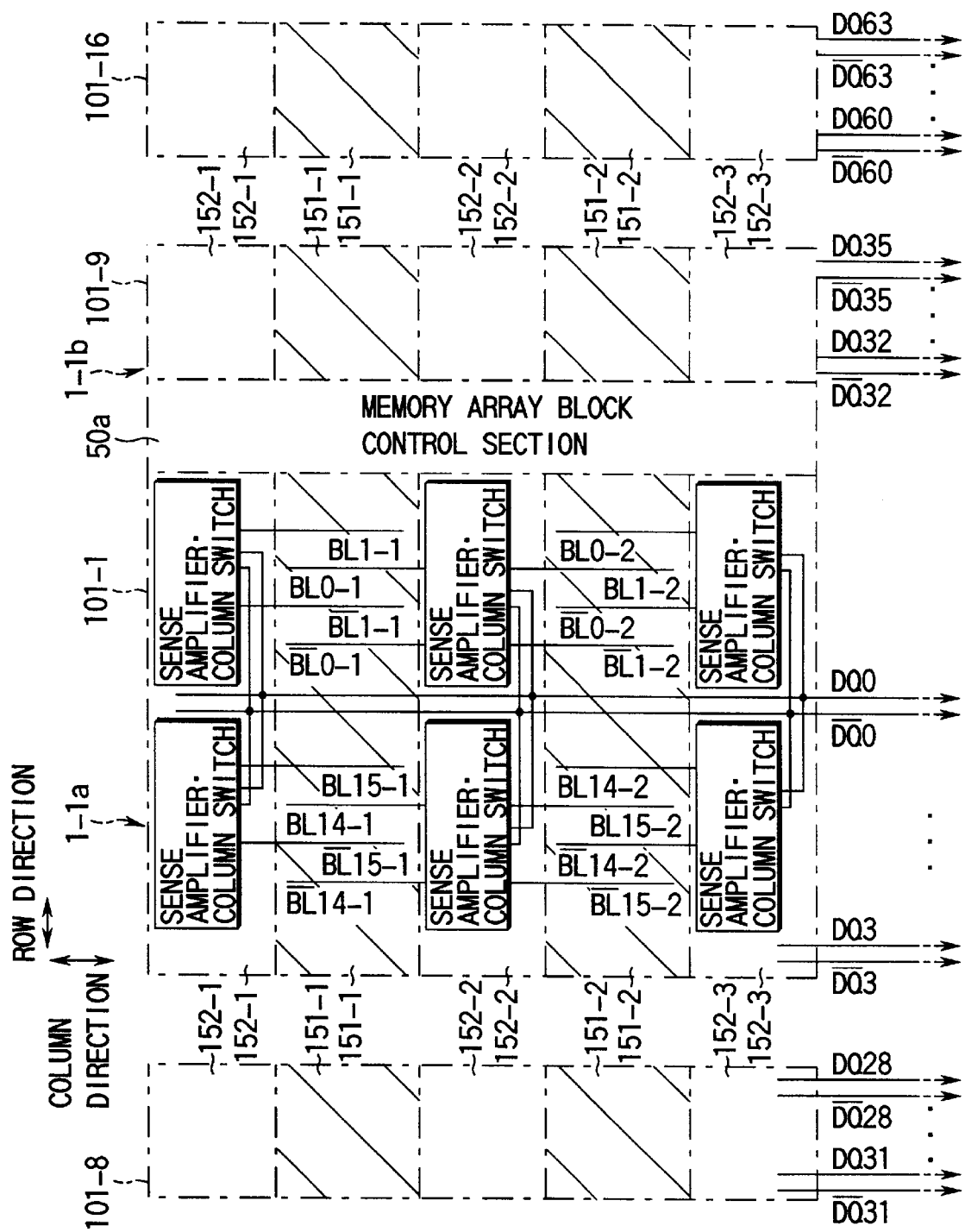
FIG. 29 is a detailed diagram showing part of a structure of the sub memory array block schematically shown in FIG. 24 and specifically a detailed diagram showing part of the sub memory array block.

FIG. 29 shows a detailed structure of the whole of the 512-kbit memory array block 1-1 of FIG. 22, especially of part relating to DQ0, /DQ0 of the 32-kbit sub memory array block 101-1 in the memory array block 1-1a of the memory array block 1-1. A circuit structure of the 32-kbit sub memory array block 101-1 is fundamentally similar to the structure of the memory array block of FIG. 5 as can be seen if compared therebetween. However, the number of DQ line pairs provided is different. In other words, while the memory array block 1-1a of FIG. 5 has 64 DQ line pairs of DQ0, /DQ0 to DQ63, /DQ63, the sub memory array block 101-1 the memory array block 1-1a of FIG. 29 has 4 DQ line pairs of DQ0, /DQ0 to DQ3, /DQ3. That is, the number of DQ line pairs which the sub memory array block of FIG. 29 has is one sixteenth of the number of DQ line pairs which the memory array block of FIG. 5 has. Since the number of DQ line pairs is one sixteenth, the number of I/Os which is defined in a specification of a memory macro can easily be realized in a 4 bit unit by only selecting the number of 32-kbit sub memory array blocks to be arranged in a row direction as in the 1 Mbit memory described in connection to FIGS. 27, 28. The memory array block 1-1 of FIG. 29 is provided with sixteen 32-kbit sub memory array blocks and has, therefore, 64 DQ line pairs of DQ0, /DQ0 to DQ63, /DQ63 as a whole.

Figure 30:
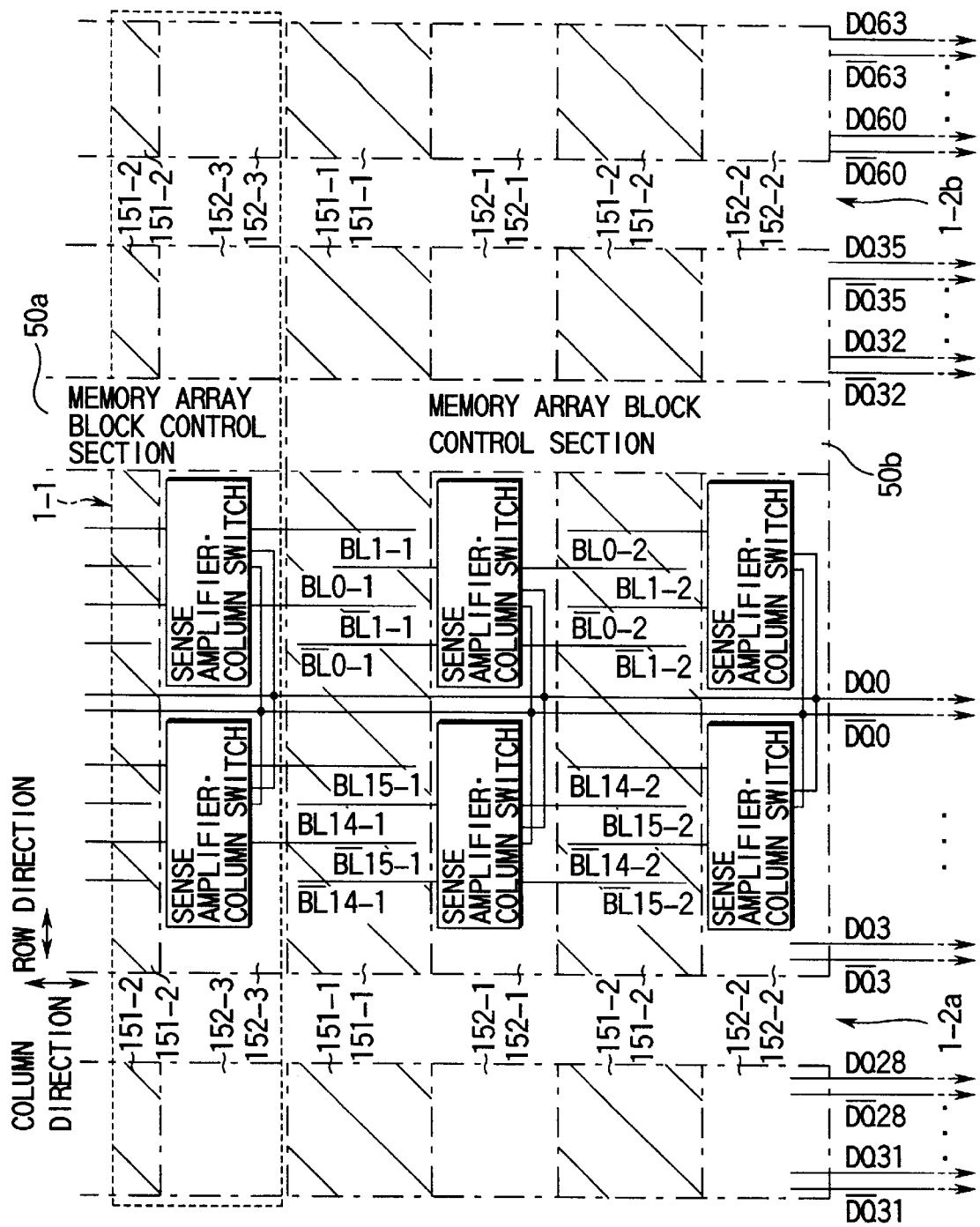
FIG. 30 is a detailed diagram showing part of a structure of the sub memory array block schematically shown in FIG. 24 and specifically a detailed diagram showing part of the sub memory array block.

FIG. 30 is a figure similar to FIG. 28 and shows a detailed structure of the whole of the memory array block 1-2 of the macro cell of FIG. 22, especially part relating to DQ0, /DQ0 of the 32-kbit sub memory array block 102-1 of the memory array block 1-2a. A structure of FIG. 30 is almost similar to that of FIG. 28. What is different is, as can be seen in FIG. 30, that, in memory array block 102-1, a sense amplifier/column switch corresponding to the sense amplifier/column switch 152-1 in the 32-kbit memory array block 101-1 (FIG. 29) of the memory array block 1-1 is not arranged. Instead, a sense amplifier/column switch 152-3 which is arranged on the memory array block 1-2a side in a memory array block 101-1 (FIG. 29) of a memory array block 1-1a in the upper row by one row of the memory array 1-1b is shared. From a view point of easy understanding, a sense amplifier/column switch 152-3 which is arranged on the memory array block side 1-2a in the memory array block 101-1 (FIG. 29) of the memory array block 1-1a is shown in FIG. 30. The 32-kbit memory array blocks of the other memory array blocks 1-3, 1-4 of the macro cell of FIG. 22 each have a structure similar to the 32-kbit memory array block 102-1 shown in FIG. 30, and thus description thereof is omitted.

Bit line pairs for 16 columns are connected to one DQ line pairs. Since data transfer between one DQ pair and bit line pairs for one column selected by a column selecting signal among the bit line pairs for 16 columns is possible, the number of bits which can simultaneously be input or output (the number of I/Os) is 4 bits (4 I/O) for each 32-kbit sub memory array block or 128 bits (128 I/O) for each one-Mbit memory array block.

A detailed structure of the sense amplifier/column switches in the memory array blocks of FIGS. 27 to 30 are the same as that shown in FIG. 7.

FIG. 31 shows a structure of the control block 502 in the floor plan of FIGS. 21, 22. A control block 502 of FIG. 31 comprises: a control block 5 having a similar structure to the control block of FIG. 2; and a potential generating block 2 having a similar structure to the potential generating block 2 shown in FIG. 2. A structure of the control block 502 of FIG. 31 will be compared with the structure of the control block 5 of the floor plan of FIG. 2. The structure of the control block 502 of FIG. 31 is different from the control block 5 of FIG. 2 in that the control block 502 of FIG. 31 further comprises a direct current potential generating block 2. On the other hand, in the floor plane of FIG. 2, the direct current potential generating block 2 is arranged at the top end of the 1 Mbit memory array block 1-1 in an adjacent manner. The structure of the floor plan of FIG. 2 is different from the floor plans of FIGS. 21, 22 in this regard.

In the floor plans of FIGS. 21, 22, the reason why a location of the direct current potential generating block 2 is moved to the inside of the control block from the location at the top end of the 1 Mbit memory array block 1-1 as in the floor plan of FIG. 2 is as follows: if the control block is located at the top end of the memory block, a width of the memory array block 1-1 in a row direction is affected by the number of 32-kbit sub memory array blocks, which is plural, and as a result, a width of the memory array block in a row direction and a width of the direct current potential generating block 2 in a row direction are not always equal to each other. In order to avoid such a situation, in the floor plan of FIGS. 21, 22, a location of the direct current potential generating block 2 is changed into the inside of the control block from the location at the top end of the 1 Mbit memory array block 1-1 as in the floor plan of FIG. 2.

Figure 32:
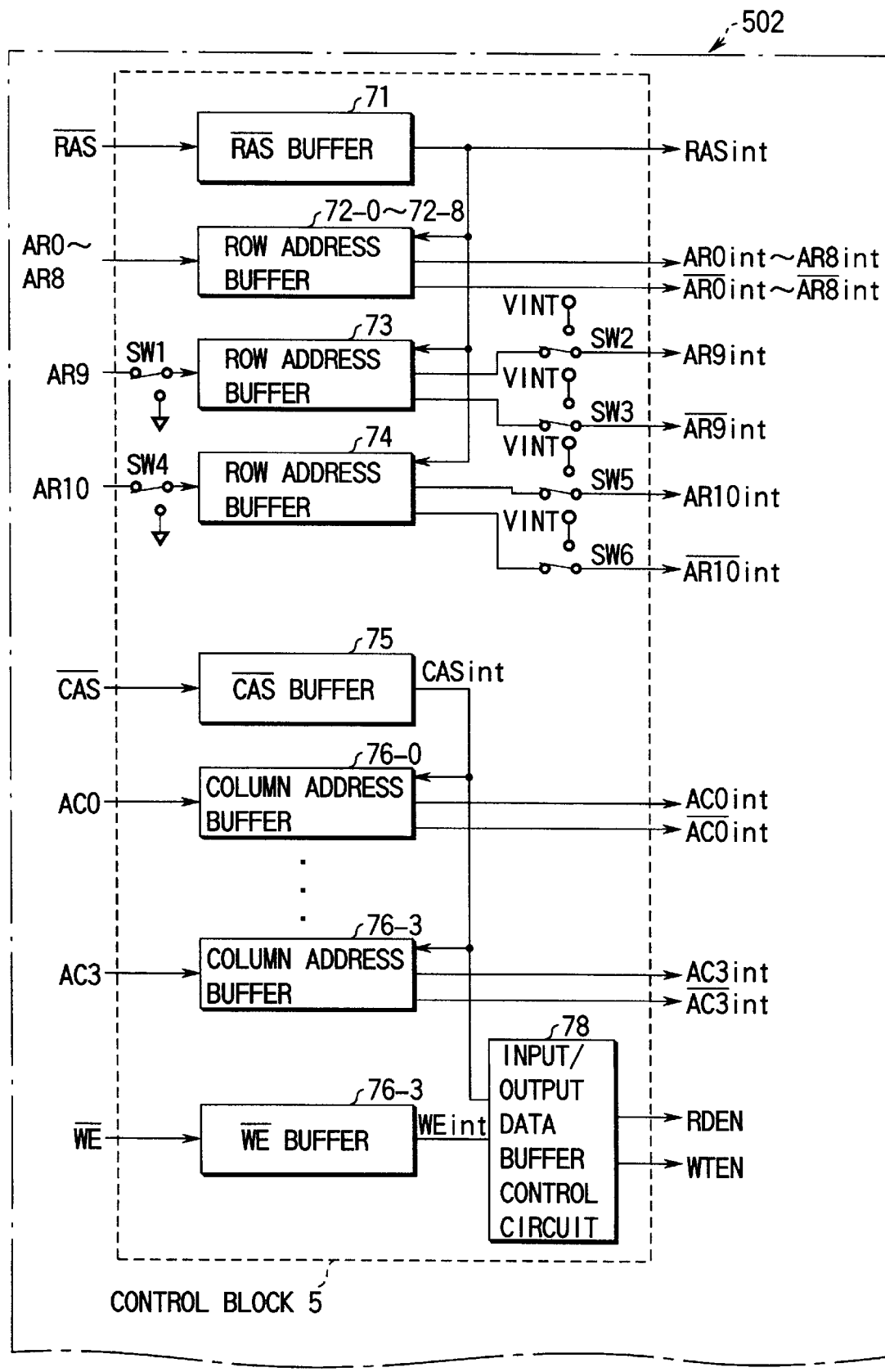
FIG. 32 is a detailed diagram showing a structure of the control/direct current potential generating block in the floor plan of the memory of FIGS. 21 and 22.
Figure 33:
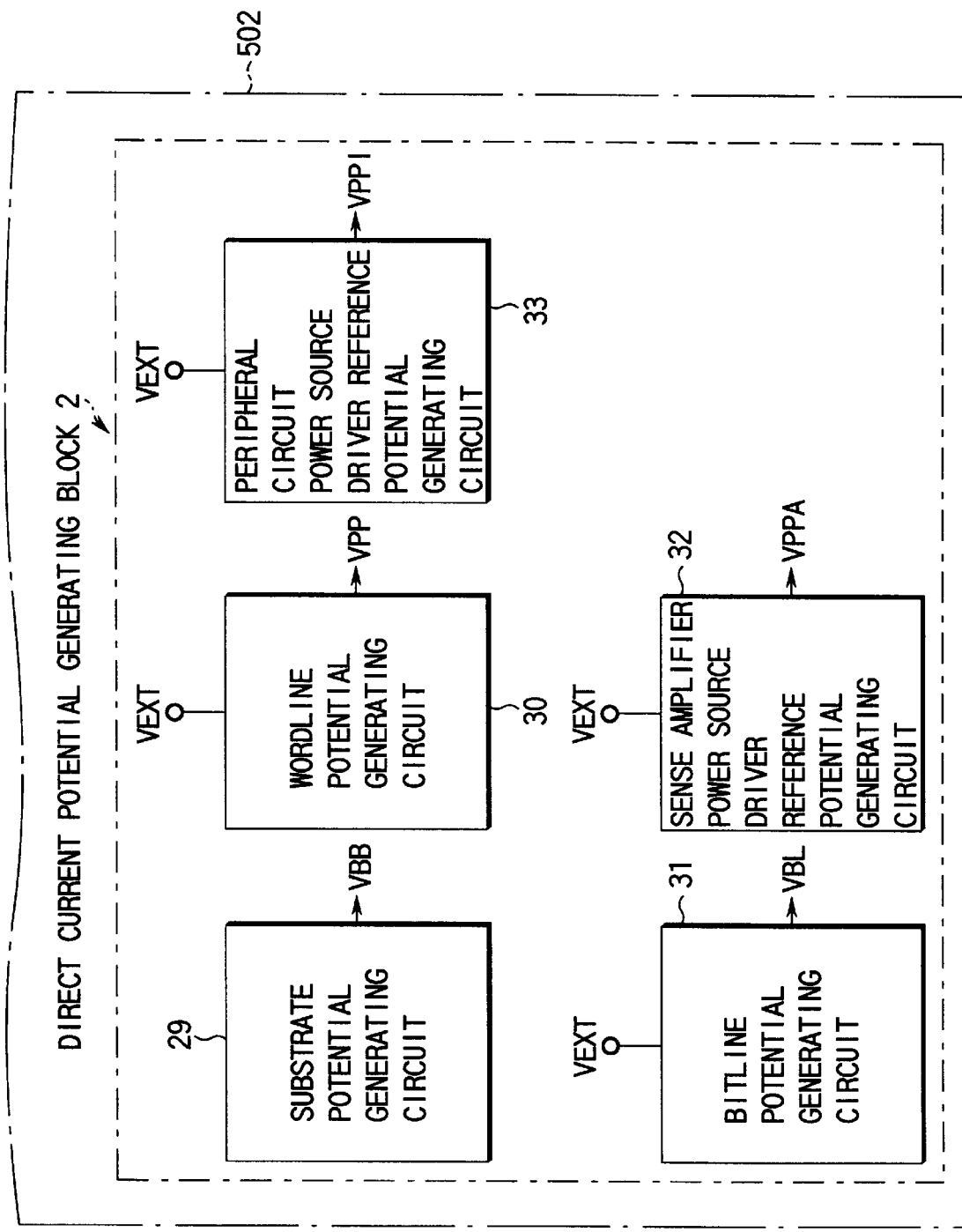
FIG. 33 is a detailed diagram showing a structure of the control/direct current potential generating block in the floor plan of the memory of FIGS. 21 and 22.

FIGS. 32, 33 show detailed structures of the control and direct current potential generating blocks 502 in FIG. 31.

As shown in FIGS. 32, 33, the control and direct current potential generating blocks 502 comprises: a control block 5 having the same structure as that shown in FIG. 1 including a /RAS buffer 71, row address buffers 72-0 to 72-8, 73, 74, a /CAS buffer 75, column address buffers 76-0 to 76-3, a /WE buffer 77 and an input/output buffer control circuit 78; and a direct current potential generating block 2 including various potential generating circuits.

The /RAS buffer 71 generates a row address strobe signal RASint which is used in the interior of a memory macro based on a row address strobe signal /RAS supplied from the outside of the memory macro.

The row address buffers 72-0 to 72-8 take row address signals (external row address signals) AR0 to AR8 into the interior of the memory macro in synchronization with the row address strobe signal RASint and generate internal row address signals AR0int to AR8int, /AR0int to /AR8int. The internal row address signals AR0int to AR8int, /AR0int to /AR8int are supplied to a row decoder and select one row among 512 rows in a selected memory array block.

The row address buffers 73, 74 take row address signals (external row address signals) AR9, AR10 into the interior of the memory macro in synchronization with the row address strobe signal RASint and generate internal row address signals AR9int to AR10int, /AR9int to /AR10int. The internal row address signals AR9int to AR10int, /AR9int to /AR10int select one memory array block among a plurality (for example 4) of memory array blocks.

The number of row address signals (block selecting row address signals) for selecting a memory array block is varied according to the number of memory array blocks in the memory macro.

As shown in FIGS. 32, 33, a structure of the control block 5 in the control and direct current potential generating blocks 502 is the same as that of the control block 5 shown in FIG. 11 and therefore, description given in connection to FIGS. 11,12, for example description about change-over of the switches SW1 to SW6 in selection of memory array blocks, can also be applied to this example in a similar way.

The direct current potential generating block 2 comprises: a substrate potential generating circuit 29, a word line potential generating circuit 30, a bit line potential generating circuit 31, a sense amplifier power source driver reference potential generating circuit 32 and a peripheral circuit power source reference potential generating circuit 33.

The substrate potential generating circuit 29 generates a substrate potential VBB of the memory macro. The word line potential generating circuit 30 generates a potential VPP supplied to a word line selected by a row address signal. The bit line potential generating circuit 31 is provided to equalize a potential of a bit line pair to a predetermined value before a read data or a write data is guided to the bit line pair.

The sense amplifier power source driver reference potential generating circuit 32 generates a power source VPPA based on an external power source VEXT.

The peripheral circuit power source potential generating circuit 33 comprises: a peripheral circuit power source potential generating circuit 34 generating a power source VPPI by being supplied with the external power source VEXT; and a peripheral circuit power source generating an internal power source VINT to drive a peripheral circuit of the memory macro by being supplied with the power source VPPI at a gate.

The power source VPPA is supplied to the memory cell array power source driver block 4 in the floor plans of FIGS. 21, 22. The memory cell array power source driver block 4 generates a power source VAA of a sense amplifier driver (for example see FIG. 15). The memory cell array power source driver block 4 comprises a MOS transistor, the power source VPPA is input to the gate of the MOS transistor. The drain of the MOS transistor is connected to the external power source VEXT, and the power source VAA is obtained from the power source and supplied to a sense amplifier driver. The sense amplifier driver generates a signal SAP, /SAN which are supplied to the sense amplifier.

Figure 34:
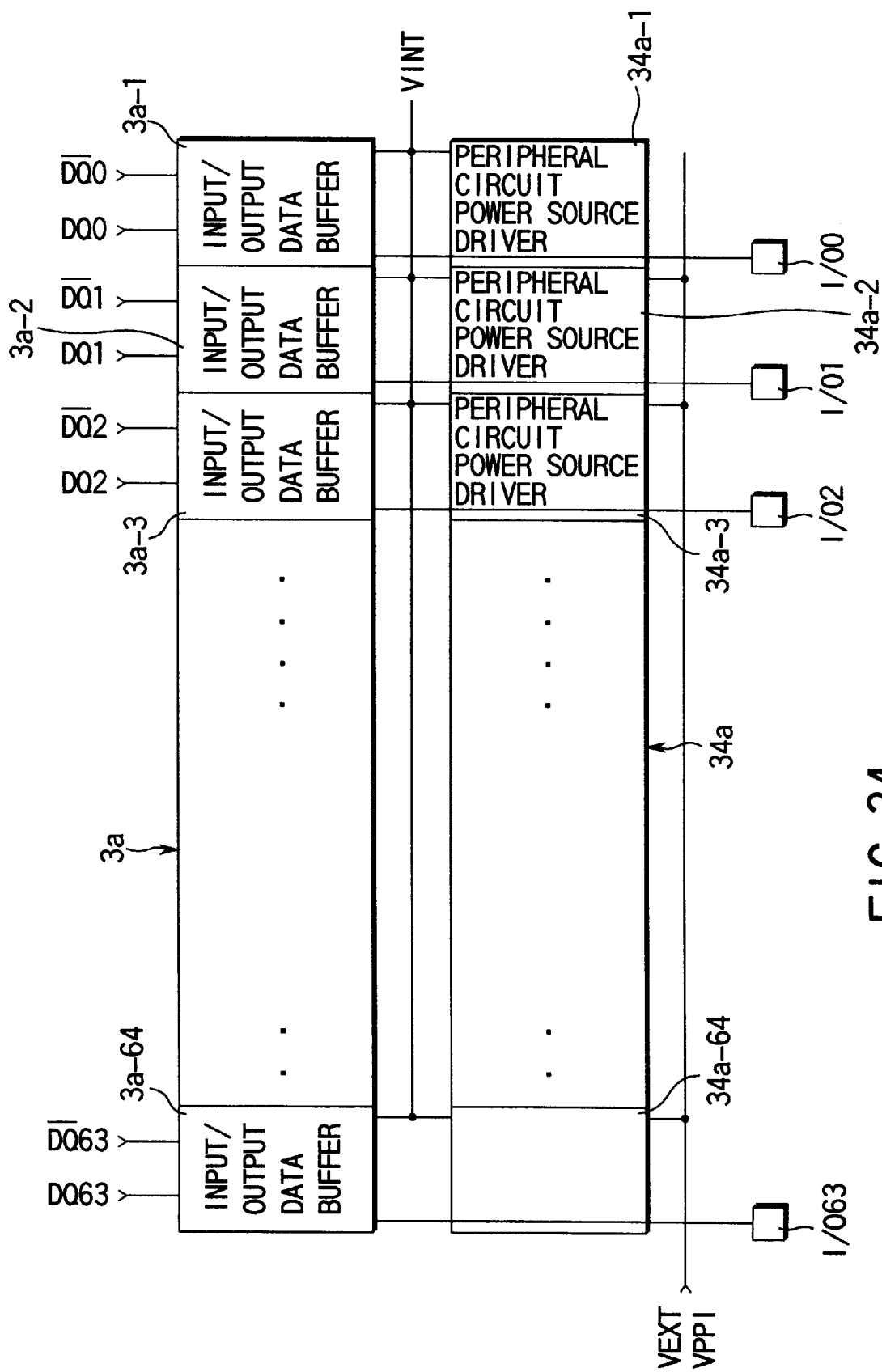
FIG. 34 is a detailed diagram showing a structure of the input/output data buffer block in the floor plan of the memory of FIG. 21.

FIG. 34 shows a detailed structure of the input/output data buffer block 3a and the peripheral circuit power source driver block 34a in the floor plan of the memory macro of FIG. 21. A structure of the input/output data buffer block 3b and the peripheral circuit power source driver block 34b, which is not shown in the figure, is substantially the same.

As shown in FIG. 34, the input/output data buffer block 3a comprises: 64 input/output data buffers 3a-1 to 3a-64 arranged in a row direction in an adjacent manner to one another. Sixty-four input/output data buffers 3a-1 to 3a-64 are respectively arranged in correspondence to 64 DQ line pairs DQ0, /DQ0 to DQ63 to /DQ63.

For example, the input/output data buffers 3a-1 to 3a-2, 3a-3, . . . are respectively arranged in correspondence to the DQ line pairs DQ0, /DQ0 pair, DQ1, /DQ1 pair, DQ2, /DQ2 pair, Sixty-four input/output terminals I/O0 to I/O63 are respectively arranged in correspondence to the 64 input/output data buffers 3a-1 to 3a-64 and the 64 input/output data buffers 3a-1 to 3a-64 are respectively connected to the 64 input/output terminals I/O0 to I/O63.

In such a manner, it is required to design an input/output data buffer in advance in order that an input/output data buffer block is constructed from a plurality of input/output data buffers. Design of the input/output data buffer is manually performed and takes a considerable length of time, but if a design which has manually been completed is registered in a library, a design of an input/output data buffer block, which is defined in the specification of a memory macro can easily be designed in a short time by retrieving the input/output data buffer which has been prepared by manual design from the library in a CAD operation and automatically processing a layout of the input/output data buffer.

A peripheral circuit power source data buffer 34a is arranged adjacent to the input/output data buffer 3a in a corresponding manner. That is, 64 peripheral circuit power source drivers 34a-1 to 34a-64 are arranged in a row direction in an adjacent manner to one another, while respectively corresponding to the 64 input/output data buffers 3a-1 to 3a-64 arranged in a row direction in an adjacent manner to one another. For example, the peripheral circuit power source drivers 34a-1, 34a-2, 34a-3, . . . are respectively arranged in correspondence to the input/output data buffers 3a-1, 3a-2, 3a-3 . . . . The structure relating to the input/output data buffer block 3b and the peripheral circuit power source driver block 34b, which is not shown in the figure, is substantially the same as that of the input/output data buffer block 3a, and thus will be briefly explained.

That is, the input/output data buffer block 3b comprises 64 input/output data buffers arranged in a row direction in an adjacent manner to one another as in the case of the input/output data buffer block 3a. The peripheral circuit power source driver block 34b comprises 64 peripheral circuit power source drivers arranged in the row direction in an adjacent manner to one another. The peripheral circuit power source driver block 34b is arranged in a corresponding manner to the input/output data buffer block 3b. That is, 64 peripheral circuit power source drivers of the peripheral circuit power source driver block 34b are arranged in a corresponding manner to 64 input/output data buffers of the input/output data buffer block 3b.

The peripheral circuit power source drivers are supplied with the external power source VEXT as a drive power source and moreover, supplied with the power source VPPI as a control signal from the peripheral circuit power source driver reference potential generating circuit 33 (FIG. 8) to generate the internal power source VINT. The VINT is supplied to the input/output data buffers as a drive power source and also supplied to other circuits, for example an address buffer, a row decoder, a column decoder, etc. as a drive power source. Structures of the peripheral circuit power source drivers comprises a MOS transistor, for example as in the case of the peripheral circuit power source driver 34 of the direct current potential generating block 2 in the control block 5 of FIG. 8. The external power source VENT is supplied to the drain of the MOS transistor and the power source VPPI is supplied to the gate as a control signal from the peripheral circuit power source driver reference potential generating circuit 33 to generate the internal power source VINT. The internal power source VINT is supplied to the input/output data buffers as a drive power source.

In such a manner, it is required in order to constitute the peripheral circuit power source drivers of a plurality of peripheral circuit power source drivers that a peripheral circuit power source driver has to be designed in advance. While design of the peripheral circuit power source driver requires a considerable length of time due to manual operation, once the peripheral circuit power source driver is designed and stored in a library, design of a peripheral circuit power source driver defined in the specification of a memory macro can easily be performed in a short time in such a manner that the peripheral circuit power source driver already prepared manually is retrieved from the library in a CAD operation and layout of the peripheral circuit power source driver is automatically processed according to a program.

In a floor plan shown in FIG. 34, 64 input/output data buffers 3*a*-1 to 3*a*-64 and 64 peripheral circuit power source drivers 34*a*-1 to 34*a*-64 are arranged in a row direction with almost equal pitches. The 64 input/output data buffers 3*a*-1 to 3*a*-64 and the 64 peripheral circuit power source drivers 34*a*-1 to 34*a*-64 are provided in a corresponding manner to 64 pairs of DQ0, /DQ0 to DQ63, /DQ63, and since the 64 pairs of DQ0, /DQ0 to DQ63, /DQ63 are grouped in 4 pairs for each group and the groups are provided to respective 32-kbit memory array blocks, the 64 input/output data buffers 3*a*-1 to 3*a*-64 and the 64 peripheral circuit power source drivers 34*a*-1 to 34*a*-64 each have a pitch of one fourth (¼) of that of the 32-kbit memory array blocks in a row direction. Therefore, as shown in FIG. 34, the structure can be suited for multi-bit output, since the number of either of the 64 input/output data buffers 3*a*-1 to 3*a*-64 and the 64 peripheral circuit power source drivers 34*a*-1 to 34*a*-64 can be 4 times as large as the number of the 32-kbit memory array blocks in arrangement in a row direction.

Figure 35:
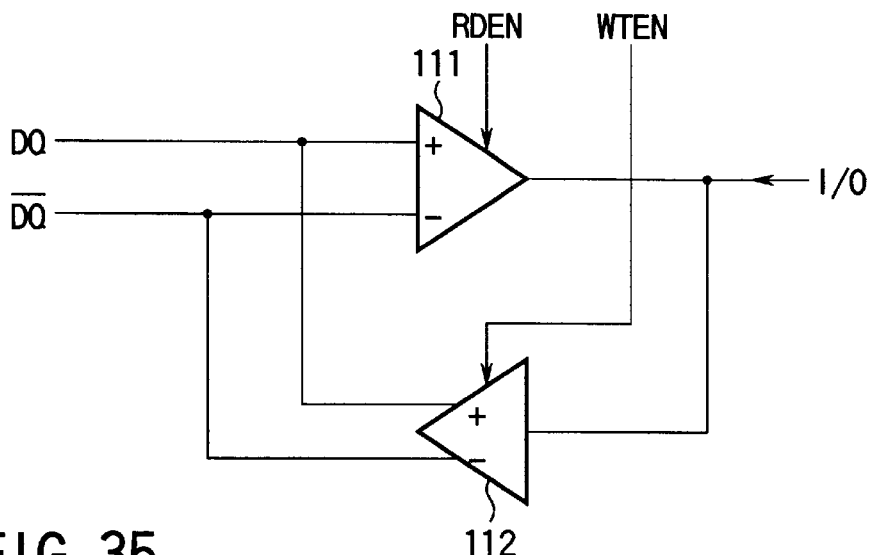
FIG. 35 is a concrete diagram showing an input/output data buffer.

FIG. 35 shows an example of a structure of an input/output data buffer in a concrete manner. An input/output data buffer comprises a read buffer 111 and a write buffer 112. The read buffer 111 is controlled by a read control signal RDEN and outputs data on a DQ line pair DQ0,/DQ0 to an I/O section. The write buffer 111 is controlled by a control signal WTEN and outputs write data to be input to the I/O section to the DQ line pair DQ0,/DQ0.

Figure 36:
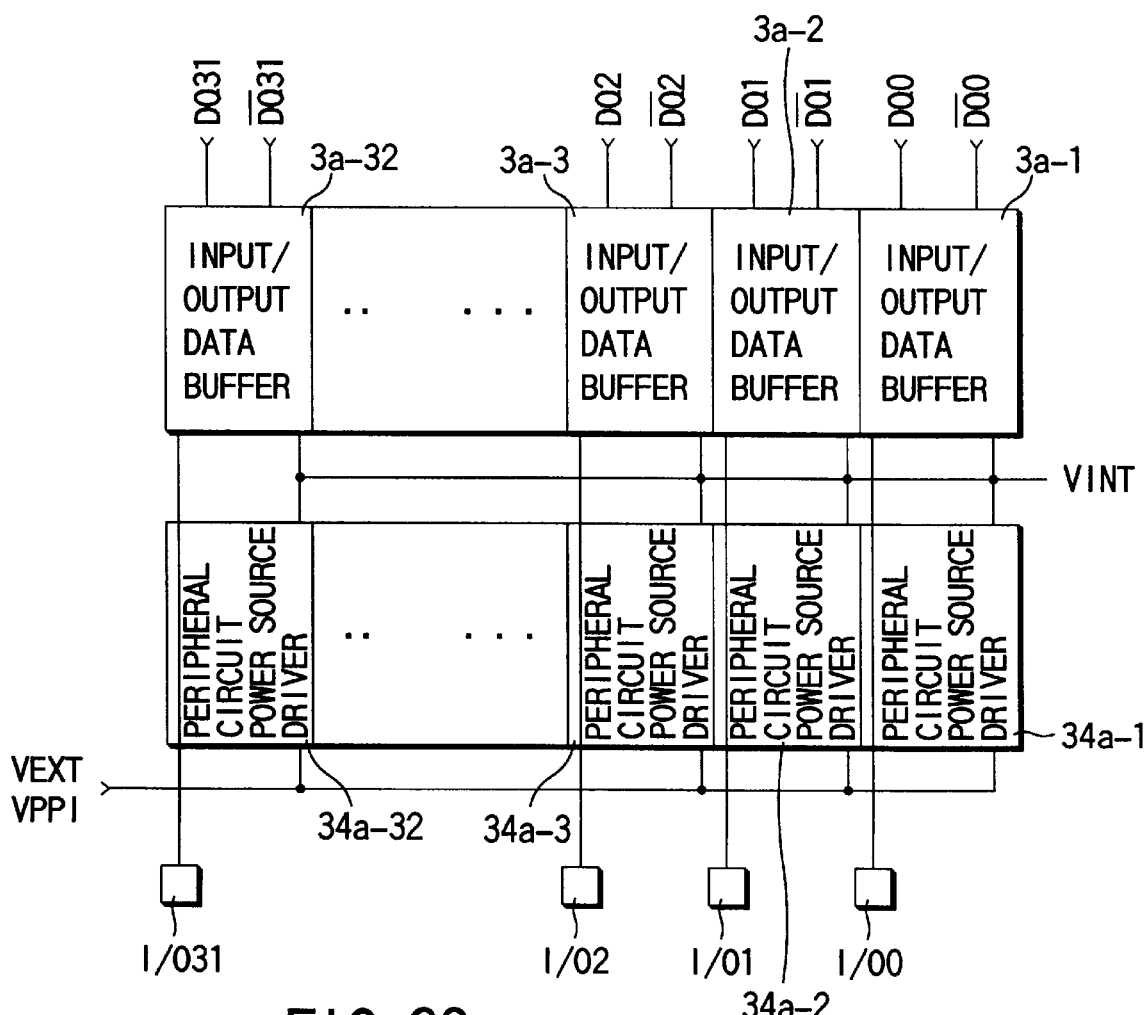
FIG. 36 is a detailed diagram showing a structure of the input/output data buffer block in the floor plan of the memory macro of FIG. 22.

FIG. 36 shows a diagram similar to FIG. 34 of the floor plan of the memory macro of FIG. 22. That is, FIG. 36 shows a detailed structure of the input/output data buffer block 3*a* and the peripheral circuit power source driver block 34*a* of the floor plan of the memory macro of FIG. 21. A structure of a input/output data buffer block 3*b* and the peripheral circuit power source driver block 34*b*, which is not shown in the figure, is substantially the same.

As shown in FIG. 36, the input/output data buffer block 3*a* comprises 32 input/output data buffers 3*a*-1 to 3*a*-32 arranged in row direction in an adjacent manner to one another. The 32 input/output data buffers 3*a*-1 to 3*a*-32 are arranged in a corresponding manner to 32 DQ line pairs DQ0, /DQ0 to DQ31, /DQ31.

As in the input/output data buffer block shown in FIG. 34, for example, the input/output data buffers 3*a*-1, 3*a*-2, 3*a*-3, . . . are respectively arranged in a corresponding manner to DQ line pairs DQ0, /DQ0 pair, DQ1, /DQ1pair, DQ2, /DQ2 pair, . . . .

A peripheral circuit power source driver block 34*a* is arranged adjacent to the input/output data buffer 3*a* in a corresponding manner. That is, 32 peripheral circuit power source drivers 34*a*-1 to 34*a*-32 are arranged in an adjacent manner to one another in row direction while being respectively located in a corresponding and adjacent manner to 32 input/output data buffers 31*a*-1 to 3*a*-32 arranged in a row direction in an adjacent manner to one another. For example, the peripheral circuit power source drivers 34*a*-1, 34*a*-2, 34*a*-3, . . . are respectively arranged in correspondence to the input/output data buffers 3*a*-1, 3*a*-2, 3*a*-3, . . . The structure relating to the input/output data buffer block 3*b* and the peripheral circuit power source driver block 34*b*, which is not shown in the figure, is substantially the same as that of the input/output data buffer block 3*a*, and thus will be briefly explained.

That is, the input/output data buffer block 3*b* comprises 32 input/output data buffers arranged in a row direction in an adjacent manner to one another as in the case of the input/output data buffer block 3*a*. The peripheral circuit power source driver block 34*b* comprises 32 peripheral circuit power source drivers arranged in the row direction in an adjacent manner to one another. The peripheral circuit power source driver block 34*b* is arranged in a corresponding manner to the input/output data buffer block 3*b*. That is, 32 peripheral circuit power source drivers of the peripheral circuit power source driver block 34*b* are arranged in a corresponding manner to 32 input/output data buffers of the input/output data buffer block 3*b*.

Thirty-two input/output terminals I/O0 to I/O31 are respectively provided so as to correspond to the 32 input/output data buffers 3*a*-1 to 3*a*-32 and the 32 input/output data buffers 3*a*-1 to 3*a*-32 are respectively connected to the 32 input/output terminals I/O0 to I/O31.

In the floor plan shown in FIG. 36, the 32 input/output data buffers 3*a*-1 to 3*a*-32 and the 32 peripheral circuit power source drivers 34*a*-1 to 34*a*-32 are arranged at almost equal pitches in a row direction. The 32 input/output data buffers 3*a*-1 to 3*a*-32 and the 32 peripheral circuit power source drivers 34*a*-1 to 34*a*-32 are respectively arranged in a corresponding manner to 32 DQ pairs DQ0, /DQ0 to DQ 31, /DQ31 and the 32 DQ pairs DQ0, /DQ0 to DQ 31, /DQ31 are divided into groups each comprising 4 pairs and the groups are respectively arranged in 32-kbit memory array blocks and therefore, either of the input/output data buffers 3*a*-1 to 3*a*-32 and the peripheral circuit power source drivers 34*a*-1 to 34*a*-32 has a pitch of one fourth (¼) of that of the 32-kbit memory array blocks in a row direction.

While the input/output buffer block of FIG. 34 comprises the 64 input/output data buffers 3*a*-1 to 3*a*-64 and the 64 peripheral circuit power source drivers 34*a*-1 to 34*a*-64, the input/output buffer block of FIG. 36 comprises the 32 input/output data buffers 3*a*-1 to 3*a*-32 and the 32 peripheral circuit power source drivers 34*a*-1 to 34*a*-32. With the exception of this, the structure of the input/output data buffer block of FIG. 36 is the same as that of the input/output data buffer block of FIG. 34.

Figure 37:
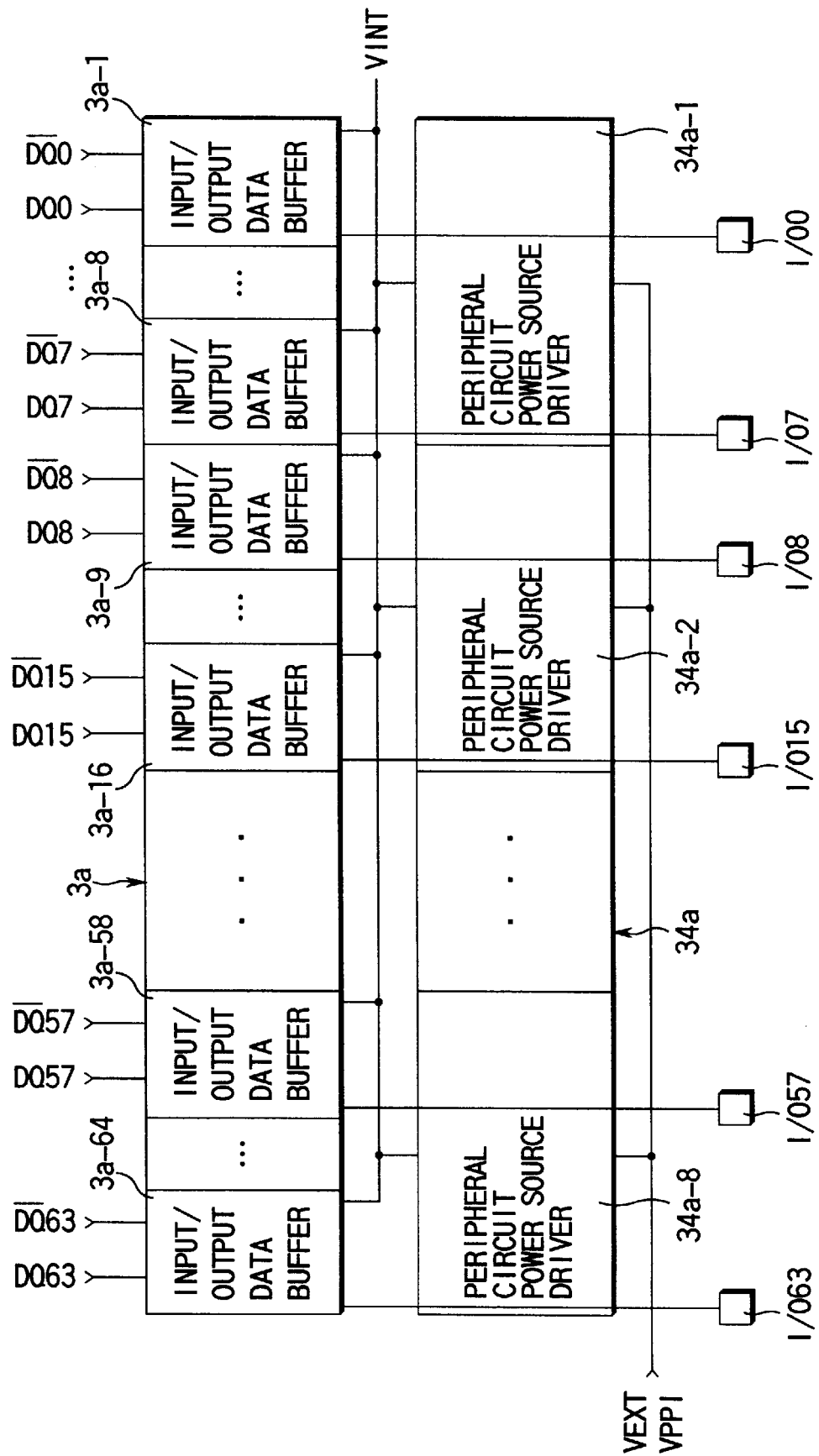
FIG. 37 is a detailed diagram showing another structure of the input/output data buffer block in the floor plan of the memory macro of FIG. 21.

FIG. 37 shows a structure of an example of modification of the input/output data buffer block of FIG. 34. In this example, while the pitch of the input/output data buffers 3*a*-1 to 3*a*-64 is not different from the example shown in FIG. 34, the pitch of the peripheral circuit power source drivers assumes a value 8 times as large as that of the input/output data buffer 3a-1 to 3a-64 and the peripheral circuit power source driver block 34a comprises 8 peripheral circuit power source drivers 34a-1 to 34a-8. That is, a pitch of the peripheral circuit power source drivers 34a-1 to 34a-8 is equal to a value twice as large as that of the 32-kbit memory array blocks 101-1 to 101-8.

As in the case of FIG. 34, 64 input/output terminals I/O0 to I/O63 are respectively arranged in a corresponding manner to the 64 input/output data buffers 3a-1 to 3a-64 and the 64 input/output data buffers 3a-1 to 3a-64 are respectively connected to the 64 input/output terminals I/O0 to I/O63.

Figure 38:
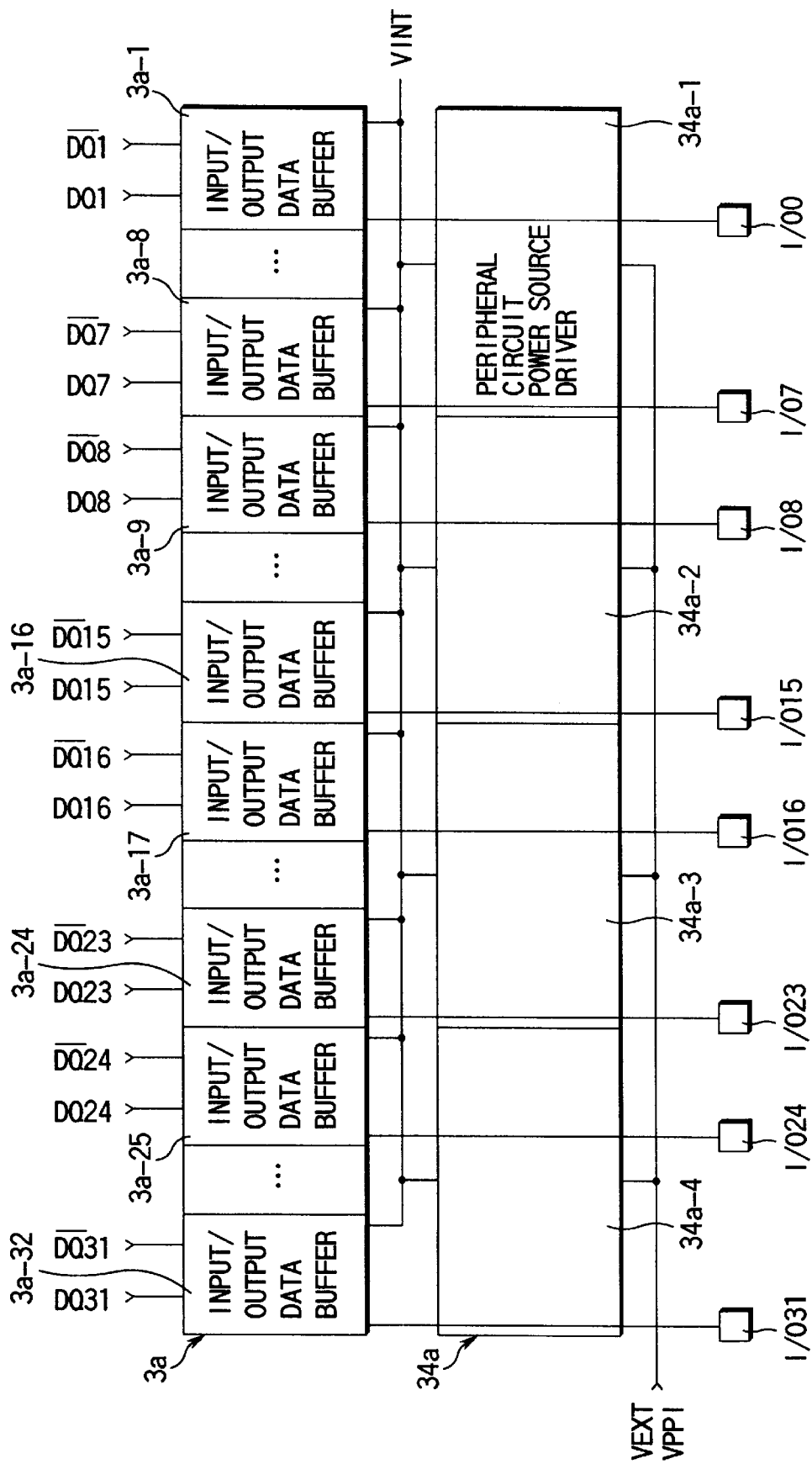
FIG. 38 is a detailed diagram showing another structure of the input/output data buffer block in the floor plan of the memory macro of FIG. 22.
Figure 40:
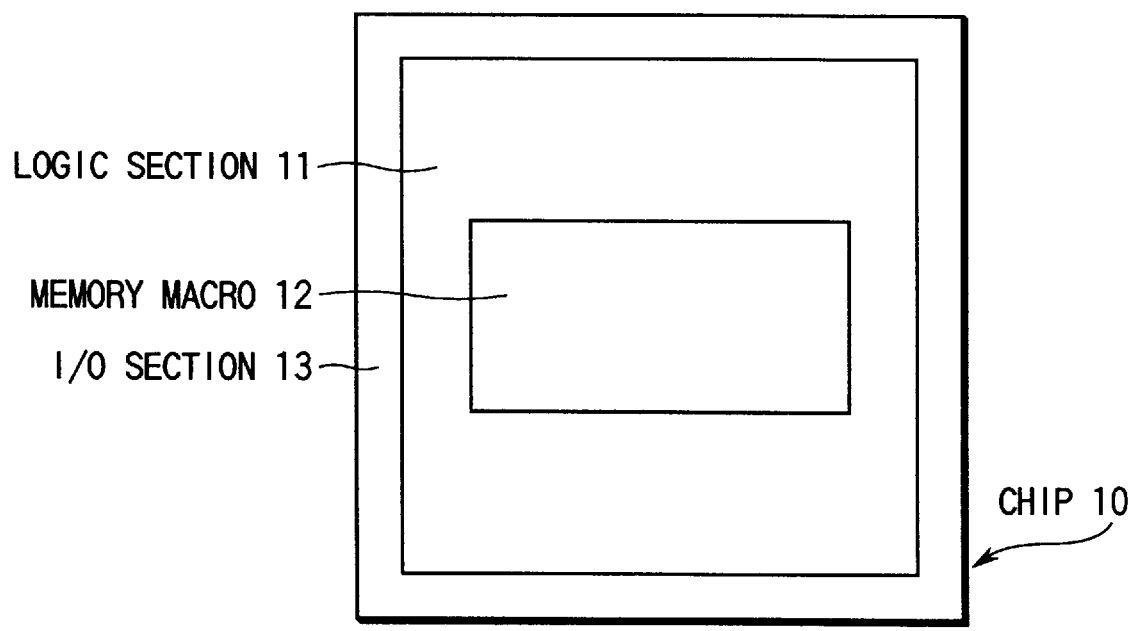
FIG. 40 is a diagram showing an example of a floor plan of a memory integrated with a logic.
Figure 41:
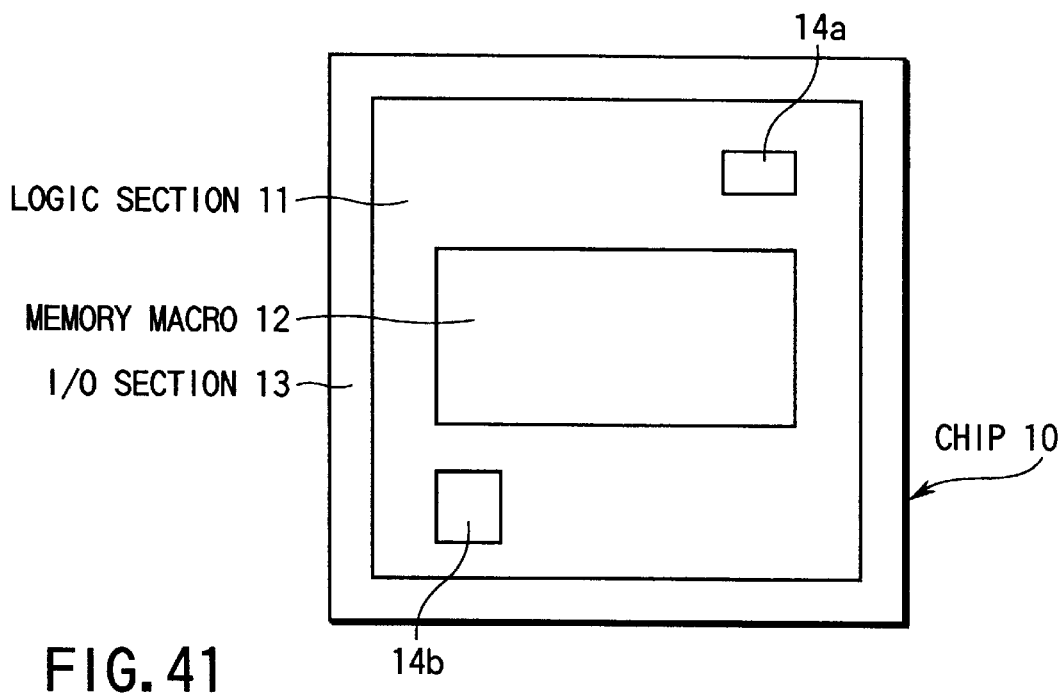
FIG. 41 is a diagram showing an example of a floor plan of a memory integrated with a logic.
Figure 42:
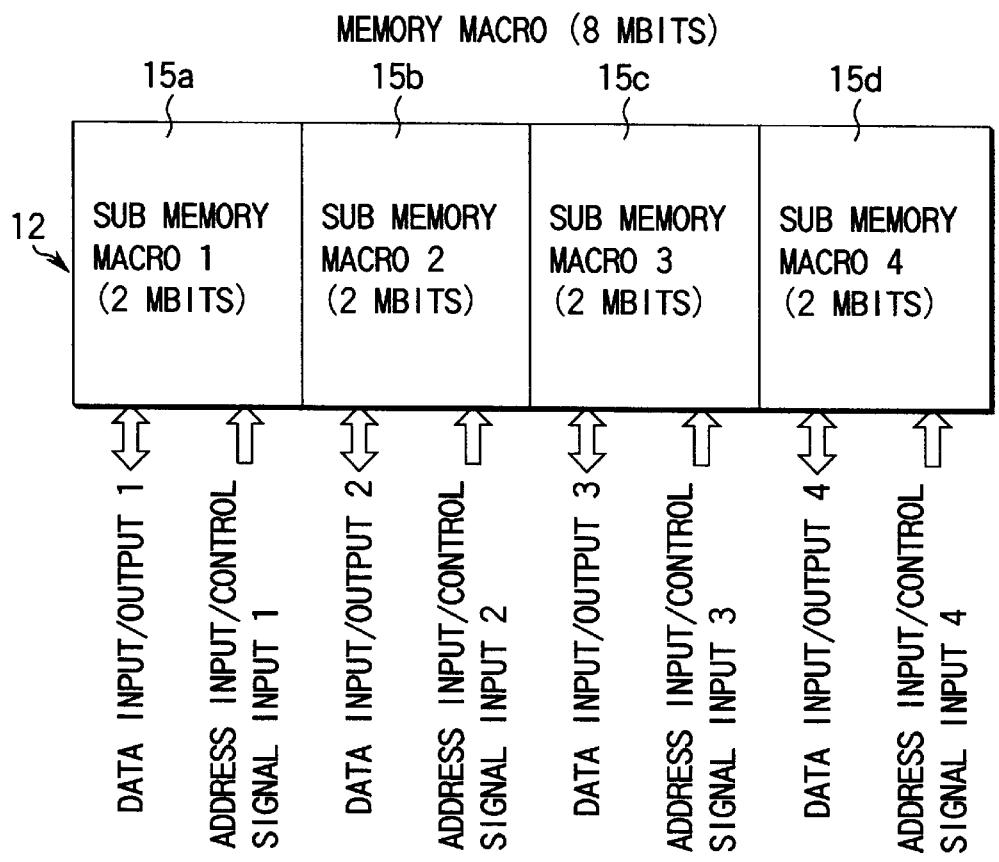
FIG. 42 is a representation showing an example of a floor plan of a conventional memory macro.
Figure 43:
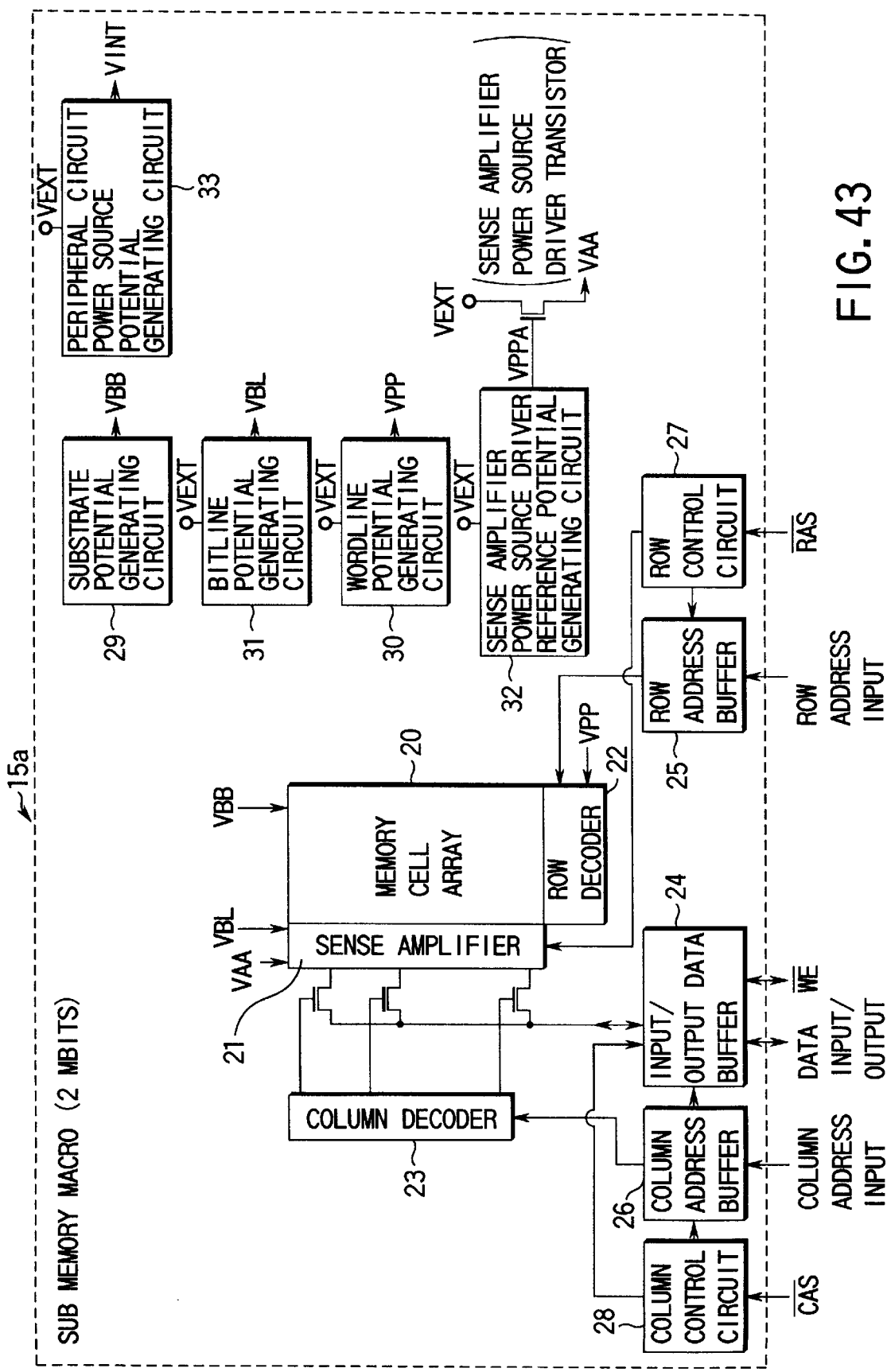
FIG. 43 is a diagram showing an inner structure of the memory array block of FIG. 42.
Figure 44:
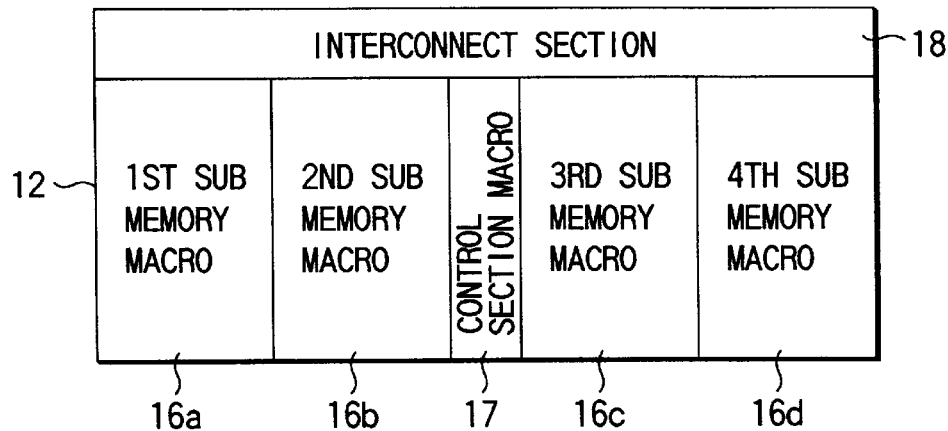
FIG. 44 is a representation showing an example of a floor plan of a conventional memory macro.
Figure 45:
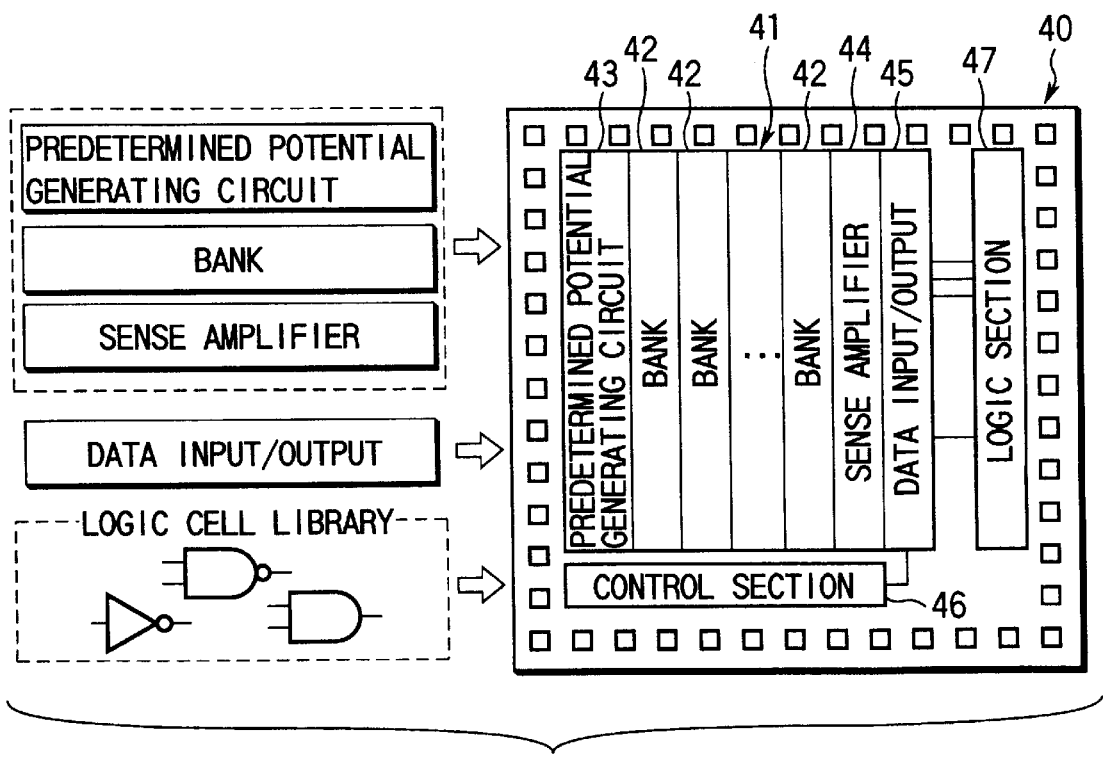
FIG. 45 is a representation showing an example of a floor plan of a conventional memory macro.

FIG. 38 shows a structure of modification of the input/output data buffer block of FIG. 36. That is, in the example, while a pitch of the input/output data buffers 3a-1 to 3a-32 is not different from that of the example shown in FIG. 36, a pitch of the peripheral circuit power source drivers is 8 times as large as that of the input/output data buffers 3a-1 to 3a-32 and the peripheral circuit power source driver block 34a comprises four peripheral circuit power source drivers 34a-1 to 34a-4. That is, a pitch of the peripheral circuit power source drivers 34a-1 to 34a-4 is equal to a value twice as large as that of the 32-kbit memory array blocks 101- to 101-4.

As in the case of FIG. 36, the 32 input/output terminals I/O0 to I/O31 are arranged in a corresponding manner to the 32 input/output data buffers 3a-1 to 3a-32 and the 32 input/output data buffers 3a-1 to 3a-32 are respectively connected to the 32 input/output terminals I/O0 to I/O31.

In a multi-bit output DRAM macro, consumption of a current in an input/output data buffer section and a peripheral circuit power source driver is very large and more than 50% of the consumption of a current in the DRAM macro is consumed in the input/output data buffer section and the peripheral circuit power source driver. In the above mentioned structure, since a scheme in which an input/output data buffer and a peripheral circuit power source driver are provided for each DQ line pair is adopted, the numbers of input/output data buffers and peripheral circuit power source drivers to be arranged are variable according to the number of DQ line pairs, whereby not only increase in unnecessary consumption of a current in the input/output buffer section but increase in chip size can be avoided. The reason why is that, since the numbers of input/output data buffers and peripheral circuit power source drivers can be changed in accordance to the number of DQ line pairs, the sum of transistor sizes of the input/output data buffers and peripheral circuit power source drivers can be set to the minimum which is required. According to the above mentioned structure, when the number of I/Os is smaller and consumption of a current is also smaller, a necessary area for transistor size in the peripheral circuit power source driver is smaller. According to the structure, since the peripheral circuit power source driver is arranged adjacent to the input/output data buffer which consumes much of a current, a potential drop of the input/output data buffer power source which is caused by a power source bus resistance between the input/output data buffer and the peripheral circuit power source driver can be small.

FIG. 39 is a flow chart for designing a memory macro of the present invention.

First, a block which is a fundamental element to construct a memory macro is designed. The block here designed comprises: a direct current potential generating block, a memory array block (K-bits), an input/output buffer block, a memory array power source driver block, a control block and a power source line block. In design of the control block, as mentioned above, the number of address buffers to which a block selecting row address signal is input is determined based on the maximal capacity of the memory macro.

Then a specification (a storage capacity, the number of rows, the number of columns, the number of I/Os etc.) of the memory macro which is designed hereafter is confirmed. That is, it is examined whether or not, for example, a formula of a storage capacity =the number of rows×the number of columns×the number of I/Os is satisfied on a storage capacity, the number of rows, the number of columns, the number of I/Os etc. and it is confirmed that the formula is satisfied. If the satisfaction of the formula is confirmed, the storage capacity, the number of rows, the number of columns, the number of I/Os etc., which have been defined in the specification, are input. Then, the number of sub memory array blocks $P=(R/Q)$ is calculated based on the number Q of DQ line pairs and the number R of I/Qs per one sub memory array block. The number of input/output data buffers is set to be equal to P. The number L of memory array blocks $L=N/(M\times P)$ is calculated based on a storage capacity N of the memory macro (or the number of rows and the number of columns), a storage capacity M of the sub memory block and P. After these values are determined, a memory array block and an input/output data buffer block are automatically combined by CAD processing and the memory array block and input/output buffer block, which are met for the specification, are thus formed to complete the memory macro. At the same time, change-over of a switch for block address in the control block is automatically performed based on the number L of the memory array blocks by CAD processing.

The design of the memory macro is completed by the above mentioned process. After this, a logic section constructed from a gate array or a standard cell and the memory macro are combined, whereby the design of a memory integrated with a logic is over.

According to such a design method, when a specification of a memory macro is determined, a predetermined number of sub memory array blocks and, preferably furthermore, predetermined numbers of input/output data buffers and peripheral circuit reference drivers are automatically combined in CAD processing to complete a memory macro. At the same time, change-over of a switch for block address in a control block is automatically performed based on the number L of memory array blocks in CAD processing. Therefore, a memory macro with a small area overhead can be provided in a short time.

As mentioned above, according to a memory integrated with a logic of the present invention, the following effects can be secured.

Only if P×L M-bit sub memory array blocks are combined in CAD processing, a memory macro with M×L bits can be designed. In addition, since a sense amplifier/column switch is shared by two memory cell arrays on both ends thereof, an area overhead is small even when a storage capacity of a memory macro is expanded. Moreover, a DQ line pair and an input/output data buffer block can be provided so that they are shared by a plurality of memory array blocks, which contributes to reduction in an area for a memory macro.

Since a memory array power source driver is provided for each memory array block which is the minimal unit of change in storage capacity, there can be avoided such a situation as a memory array power source driver with an excessively large size is provided when a storage capacity is small. When a memory macro with a different storage capacity is realized, it is only required that a switch is changed over by CAD processing and thereby the number of block selecting address signal is adjusted.

Moreover, since a sub memory array block is manually designed in advance and layout of sub memory array blocks of the number corresponding to a necessary storage capacity is automatically performed in a CAD operation, a memory macro in accordance to a specification can be realized in a short time without any complicated design change by hand.

Moreover, since an input/output data buffer of a fundamental unit is prepared in stock and layout of sub memory array blocks of the number corresponding to a necessary storage capacity is automatically processed in a CAD operation, input/output data buffer blocks having the number equal to the number of I/Os can easily be realized without any complicated design change by hand.

In addition, since a peripheral circuit power source driver, which is arranged in parallel to an input/output data buffer block, and simultaneously adjusted to an input/output data buffer block in width of a row direction, is prepared in stock and such peripheral circuit power source drivers of the necessary number are automatically processed in a CAD operation, there is no need for a complicated manual design change and design change is performed with ease. As can be seen from the above description, if a specification of a memory macro is changed, there is no need for design change by hand but a memory macro with a small area overhead can be provided by automatic design in which a CAD operation is used in a short time. That is, a fundamental design which is complicated and takes a long time in design is performed by hand and when a change in specification of a memory macro is required, the fundamental design is used in a CAD operation for automatic processing of the design of a memory macro and the memory macro with a different specification is easily realized with a small overhead in a short time.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor chip comprising:
   a memory macro; and
   a logic section, wherein the memory macro comprises a control block including an address buffer circuit for generating an internal address signal in response to an external address signal inputted from the logic section and a switch circuit for fixing a portion of the internal address signal at a predetermined value, at least one memory array block having a plurality of data lines, and an input/output data buffer block for outputting data from a memory cell of the at least one memory array block through the data lines to the logic section, and wherein
   the memory macro further comprises a plurality of memory array power source driver blocks each corresponding to a predetermined number of memory array blocks, each of the memory array power source driver blocks comprising an internal power source generating circuit for receiving an external power source voltage and generating an internal power source voltage which drives a memory cell array of the memory array block.

2. A semiconductor chip according to claim 1, wherein the at least one memory array block further comprises first, second and third sense amplifiers arranged in a column direction, a first memory cell array provided between the first and second sense amplifiers, and a second memory cell array provided between the second and third sense amplifiers.

3. A semiconductor chip according to claim 1, wherein the at least one memory array block further comprises a first memory cell array, a first sense amplifier, a second memory cell array, a second sense amplifier arranged in a column direction.

4. A semiconductor chip according to claim 1, wherein the address buffer circuit of the control block comprises a plurality of address buffers, and the switch circuit of the control block comprises a plurality of switches arranged between a plurality of external address signal lines of the external address signal and the plurality of address buffers.

5. A semiconductor chip according to claim 1, wherein the internal power source generating circuit comprises a voltage-down-converting transistor for receiving an external power source voltage and generating an internal power source voltage which drives the memory cell array of the memory array block.

6. A semiconductor chip according to claim 1, wherein the memory macro further comprises a power source line block arranged adjacent to the at least one of memory array block.

7. A semiconductor chip according to claim 4, wherein the plurality of switches are made of a plurality of metal layers.

8. A semiconductor chip according to claim 4, wherein the plurality of switches are made of a plurality of contact layers.

9. A semiconductor chip according to claim 1, wherein a memory cell array of the memory array block is constituted of DRAMs configured in a matrix.

10. A semiconductor chip according to claim 1, wherein the at least one memory array block comprises a memory array block control section including a driver for driving a row decoder, a column decoder and a sense amplifier, and at least one memory cell array arranged adjacent to the memory array block control section.

11. A semiconductor chip comprising:
    a memory macro; and
    a logic section, wherein
    the memory macro comprises a control block including an address buffer circuit for generating an internal address signal in response to an external address signal inputted from the logic section and a switch circuit for fixing a portion of the internal address signal at a predetermined value, a plurality of memory array blocks having a plurality of data lines, and an input/output data buffer block for outputting data of a memory cell of the memory array blocks through the data lines to the logic section, and wherein
    the memory macro further comprises a plurality of memory array power source driver blocks each corresponding to a predetermined number of memory array blocks, each of the memory array power source driver blocks comprising an internal power source generating circuit for receiving an external power source voltage and generating an internal power source voltage which drives a memory cell array of the memory array block.

12. A semiconductor chip according to claim 11, wherein the data lines are shared by the memory array blocks.

13. A semiconductor chip comprising:
    a memory macro; and
    a logic section, wherein
    the memory macro comprises a control block including an address buffer circuit for generating an internal address signal in response to an external address signal inputted from the logic section, at least one memory array block comprising a plurality of sub memory array blocks arranged in a row direction and having a plurality of data lines, and a plurality of input/output data buffers each comprising an amplifying circuit for amplifying data of a memory cell of the at least one memory array block and outputting the data through the data lines to the logic section, and wherein the memory macro further comprises a plurality of memory array power source driver blocks each corresponding to a predetermined number of memory array blocks, each of the memory array power source driver blocks comprising an internal power source generating circuit for receiving an external power source voltage and generating an internal power source voltage which drives a memory cell array of the memory array block.

14. A semiconductor chip according to claim 13, wherein each of the input/output data buffers comprises a voltage-down-converting transistor for receiving an external power source voltage and generating an internal power source voltage for the amplifying circuit.

15. A semiconductor chip according to claim 13, wherein the at least one memory array block further comprises first, second and third sense amplifiers arranged in a column direction, a first memory cell array provided between the first and second sense amplifiers, and a second memory cell array provided between the second and third sense amplifiers.

16. A semiconductor chip according to claim 13, wherein the at least one memory array block further comprises a first memory cell array, a first sense amplifier, a second memory cell array, a second sense amplifier arranged in a column direction.

17. A semiconductor chip according to claim 13, wherein the address buffer circuit of the control block comprises a plurality of address buffers, and the switch circuit of the control block comprises a plurality of switches arranged between a plurality of external address signal lines of the external address signal and the plurality of address buffers.

18. A semiconductor chip according to claim 17, wherein the plurality of switches are made of a plurality of metal layers.

19. A semiconductor chip according to claim 17, wherein the plurality of switches are made of a plurality of contact layers.

20. A semiconductor chip according to claim 13, wherein the internal power source generating circuit comprises a voltage-down-converting transistor for receiving an external power source voltage and generating an internal power source voltage which drives the memory cell array of the memory array block.

21. A semiconductor chip according to claim 13, wherein a memory cell array of the memory array block is constituted of DRAMs configured in a matrix.

22. A semiconductor chip comprising:
a memory macro; and
a logic section, wherein
the memory macro comprises a control block including an address buffer circuit for generating an internal address signal in response to an external address signal inputted from the logic section, a plurality of memory array blocks each comprising a plurality of sub memory cell array blocks arranged in a row direction and has a plurality of data lines, and a plurality of input/output data buffers each comprising an amplifying circuit for amplifying data of a memory cell of the memory array blocks and outputting the data through the data lines to the logic section, and wherein the memory macro further comprises a plurality of memory array power source driver blocks each corresponding to a predetermined number of memory array blocks, each of the memory array power source driver blocks comprising an internal power source generating circuit for receiving an external power source voltage and generating an internal power source voltage which drives a memory cell array of the memory array blocks.

23. A semiconductor chip according to claim 22, wherein the data lines are shared by the memory array blocks.

24. A designing method for a semiconductor chip comprising a logic section and a memory macro which comprises a control block including an address buffer circuit for generating an internal address signal in response to an external address signal inputted from the logic section and a switch circuit for fixing a portion of the internal address signal at a predetermined value, at lest one memory array block having a plurality of data lines, an input/output data buffer block for outputting data of a memory cell of the at least one memory array block through the data lines to the logic section, and a plurality of memory array power source driver blocks each corresponding to a predetermined number of memory array blocks, the designing method comprising: a step of determining the number L of memory array blocks satisfying a specification of the memory macro, a step of determining the number of the memory array power source driver blocks in accordance with the number of L of memory array blocks, and a step of creating layout data of arranging L memory array blocks at positions adjacent to the input/output data buffer block and the control block by automatic processing according to a program.

25. A designing method for a semiconductor chip according to claim 24, wherein the number L of the memory array blocks is determined based on at least one constituent of a specification comprising the number of rows, the number of columns, the number of input/output terminals, the number of pairs of data lines, the storage capacity of the memory macro and the storage capacity of each of the memory array blocks.

26. A designing method for a semiconductor chip according to claim 25, wherein the number L of the memory array blocks is determined by L=N/K, where N represents the storage capacity of the memory macro and K represents the storage capacity of each of the memory array blocks.

27. A designing method for a semiconductor chip comprising a logic section and a memory macro which comprises a control block including an address buffer circuit for generating an internal address signal in response to an external address signal inputted from the logic section, at least one memory array block comprising a plurality of sub memory array blocks arranged in a row direction and has a plurality of data lines, a plurality of input/output data buffers each comprising an amplifying circuit for amplifying data of a memory cell of the at least one memory array block and outputting the data through the data lines to the logic section, and a plurality of memory array power source driver blocks each corresponding to a predetermined number of memory array blocks, the designing method comprising a step of determining the number P of the sub memory array blocks and the number L of the memory array blocks satisfying a specification of the memory macro, a step of determining the number of memory array power source driver blocks in accordance with the number L of memory array blocks, and a step of creating layout data of arranging L memory array blocks comprising P sub memory array blocks at positions adjacent to the input/output data buffers and the control block by automatic processing according to a program.

28. A designing method for a semiconductor chip according to claim 27, wherein the number P of the sub memory array blocks and the number L of memory array blocks are determined based on at least one constituent of a specification comprising the number of rows, the number of columns, the number of input/output terminals, the storage capacity of the memory macro, the storage capacity of each of the sub memory array blocks, the number of pairs of data lines of each of the sub memory array blocks and the storage capacity of the memory array block.

29. A designing method for a semiconductor chip according to claim 28, wherein the number P of the sub memory array blocks is determined by P=R/Q and the number L of memory array blocks is determined by L=N/(M×P), where R represents the number of input/output terminals, Q represents the number of pairs of data lines of each of the sub memory array blocks, N represents the storage capacity of memory macro, M represents the storage capacity of each of the sub memory array blocks.

30. A semiconductor chip according to claim 1, wherein said predetermined number is one.

31. A semiconductor chip according to claim 11, wherein said predetermined number is one.

32. A semiconductor chip according to claim 13, wherein said predetermined number is one.

* * * * *